United States Patent
Kawai et al.

(10) Patent No.: US 6,507,997 B2
(45) Date of Patent: Jan. 21, 2003

(54) ELECTRIC-COMPONENT MOUNTING METHOD, ELECTRIC-COMPONENT TREATING METHOD, AND ELECTRIC-COMPONENT MOUNTING APPARATUS

(75) Inventors: Takayoshi Kawai, Okazaki (JP); Shinsuke Suhara, Kariya (JP); Yusuke Tsuchiya, Toyota (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 65 days.

(21) Appl. No.: 09/863,431

(22) Filed: May 24, 2001

(65) Prior Publication Data

US 2001/0047586 A1 Dec. 6, 2001

(30) Foreign Application Priority Data

Jun. 1, 2000 (JP) ........................................ 2000-164958

(51) Int. Cl.⁷ ................................................. H05K 3/30
(52) U.S. Cl. ............................. 29/833; 29/721; 29/743; 29/740
(58) Field of Search ......................... 29/740, 739, 743, 29/720, 721, 759, 834, 833, 832, 44; 294/64.1; 901/40, 47

(56) References Cited

U.S. PATENT DOCUMENTS

| | | | |
|---|---|---|---|
| 5,086,556 A | | 2/1992 | Toi |
| 5,854,745 A | * | 12/1998 | Muraoka et al. ............... 29/720 |
| 5,878,484 A | | 3/1999 | Araya et al. |
| 6,088,911 A | * | 7/2000 | Isogai et al. ................... 29/740 |
| 6,161,277 A | * | 12/2000 | Asai et al. ..................... 29/740 |
| 6,260,260 B1 | * | 7/2001 | Suhara .......................... 29/740 |
| 6,276,051 B1 | * | 8/2001 | Asai et al. ..................... 29/740 |
| 6,286,202 B1 | * | 9/2001 | Asai et al. ..................... 29/740 |
| 6,343,415 B1 | * | 2/2002 | Okuda et al. .................. 29/740 |
| 6,374,484 B1 | * | 4/2002 | Yoshida et al. ................ 29/740 |

FOREIGN PATENT DOCUMENTS

| | | |
|---|---|---|
| DE | 198 01 978 A1 | 7/1999 |
| EP | 0 886 465 A1 | 12/1998 |
| JP | B2 3-65040 | 10/1991 |
| JP | A 4-345097 | 12/1992 |
| JP | A 6-342998 | 12/1994 |
| JP | A 7-9381 | 1/1995 |
| JP | A 10-126097 | 5/1998 |
| JP | A 10-224099 | 8/1998 |
| WO | WO 99/49713 | 9/1999 |

* cited by examiner

Primary Examiner—Gregory Huson
Assistant Examiner—Huyen Le
(74) Attorney, Agent, or Firm—Oliff & Berridge, PLC

(57) ABSTRACT

A method of mounting an electric component on a circuit substrate, including the steps of moving one of a suction nozzle and an electric-component supplying device toward the other of the nozzle and the supplying device, so that the nozzle applies a suction to the component supplied by the supplying device and thereby receives the component, moving one of the nozzle and the substrate toward the other of the nozzle and the substrate, so that the nozzle mounts the component on the substrate, taking an image of at least a portion of the component held by the nozzle, as seen in a direction perpendicular to an axial direction of the nozzle, in a state in which the nozzle takes a known position in the axial direction, determining, based on image data representing the taken image, a position of a mounted surface of the electric component that is opposite to a sucked surface of the component sucked by the nozzle, and controlling, based on the determined position, a movement of the nozzle toward one or each of the supplying device and the substrate, or vice versa.

25 Claims, 24 Drawing Sheets

IMAGE-TAKE POSITION

ELECTRIC-COMPONENT MOUNTING METHOD, ELECTRIC-COMPONENT TREATING METHOD, AND ELECTRIC-COMPONENT MOUNTING APPARATUS

BACKGROUND OF THE INVENTION

1. Field of the Invention

The present invention relates to an electric-component (EC) mounting method, an EC treating method, and an EC mounting apparatus, and particularly to the art of controlling the mounting or treating of electric components (ECs), in particular, electronic components.

2. Discussion of Related Art

It has been practiced to take, before an EC is mounted on a printed wiring board (PWB), an image of the EC sucked and held by a suction nozzle, as seen in a direction perpendicular to an axial direction of the nozzle parallel to an axis line thereof. Based on image data representing the thus taken image, it is judged whether the EC held by the nozzle is taking a lying-on-its-side posture, that is, whether the EC is taking an incorrect rotation position deviated by 90 degrees from a correct rotation position thereof about an axis line perpendicular to the axis line of the nozzle. If it is judged that the EC is taking the lying-on-its-side posture, the EC is not mounted on the PWB to prevent the production of a defective printed circuit board (PCB) on which the EC having the incorrect posture is mounted.

However, even the above-described method cannot prevent the production of all defective PCBs. For example, even in the case where a suction nozzle holds an EC such that the EC is not taking a lying-on-its-side posture, if the nozzle has a dimensional error with respect to its axial-direction dimension, then the distance between the EC and the PWB is adversely influenced by the dimensional error, so that the amount of access of the EC to the PWB may be excessive and accordingly the EC may be subjected to an excessive load and even be damaged, or that the amount of access of the EC to the PWB may be short and accordingly the EC may not be mounted at a correct EC-mount place on the PWB.

The above-explained problems mean that it is difficult to control appropriately the access of a suction nozzle to some member. Similar problems are experienced when a suction nozzle receives an EC from an EC supplying device. For example, if a suction nozzle has an error with respect to its axial-direction dimension and the distance between the nozzle and the EC is adversely influenced by the dimensional error, the amount of access of the nozzle to the EC may be excessive and accordingly the EC may be subjected to an excessive load and even be damaged, or the amount of access of the nozzle to the EC may be short and accordingly the nozzle may fail to suck or hold the EC.

SUMMARY OF THE INVENTION

The present invention provides an EC mounting method, an EC treating method, an EC mounting apparatus, and an EC treating apparatus which have the following features. Those features are described, like claims, in respective paragraphs which are given respective numbers. Any feature that includes another feature shall do so by referring to the number given to the latter feature. However, the following features and the appropriate combinations thereof are just examples to which the technical features, and the combinations thereof, described in the specification are by no means limited. In addition, in the case where one feature recites a plurality of items, it is not essentially required that all of those items be simultaneously employed in the one feature. That is, it is possible to select and employ only a portion (one, two, . . . , but not all) of those items.

(1) According to a first feature of the present invention, there is provided a method of mounting an electric component on a circuit substrate, the method comprising the steps of moving at least one of a suction nozzle and an electric-component supplying device toward the other of the suction nozzle and the electric-component supplying device, so that the nozzle applies a suction to the electric component supplied by the supplying device and thereby receives the component, moving at least one of the suction nozzle and the circuit substrate toward the other of the nozzle and the substrate, so that the nozzle mounts the electric component on the substrate, taking an image of at least a portion of the electric component sucked and held by the suction nozzle, as seen in a direction perpendicular to an axial direction of the nozzle, in a state in which the nozzle takes a known position in the axial direction, determining, based on image data representing the taken image, a position of at least a mounted surface of the electric component that is opposite to a sucked surface of the component sucked by the suction nozzle, and controlling, based on the determined position, a movement of at least one of the suction nozzle and at least one of the electric-component supplying device and the circuit substrate, toward the other of the nozzle and the at least one of the supplying device and the substrate.

The taking step may include taking an image of the electric component only, and the determining step may include determining a position of the mounted surface of the component only. Alternatively, the taking step may additionally include taking an image of an end portion of the suction nozzle that applies the suction, and the determining step may additionally include determining a position of a sucking end surface of the nozzle that applies the suction.

The direction of movement of at least one of the suction nozzle and at least one of the electric-component supplying device and the circuit substrate toward the other of the nozzle and the at least one of the supplying device and the substrate may be a vertical direction, or a direction inclined relative to the vertical direction.

The known position taken by the suction nozzle in the axial direction thereof is defined as that taken by a portion of the nozzle that is held by, e.g., a nozzle holder, a position of that portion relative to the nozzle holder in the axial direction being not changed by, e.g., a manufacturing error of the nozzle or wearing of the sucking end surface of the nozzle. Therefore, the position of the suction nozzle is equivalent to that of the nozzle holder. In the case where the suction nozzle is held by the nozzle holder such that the nozzle is not movable in the axial direction thereof relative to the holder, the position of the portion of the nozzle held by the holder does not change relative to the holder. Thus, if the position of the holder is known, then the position of the nozzle is also known. On the other hand, in the case where the nozzle is held by the holder such that the nozzle is movable in the axial direction relative to the holder, the position of the nozzle may not be known even if the position of the holder may be known. In the latter case, therefore, the position of the nozzle must be discussed in the state in which the nozzle takes a prescribed position relative to the holder, e.g., an advancement-end position relative to the holder.

The state in which the suction nozzle takes the known position in the axial direction may be, in the literal sense of the words, a state in which an absolute position taken by the nozzle in the axial direction is known, or may be a state in which a position taken by the nozzle in the axial direction when an image taking operation is performed is constant. In the present embodiment, it is at least needed to detect an error of the actual position of the mounted surface of the electric component from an ideal (i.e., target or correct) position, and it is not essentially needed to detect an absolute position of the mounted surface.

The known position taken by the suction nozzle may be a designed position or a measured position. The designed position means a position to be taken by the suction nozzle in a state in which an electric-component (EC) mounting system has been assembled and the fine adjustment of each element of the system has been completed. If an image taking operation is performed in a state in which the nozzle takes a prescribed position in the axial direction, the designed position can be used as the known position. On the other hand, if the nozzle does not take a prescribed position in the axial direction when an image taking operation is done, a position actually taken by the nozzle is measured, and the measured position is used as the known position. However, even if an image taking operation is performed in the state in which the nozzle takes the prescribed position in the axial direction, an actual position of the nozzle may be measured and the measured position may be used as the known position.

In the state in which the suction nozzle takes the known position, a position to be taken by the sucked surface or the mounted surface of the EC is known, if a length of the nozzle or a thickness of the EC is known. If the known position of the nozzle is a designed position, then the known position of the mounted surface or the sucked surface is also a designed position. If the known position of the nozzle is a measured position, then the known position of the mounted surface or the sucked surface is a position obtained based on the measured position.

Controlling the movement of at least one of the suction nozzle and at least one of the electric-component supplying device and the circuit substrate, toward the other of the nozzle and the at least one of the supplying device and the substrate, may include controlling at least one of (a) a limit of the movement, i.e., a minimum distance between the nozzle and the at least one of the supplying device and the substrate, (b) a position where deceleration of the movement is started, and (c) a mode of deceleration of the movement.

As described above, in the state in which the suction nozzle takes the known position, the position to be taken by the mounted surface is known, if the length of the nozzle and the thickness of the EC are known. Therefore, if an image of at least the mounted surface of the EC opposite to the sucked surface is taken, an error of the actual position of the mounted surface can be obtained. If the error of the actual position of the mounted surface is obtained, then the movement of the nozzle toward the circuit substrate can be appropriately controlled. For example, when the EC is mounted on the substrate, the EC and the substrate can be moved toward each other while the error is taken into consideration. Thus, the EC can be reliably mounted on the substrate, while the EC and the substrate are effectively prevented from being too close to each other or too distant from each other, and a failure to mount the EC or damaging the EC is effectively avoided. The error of the actual position of the mounted surface of the EC includes all errors that cause the actual position of the mounted surface to differ from the known position, such as a manufacturing error of the suction nozzle, wearing of the sucking end surface of the nozzle, or a dimensional error of the EC. If the actual position of the mounted surface is determined based on the taken image, then the EC can be mounted on the circuit substrate while an error of the actual position is taken into consideration. In the case where a dimensional error of the thickness of the EC is small, a position of the sucking end surface of the nozzle can be determined based on the position of the mounted surface of the EC and the thickness of the EC, so that the movement of the nozzle and the EC supplying device toward each other can be appropriately controlled.

If at least one of the length of the suction nozzle and the thickness of the EC changes, the position of the mounted surface of the EC changes. However, if the position of the mounted surface of the EC is obtained as an absolute position of the mounted surface relative to a reference position, then the movement of the nozzle and the circuit substrate toward each other to mount the EC on the substrate can be appropriately controlled even if there may be no data representing respective nominal dimensions of the nozzle and the EC. The absolute position of the mounted surface of the EC includes both a variation of a nominal dimension of each of the nozzle and the EC, and an error of an actual dimension of each of the nozzle and the EC from the corresponding nominal dimension. Thus, it is not needed to input, into the EC mounting system in advance, the data representing the respective nominal dimensions of the nozzle and the EC.

The position of the mounted surface of the EC changes depending upon the length of the suction nozzle. If the position of the mounted surface is obtained as an absolute position of the mounted surface relative to a reference position, the movement of the nozzle and the EC-supplying device toward each other can be appropriately controlled even if there may be no data representing the nominal dimension of the nozzle. In this case, however, it is needed to obtain a position of the sucking end surface of the nozzle, at latest before the movement of the nozzle and the EC-supplying device toward each other is started during an EC mounting operation, e.g., before the EC mounting operation itself, or before the nozzle sucks and holds an EC during the EC mounting operation.

If both the respective positions of the mounted surface of the EC and the sucking end surface of the suction nozzle are detected, the movement of the nozzle toward each of the EC-supplying device and the circuit substrate can be appropriately controlled. In addition, a thickness of the EC (i.e., the sum of a nominal dimension of the EC and an error of an actual dimension of the EC from the nominal dimension) can be obtained and, based on the thus obtained thickness, the movement of the nozzle and the EC-supplying device toward each other can be appropriately controlled.

The above explanations have been made, for easier understanding purposes, on the assumption that respective positional errors of the nozzle holder, the EC-supplying device, a circuit-substrate supporting device, and an image-taking device relative to one another in the axial direction of the suction nozzle are very small and negligible. However, in the case where those positional errors are not negligible, those errors should be taken into consideration to control the movement of the nozzle and at least one of the EC-supplying device and the circuit substrate toward each other.

(2) According to a second feature of the present invention that includes the first feature (1), the controlling step comprises controlling at least one of a position of an end of a downward movement of the suction nozzle toward the at least one of the electric-component supplying device and the circuit substrate, an end surface of the nozzle that applies the suction facing downward during the downward movement, and a position where a deceleration of the downward movement of the suction nozzle is started.

In many cases, a suction nozzle is held by a nozzle holder such that the nozzle can be advanced and retracted relative to the holder. For example, a suction nozzle is held by a nozzle holder such that the nozzle is movable relative to the holder in the axial direction of the nozzle, and is biased by a spring member, such as a compression coil spring, in a direction in which the nozzle is advanced relative to the holder, and the limit of advancement of the nozzle is defined by an advancement-limit defining device. Accordingly, after the nozzle contacts an EC supplied by the EC-supplying device or after the EC held by the nozzle contacts a circuit substrate supported by the circuit-substrate supporting device, the nozzle is retracted into the holder while elastically deforming the spring member. Thus, an excessive amount of downward movement of the nozzle holder is absorbed, and the nozzle or the EC is pressed against the EC or the substrate with an appropriate force. The spring member functions as a cushion device. In the case where the cushion device is employed, if the nozzle contacts the EC or if the EC contacts the substrate, then the nozzle is stopped and is not moved downward to a prescribed downward-movement end position, so that the nozzle or the EC is pressed against the EC or the substrate with a force which is substantially proportional to the difference between the prescribed downward-movement end position and the position where the nozzle is actually stopped. Thus, the downward-movement end position recited in the second feature (2) means the above-explained prescribed downward-movement end position, in other words, the position to which the nozzle is to be moved downward unless the nozzle is stopped. On the other hand, in the case where the cushion device is not employed, the respective amounts of downward movement of the nozzle holder and the suction nozzle are equal to each other, and accordingly the nozzle is moved downward to the prescribed downward-movement end position. In the former case where the cushion device is employed, if the nozzle sucks and holds an EC without pressing the EC, the respective amounts of downward movement of the holder and the nozzle are equal to each other. For example, if, when the holder reaches its downward-movement end position, the nozzle just contacts the EC and holds the same without elastically deforming the spring member, or if, when the holder reaches its downward-movement end position, the nozzle is positioned at a small distance from the EC and holds the same without elastically deforming the spring member, then the respective amounts of downward movement of the holder and the nozzle are equal to each other, and the nozzle sucks and holds the EC without pressing the same.

If the downward-movement end position of the suction nozzle is controlled, occurrence of a shortage or an excessiveness of downward movement of the nozzle can be avoided. Thus, the nozzle can suck and hold an EC without failure or without breaking the same, or can mount an EC on a circuit substrate without failure or without damaging the same. For example, if the position of the sucking end surface of the nozzle in the axial direction thereof is obtained in the state in which the nozzle is biased by the spring member relative to the holder toward the advancement-end position of the nozzle, the movement of the nozzle and the EC-supplying device toward each other can be appropriately or accurately controlled, based on the obtained position, so that even if the nozzle may have a nominal-dimension error, a manufacturing error, or wearing, the nozzle can suck and hold an EC while applying an appropriate pressing force to the EC, or while just contacting the EC with a pressing force substantially equal to zero, or while having a prescribed distance to the EC. Even in the case where the nozzle is not biased by the spring member relative to the holder, it is possible to accurately move the nozzle to a predetermined position such as a position where the nozzle can just contact an EC.

In the case where the position where the deceleration of the downward movement of the suction nozzle is started is controlled, the speed at which the nozzle contacts an EC or an EC held by the nozzle contacts a circuit substrate can be made sufficiently low. Thus, occurrence of damaging of EC can be avoided.

(3) According to a third feature of the present invention that includes the first or second feature (1) or (2), the method further comprising a step of holding, with a nozzle holder, the suction nozzle such that the nozzle is retractable relative to the nozzle holder, and a step of biasing, with a biasing device, the suction nozzle toward a position of an end of an advancement thereof relative to the nozzle holder.

For example, when the suction nozzle mounts an EC on a circuit substrate, the nozzle holder may be further moved toward the circuit substrate after the EC contacts the substrate. Even in this case, since the suction nozzle is retracted relative to the holder against the biasing force of the biasing device, the additional movement of the holder is allowed. Therefore, if the amount of downward movement of the holder is made somewhat excessive, the EC can reliably contact the substrate. However, since the nozzle presses the EC based on the biasing force of the biasing device, the EC may be pressed with an excessively great force, and may even be damaged, if the amount of downward movement of the holder is too much. To avoid this, the position of the mounted surface of the EC is obtained, and the movement of the nozzle and the substrate toward each other is controlled, so that the EC can be reliably contacted with the substrate and can be mounted on the same with an appropriate pressing force. This is true with the case where the suction nozzle takes an EC from the EC-supplying device. If the position of the sucking end surface of the nozzle is obtained, the movement of the nozzle and the EC-supplying device toward each other can be so controlled that the nozzle sucks and holds an EC while applying an appropriate pressing force to the same or while not applying a pressing force.

(4) According to a fourth feature of the present invention that includes any one of the first to third features (1) to (3), the determining step comprises determining, each time the suction nozzle sucks and holds one electric component, a position of at least a mounted surface of the one electric component held by the nozzle.

A position of a sucking end surface of the suction nozzle changes with, e.g., wearing of the nozzle, but this change needs a long time. Thus, it is not essentially needed to determine, for detecting the change, the position of the sucking end surface of the nozzle so frequently, e.g., each time the nozzle sucks and holds each one EC. In contrast, each one EC may have a dimensional error and/or a nominal-dimension error, and accordingly it is preferred to determine, for detecting those errors, the position of the mounted surface of each one EC each time the nozzle sucks and holds the one EC. In the latter case, the movement of the nozzle and the circuit substrate toward each other can be appropriately controlled to mount each one EC on the circuit.

(5) According to a fifth feature of the present invention that includes any one of the first to fourth features (1) to (4), the taking step comprises taking, each time a prescribed condition is satisfied, an image of an end portion of the suction nozzle that applies the suction, and the determining step comprises determining, based on the taken image, a position of an end surface of the suction nozzle that applies the suction.

For example, it is preferred to determine the position of the sucking end surface of the suction nozzle each time such a prescribed condition is satisfied that the nozzle has mounted a prescribed number of ECs after the last determination of position of the sucking end surface, that suction nozzles have been exchanged, or that a prescribed time has elapsed as recited in the following, sixth feature (6).

In the case where the prescribed condition is that the suction nozzle has mounted the prescribed number of ECs, either respective prescribed numbers or a common prescribed number may be used for a plurality of suction nozzles, respectively or commonly, which may employed. It is preferred to prescribe, for each nozzle, be such a number which corresponds to an appropriate timing when a change of the position of the sucking end surface of the each nozzle can be detected. The appropriate timing may be a timing when the detection of change of the position of the sucking end surface is too late to maintain the accuracy of mounting of ECs, or a timing when the detection is too early and accordingly is useless. The number may be prescribed based on, e.g., a transverse cross-sectional area of the sucking end surface of the each nozzle. The smaller the transverse cross-sectional area is, the easier the sucking end surface is to wear, and accordingly the smaller the prescribed number is. Alternatively, the number may be prescribed depending upon the frequency of use of the each nozzle, such that the higher the frequency of use is, the smaller the prescribed number is. In the case where a common prescribed number is used for a plurality of suction nozzles, the common number may be prescribed aiming at one of the nozzles that is most easily worn.

(6) According to a sixth feature of the present invention that includes the fifth feature (5), the prescribed condition comprises a condition that a prescribed time has elapsed.

(7) According to a seventh feature of the present invention that includes the sixth feature (6), the taking step comprises taking, when the suction nozzle first reaches an image-take position after the prescribed time has elapsed, the image of the end portion of the suction nozzle.

If the suction nozzle is mounting an EC when the prescribed time has just elapsed, the nozzle continues the current EC mounting action according to a prescribed procedure. In this case, when the nozzle reaches the image-take position, an image of the end portion of nozzle is taken.

On the other hand, if the suction nozzle is not mounting an EC when the prescribed time has just elapsed, an image of the end portion of nozzle may be taken in the state in which the nozzle is not mounting an EC, or after the nozzle has started an EC mounting action. In the former case, an operator may command, in response to an alarm indicating that the prescribed time has elapsed, the nozzle to move to the image-take position where the image of the end portion of the nozzle is taken by an image-taking device.

In either case, an image of the end portion of the suction nozzle is taken at a timing when the nozzle is not hindered from mounting an EC. That is, the image is taken without interrupting the EC mounting action of the nozzle.

(8) According to an eighth feature of the present invention that includes the sixth feature (6), the prescribed condition comprises a condition that the suction nozzle is not performing an electric-component mounting action, and the taking step comprises moving the suction nozzle to an image-take position when the prescribed time has elapsed and the suction nozzle is not performing the electric-component mounting action.

(9) According to a ninth feature of the present invention that includes any one of the sixth to eighth features (6) to (8), the taking step further comprises measuring the prescribed time only while the suction nozzle is performing each electric-component mounting action.

According to this feature, a time of lasting of each EC-mounting action is measured, and respective times measured for a plurality of EC-mounting actions are added to each other. If the sum of the thus added times reaches the prescribed time, an image is taken. Since many events, such as wearing, which cause a change of the position of the sucking end surface of the suction nozzle occur during EC-mounting actions, an image can be taken at an appropriate timing, if the prescribed time is measured only while the nozzle is performing each EC-mounting action.

(10) According to a tenth feature of the present invention, there is provided a method of mounting an electric component on a circuit substrate, the method comprising the steps of moving at least one of a suction nozzle and an electric-component supplying device toward the other of the suction nozzle and the electric-component supplying device, so that the nozzle applies a suction to the electric component supplied by the supplying device and thereby receives the component, moving at least one of the suction nozzle and the circuit substrate toward the other of the nozzle and the substrate, so that the nozzle mounts the electric component on the substrate, taking, after the suction nozzle receives the electric component and before the nozzle mounts the component, an image of the component sucked and held by the nozzle, as seen in a direction perpendicular to an axial direction of the nozzle, determining, based on image data representing the taken image, a thickness of the electric component, and controlling, based on the determined thickness, a movement of at least one of the suction nozzle and at least one of the electric-component supplying device and the circuit substrate, toward the other of the nozzle and the at least one of the supplying device and the substrate.

In the case where the position of the sucking end surface of the suction nozzle is known without taking any images, for example, where the nozzle is precisely manufactured and is precisely held by a nozzle holder and accordingly the position of the sucking end surface of the nozzle is equal to the designed position, the position of the mounted surface of each EC can be determined if the thickness of the each EC is determined. If the position of the mounted surface is determined, the movement of the nozzle and the circuit substrate toward each other can be appropriately controlled.

In addition, in the case where different sorts of ECs to be mounted have different thickness values (i.e., different nominal thickness values), the movement of the nozzle and at least one of the EC-supplying device and the circuit substrate toward each other can be controlled based on the thickness of each EC determined based on the taken image, without needing to store, in a memory, data representing the respective thickness values of the different sorts of ECs. For example, in the case where a tendency of respective errors of thickness values of ECs supplied from the EC-supplying device can be determined and accordingly a thickness of an EC to be sucked next can be estimated based on the thickness values of the ECs that have been mounted, the movement of the nozzle and the EC-supplying device toward each other can be appropriately controlled to suck each EC, based on the respective thickness values of the ECs determined based on the respective taken images.

The EC mounting method according to the tenth feature (10) may employ any one of the above-described second to ninth features (2) to (9).

(11) According to an eleventh feature of the present invention, there is provided a method of mounting an electric component on a circuit substrate, the method comprising the steps of moving at least one of a suction nozzle and an electric-component supplying device toward the other of the suction nozzle and the electric-component supplying device, so that the nozzle applies a suction to the electric component supplied by the supplying device and thereby receives the component, moving at least one of the suction nozzle and the circuit substrate toward the other of the nozzle and the substrate, so that the nozzle mounts the electric component on the substrate, taking an image of at least an end portion of the nozzle that applies the suction, as seen in a direction perpendicular to an axial direction of the nozzle, in a state in which the nozzle takes a known position in the axial direction, determining, based on image data representing the taken image, a position, in the axial direction, of at least an end surface of the suction nozzle that applies the suction, and controlling, based on the determined position, a movement of at least one of the suction nozzle and at least one of the electric-component supplying device and the circuit substrate, toward the other of the nozzle and said at least one of the supplying device and the substrate.

An image to be taken may be an image of a lower end portion of the suction nozzle, or an image of the entirety of the nozzle.

Only an image of the suction nozzle may be taken, and only a position of the sucking end surface of the nozzle in the axial direction may be determined. In a state in which an EC is held by the nozzle, an image of the EC in addition to the nozzle may be taken, and a position of the mounted surface of the EC in the axial direction may additionally be determined. If an image of the nozzle is taken in the state in which the nozzle is not holding an EC, a position of the sucking end surface of the nozzle can be determined more accurately.

An image of the suction nozzle may be taken during an EC-taking action, or in a state in which the nozzle is not performing an EC-taking action. In the former case, it is possible to change, during the EC-taking action, the limit of movement of the nozzle toward an EC supplied from the EC-supplying device. In the latter case, an image of the nozzle is taken before an EC-taking action is started and, after the limit of movement of the nozzle is changed, the EC-taking action is started.

The eleventh feature (11) solves the problem that the movement of the suction nozzle and at least one of the EC-supplying device and the circuit substrate toward each other may not be well controlled because of the change of the position of the sucking end surface of the nozzle caused by the respective manufacturing errors of the nozzle and the nozzle holder and the wearing of the nozzle. Since the axial-direction position of the sucking end surface of the nozzle is determined based on the image data obtained in the state in which the nozzle takes the known axial-direction position, an error of the actual axial-direction position of the sucking end surface from a correct position can be obtained by comparison of the actual position with the correct position and, based on the thus obtained error, the movement of the nozzle and the EC-supplying device toward each other can be so controlled as to avoid a shortage or excessiveness of amount of the movement, a failure to suck an EC, or an occurrence of damaging of an EC. In the case where the thickness of an EC is small, the movement of the nozzle and the circuit substrate toward each other can be controlled, based on the obtained error, to avoid a failure to mount the EC or an occurrence of damaging of the EC. As described in connection with the first feature (1), the position of the sucking end surface of the nozzle may be determined as an absolute position thereof relative to a reference position.

The EC mounting method according to the eleventh feature (11) may employ any one of the above-described second to ninth features (2) to (9).

(12) According to a twelfth feature of the present invention that includes any one of the first to eleventh features (1) to (11), the taking step comprises taking, with a surface-image taking device which can take a two-dimensional image at once, a two-dimensional image of at least one of an end portion of the suction nozzle that applies the suction and the electric component sucked and held by the nozzle, as seen in the direction perpendicular to the axial direction of the nozzle.

(13) According to a thirteenth feature of the present invention that includes any one of the first to eleventh features (1) to (11), the taking step comprises taking, with a linear-image taking device, at least one linear image of at least one of an end portion of the suction nozzle that applies the suction and the electric component sucked and held by the nozzle, and wherein the determining step comprises determining, based on image data representing the taken linear image, a position of at least one of the mounted surface of the component and an end surface of the nozzle that applies the suction.

A two-dimensional image can be obtained by iteratively taking linear images while the linear-image taking device and the nozzle holder are moved relative to each other in a direction having a component perpendicular to the axial direction of the suction nozzle. This two-dimensional image may be one which includes the entirety of the end portion of the nozzle or the entirety of the EC, or one which includes only a portion of the end portion or the EC. In an extreme case, the two-dimensional image may be replaced with a single linear image. Based on the single linear image, it is possible to determine a position of at least one of the mounted surface of the EC and the sucking end surface of the nozzle.

(14) According to a fourteenth feature of the present invention, there is provided a method of treating an electric component, the method comprising the steps of causing a suction nozzle to apply a suction to the electric component supplied by an electric-component supplying device and thereby receive the component, taking an image of at least an end portion of the suction nozzle that applies the suction, as seen in a direction perpendicular to an axial direction of the nozzle, in a state in which the nozzle takes a known position in the axial direction, determining, based on image data representing the taken image, a position, in the axial direction, of at least an end surface of the suction nozzle that applies the suction, and controlling, based on the determined position, a movement of at least one of the suction nozzle and the electric-component supplying device, toward the other of the nozzle and the supplying device.

An image of the end portion of the suction nozzle may be taken in a state in which the nozzle is holding an EC or is not holding an EC, or in a state in which the nozzle is performing an EC-taking action or is not performing an EC-taking action.

The fourteenth feature (14) solves the problem that the movement of the suction nozzle and the EC-supplying device toward each other may not be well controlled because of the change of the position of the sucking end surface of the nozzle caused by the respective manufacturing errors of the nozzle and the nozzle holder and the wearing of the nozzle.

The EC mounting method according to the fourteenth feature (14) may employ any one of the above-described second, third, and fifth to thirteenth features (2), (3), and (5) to (13).

(15) According to a fifteenth feature of the present invention, there is provided an apparatus for mounting an electric component on a circuit substrate, the apparatus comprising an electric-component supplying device which supplies the electric component; a circuit-substrate supporting device which supports the circuit substrate; a nozzle holder which holds a suction nozzle having an end surface which applies a suction to the electric component supplied by the electric-component supplying device and thereby holds the component; a reception controller which controls at least one of the nozzle holder and the electric-component supplying device to be moved toward the other of the nozzle holder and the supplying device, so that the suction nozzle receives the electric component from the supplying device; a mounting controller which controls at least one of the nozzle holder and the circuit-substrate supporting device to be moved toward the other of the nozzle holder and the supporting device, so that the suction nozzle mounts the electric component on the circuit substrate supported by the supporting device; an image taking device which takes, during a time duration after the suction nozzle receives the electric component and before the nozzle mounts the component, an image of at least the component sucked and held by the nozzle, as seen in a direction perpendicular to an axial direction of the nozzle, in a state in which the nozzle holder takes a known position in the axial direction; an image processor which determines, based on image data representing the image taken by the image taking device, a position, in the axial direction, of at least a mounted surface of the electric component that is opposite to a sucked surface of the component sucked by the suction nozzle; and a control modifying device which modifies, based on the position determined by the image processor, at least one of the control of the reception controller to move said at least one of the nozzle holder and the electric-component supplying device, and the control of the mounting controller to move said at least one of the nozzle holder and the circuit-substrate supporting device.

The nozzle holder may be one which holds a plurality of suction nozzles, or one which holds a single suction nozzle.

The above description provided for, e.g., the EC mounting method according to the first feature (1) is true with the EC mounting apparatus according to the fifteenth feature (16).

The EC mounting apparatus according to the fifteenth feature (15) may employ any one of the above-described second to ninth, twelfth, and thirteenth features (2) to (9), (12), and (13).

(16) According to a sixteenth feature of the present invention, there is provided an apparatus for mounting an electric component on a circuit substrate, the apparatus comprising an electric-component supplying device which supplies the electric component; a circuit-substrate supporting device which supports the circuit substrate; a nozzle holder which holds a suction nozzle having an end surface which applies a suction to the electric component supplied by the electric-component supplying device and thereby holds the component; a reception controller which controls at least one of the nozzle holder and the electric-component supplying device to be moved toward the other of the nozzle holder and the supplying device, so that the suction nozzle receives the electric component from the supplying device; a mounting controller which controls at least one of the nozzle holder and the circuit-substrate supporting device to be moved toward the other of the nozzle holder and the supporting device, so that the suction nozzle mounts the electric component on the circuit substrate supported by the supporting device; an image taking device which takes, during a time duration after the suction nozzle receives the electric component and before the nozzle mounts the component, an image of the component sucked and held by the nozzle, as seen in a direction perpendicular to an axial direction of the nozzle; an image processor which determines, based on image data representing the image taken by the image taking device, a thickness of the electric component held by the suction nozzle; and a control modifying device which modifies, based on the thickness determined by the image processor, at least one of the control of the reception controller to move said at least one of the nozzle holder and the electric-component supplying device, and the control of the mounting controller to move said at least one of the nozzle holder and the circuit-substrate supporting device.

The above description provided for, e.g., the EC mounting method according to the tenth feature (10) is true with the EC mounting apparatus according to the sixteenth feature (16).

The EC mounting apparatus according to the sixteenth feature (16) may employ any one of the above-described second, third, fifth to ninth, twelfth, and thirteenth features (2), (3), (5) to (9), (12), and (13).

(17) According to a seventeenth feature of the present invention, there is provided an apparatus for mounting an electric component on a circuit substrate, the apparatus comprising an electric-component supplying device which supplies the electric component; a circuit-substrate supporting device which supports the circuit substrate; a nozzle holder which holds a suction nozzle having an end surface which applies a suction to the electric component supplied by the electric-component supplying device and thereby holds the component; a reception controller which controls at least one of the nozzle holder and the electric-component supplying device to be moved toward the other of the nozzle holder and the supplying device, so that the suction nozzle receives the electric component from the supplying device; a mounting controller which controls at least one of the nozzle holder and the circuit-substrate supporting device to be moved toward the other of the nozzle holder and the supporting device, so that the suction nozzle mounts the electric component on the circuit substrate supported by the supporting device; an image taking device which takes an image of at least an end portion of the suction nozzle that applies the suction, as seen in a direction perpendicular to an axial direction of the nozzle, in a state in which the nozzle holder takes a known position in the axial direction; an image processor which determines, based on image data representing the image taken by the image taking device, a position, in the axial direction, of at least an end surface of the suction nozzle that applies the suction; and a control modifying device which modifies, based on the position determined by the image processor, at least one of the control of the reception controller to move said at least one of the nozzle holder and the electric-component supplying device, and the control of the mounting controller to move said at least one of the nozzle holder and the circuit-substrate supporting device.

The above description provided for, e.g., the EC mounting method according to the eleventh feature (11) is true with the EC mounting apparatus according to the seventeenth feature (17).

The EC mounting apparatus according to the seventeenth feature (17) may employ any one of the above-described second, third, fifth to ninth, twelfth, and thirteenth features (2), (3), (5) to (9), (12), and (13).

(18) According to an eighteenth feature of the present invention that includes any one of the fifteenth to seventeenth features (15) to (17), the circuit-substrate supporting device comprises a support member which supports the circuit substrate, and wherein the mounting controller comprises a holder elevating and lowering device which elevates and lowers the nozzle holder in the axial direction of the suction nozzle in a prescribed range, and smoothly decelerates a downward movement of the holder in a terminal portion of the range; and a substrate elevating and lowering device which elevates and lowers, based on the position determined by the image processor, the support member supporting the circuit substrate.

According to the eighteenth feature (18), even if there may be a change of the position of the sucking end surface of the suction nozzle caused by the manufacturing error and/or wearing of the nozzle, the support member may be elevated or lowered to adjust the position of the support surface of the circuit substrate that supports one or more ECs mounted thereon, so that the EC held by the nozzle may contact the substrate after the speed of downward movement of the nozzle holder has been reduced to a low value. Thus, the EC is mounted on the substrate without being damaged.

(19) According to a nineteenth feature of the present invention that includes any one of the fifteenth to eighteenth features (15) to (18), the apparatus further comprising a transferring controller which controls the nozzle holder to be moved between the electric-component supplying device and the circuit-substrate supporting device, so that the suction nozzle transfers the electric component from the electric-component supplying device to the circuit-substrate supporting device.

The transferring controller may be one which is recited in the following, twentieth feature (20), or one which causes a linear movement of the suction nozzle to transfer the EC. The linear movement may be done in a direction contained in a plane parallel to the support surface of the circuit substrate that supports one or more ECs mounted thereon, or in a direction having two components respectively parallel to two directions perpendicular to each other in the plane.

(20) According to a twentieth feature of the present invention that includes the nineteenth feature (19), the transferring controller comprises a revolving device which revolves a plurality of the nozzle holders about an axis line and stops each of the nozzle holders at each of an electric-component-receive position and an electric-component-mount position which are provided on a locus of revolution of the each nozzle holder.

The axis line of revolution may be substantially vertical, or may be inclined relative to a vertical plane.

(21) According to a twenty-first feature of the present invention that includes the twentieth feature (20), the image taking device is provided inside the locus of revolution of the each nozzle holder, such that the image taking device faces toward outside the locus of revolution.

Alternatively, the image taking device may be provided outside the locus of revolution of each nozzle holder. However, in the case where the image taking device is provided inside the locus, an otherwise vacant space left below the revolving device as seen in a direction parallel to the axis line of revolution can be effectively utilized.

(22) According to a twenty-second feature of the present invention that includes the twenty-first feature (21), the apparatus further comprising a lighting device which is provided outside the locus of revolution of the each nozzle holder and faces toward the image taking device.

(23) According to a twenty-third feature of the present invention, there is provided an apparatus for treating an electric component, the apparatus comprising an electric-component supplying device which supplies the electric component; a nozzle holder which holds a suction nozzle having an end surface which applies a suction to the electric component supplied by the electric-component supplying device and thereby holds the component; a reception controller which controls at least one of the nozzle holder and the electric-component supplying device to be moved toward the other of the nozzle holder and the supplying device, so that the suction nozzle receives the electric component from the supplying device; an image taking device which takes an image of at least an end portion of the suction nozzle that applies the suction, as seen in a direction perpendicular to an axial direction of the nozzle, in a state in which the nozzle holder takes a known position in the axial direction and the suction nozzle does not hold an electric component; an image processor which determines, based on image data representing the image taken by the image taking device, a position, in the axial direction, of at least an end surface of the suction nozzle that applies the suction; and a control modifying device which modifies, based on the position determined by the image processor, the control of the reception controller to move said at least one of the nozzle holder and the electric-component supplying device.

If an image is taken during an EC treating action, the control is modified during the EC treating action. On the other hand, if an image is taken in a state in which an EC treating action is not performed, the control is modified before the next EC treating action is started.

The EC treating apparatus according to the twenty-third feature (23) may employ any one of the above-described second, third, fifth to ninth, twelfth, and thirteenth features (2), (3), (5) to (9), (12), and (13).

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF PREFERRED EMBODIMENTS

Hereinafter, there will be described an embodiment of the present invention in detail by reference to the drawings. An electric-component (EC) mounting apparatus 8 to which the present invention is applied has a construction similar to that of an EC mounting apparatus disclosed in Japanese Patent Document No. 6-342998. The same portions of the two EC mounting apparatuses are briefly illustrated and described, and only the different portions thereof are described in detail.

Figure 1:
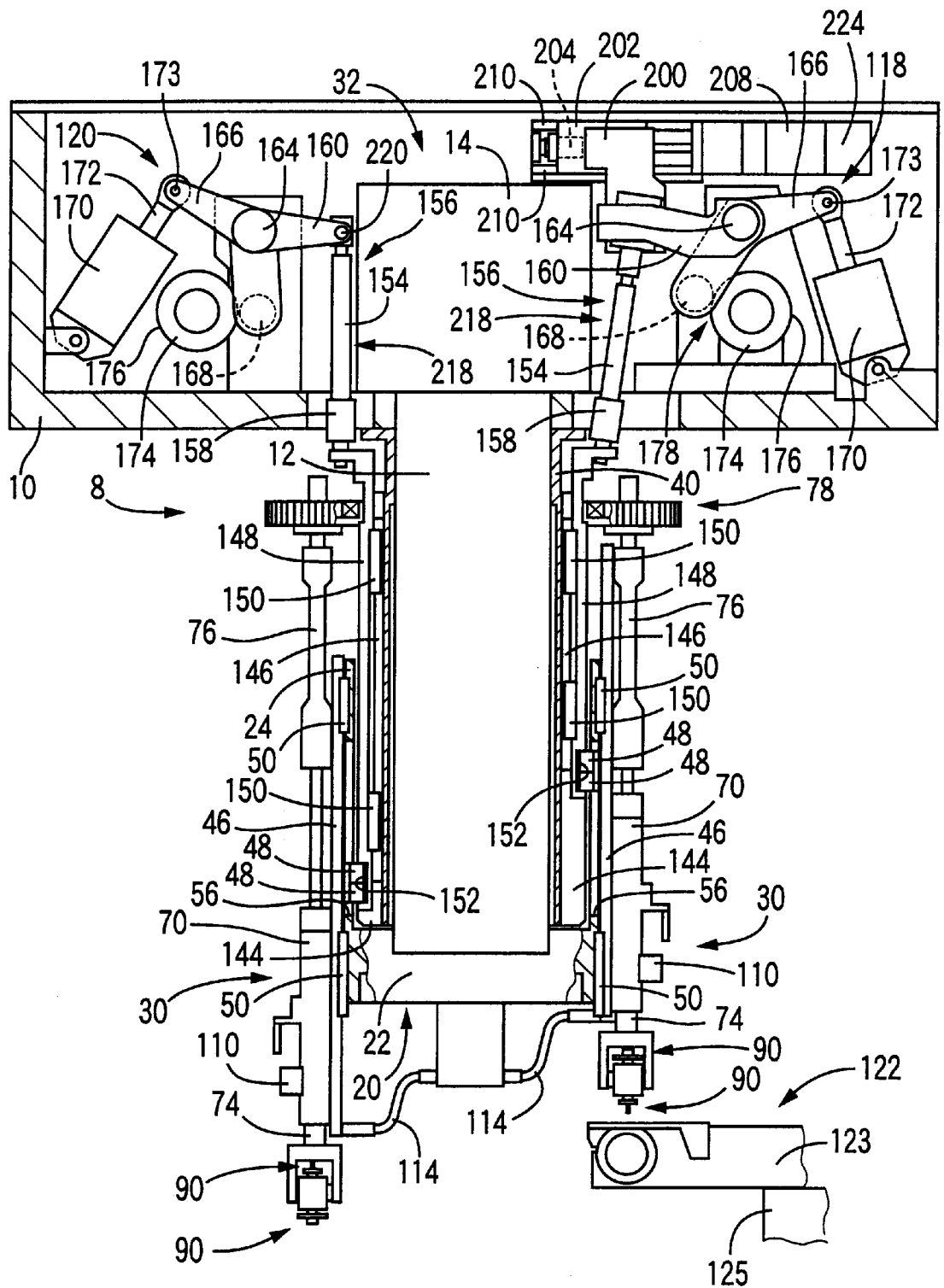
FIG. 1 is a partly cross-sectioned, front elevation view of an electric-component (EC) mounting apparatus to which the present invention is applied.

In FIG. 1, reference numeral 10 designates a frame which supports a rotary shaft 12 such that the rotary shaft 12 is rotatable about an axis line, e.g., a vertical axis line in the present embodiment. The rotary shaft 12 is rotated by a rotary-shaft drive device 14 including a roller gear and a roller gear cam, both not shown. When the roller gear cam is rotated at a prescribed speed in a prescribed direction by an index servomotor 16 (FIG. 16), a plurality of rollers of the roller gear sequentially engage a cam rib of the roller gear cam, so that the rotary shaft 12 is rotated intermittently at a prescribed angular pitch about the vertical axis line. A rotation angle of the index servomotor 16 is detected by an encoder 18 (FIG. 16) as a rotation detecting device.

An index table 20 as an intermittently rotatable member as a sort of displaceable member is fixed to a lower end portion of the rotary shaft 12 which projects downward from the frame 10. The index table 20 has a generally cylindrical shape, and includes a bottom portion 22 which is fixed to the rotary shaft 12, and a cylindrical portion 24 which extends toward the frame 10. The cylindrical portion 24 supports a plurality of EC mounting units 30, e.g., sixteen EC mounting units 30 in the present embodiment, such that the EC mounting units 30 are equiangularly spaced from one another on a circle whose center is located on the axis line about which the rotary shaft 12 is rotated. When the rotary shaft 12 is rotated, the index table 20 is rotated intermittently at the prescribed angular pitch equal to an angular pitch at which the sixteen EC mounting units 30 are supported.

Figure 2:
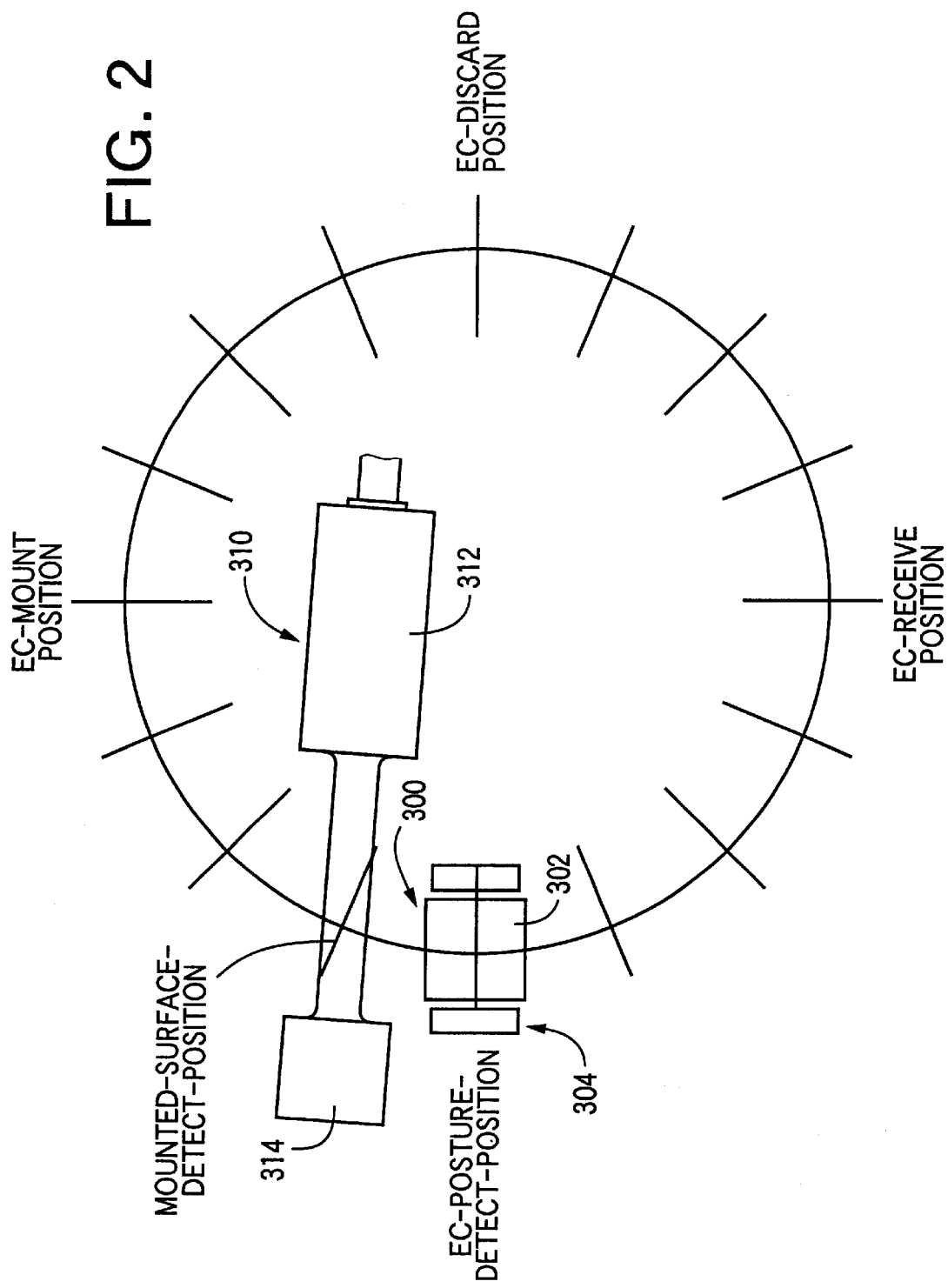
FIG. 2 is a plan view for explaining a plurality of stop positions of the EC mounting apparatus and showing respective image taking devices which are provided at an EC-posture-detect position and a mounted-surface-detect position as two stop positions.

Thus, each EC mounting unit 30 is stopped at sixteen stop positions including a plurality of operation positions and a plurality of detection positions. The rest of the stop positions are resting positions where no operation or detection is performed. In the present embodiment, as schematically illustrated in FIG. 2, the operation positions include an EC-receive position, an EC-mount position, and an EC-discard position; and the detection positions include an EC-posture-detect position and a mounted-surface-detect position. When the index table 20 is intermittently rotated, the sixteen EC mounting units 30 are revolved about the vertical axis line, while being sequentially moved to, and stopped, at the sixteen stop positions provided on the locus of revolution thereof. The rotary shaft 12, the rotary-shaft drive device 14, and the index table 20 cooperate with one another to provide a nozzle revolving device 32.

The operation positions include, in addition to the above-described EC-receive position and other positions, an EC-posture-correct position, an EC-mounting-unit-posture-correct position, and a nozzle-select position where an EC-posture correcting device, an EC-mounting-unit-posture correcting device, and a nozzle selecting device are provided, respectively. The detection positions additionally include a suction-nozzle-detect position where a suction-nozzle detecting device is provided. However, since those positions are not relevant to the present invention, no illustration or description is provided here.

As shown in FIG. 1, a cylindrical cam 40 is fixed to a lower surface of the frame 10. The cylindrical cam 40 is externally fitted around the rotary shaft 12, such that a space is left between the cam 40 and the shaft 12 in a radial direction of the cam 40 and that a lower portion of the cam 40 is inserted in a space present between the shaft 12 and the cylindrical portion 24 of the index table 20. A cam groove (not shown) is formed in the lower portion of the cam 40, such that the cam groove opens in an outer circumferential surface of the cam 40. A pair of rollers 48 which are attached to a guide rail 46 of each EC mounting unit 30 are engaged with the cam groove, such that the rollers 48 are rollable in the cam groove.

Sixteen pairs of guide blocks 50 are fixed to an outer circumferential surface of the index table 20, such that the sixteen pairs of guide blocks 50 are equiangularly spaced from one another. Thus, the sixteen pairs of guide blocks 50 are fixed to the index table 20, at an angular pitch equal to the angular pitch at which the index table 20 is intermittently rotated. The two guide blocks 50 of each pair are spaced from each other in a vertical direction parallel to an axis line about which each EC mounting unit 30 is revolved, and the guide rail 46 is fitted in the two guide blocks 50 such that the rail 46 is vertically movable relative to the blocks 50. The guide rail 46 has an elongate shape, and is supported by the guide blocks 50 such that the rail 46 is movable relative to the blocks 50 in a lengthwise direction of the rail 46 that is a vertical direction.

Figure 4:
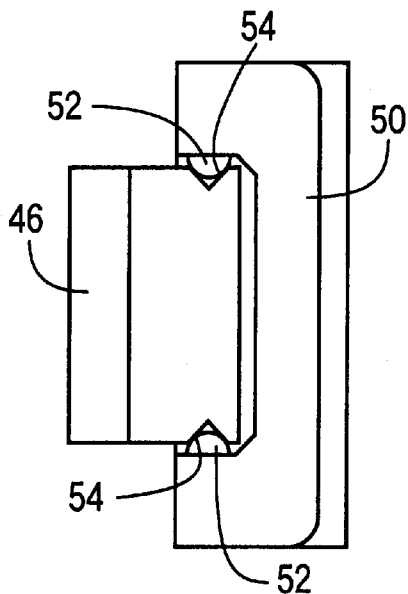
FIG. 4 is a plan view of a guide rail and a guide block which guide the upward and downward movements of the EC mounting unit.

As shown in FIG. 4, each guide block 50 has a generally U-shaped transverse cross section, and holds a plurality of balls 52 each as a rolling member such that the balls 52 are circulateable. The guide rail 46 has a pair of grooves 54 each of which has a V-shaped cross section and extends parallel to the lengthwise direction of the rail 46. The balls 52 are fitted in the grooves 54. The guide rail 46 is engaged with the guide blocks 50 via the balls 52, such that the rail 46 is movable relative to the blocks 50 in the lengthwise direction of the rail 46. A pair of side walls of each U-shaped guide block 50 prevent the guide rail 46 from being moved in a widthwise direction thereof, and the engagement of the balls 52 and the grooves 54 prevents the rail 46 from being moved in a direction perpendicular to the lengthwise and widthwise directions thereof, i.e., moved off the each block 50. Thus, the guide rail 46 is engaged with the guide blocks 50 such that the rail 46 is movable relative to the blocks 50 in only the lengthwise direction of the rail 46.

The above-mentioned pair of rollers 48 are attached to a lengthwise intermediate portion of the guide rail 46, such that each roller 48 is rotatable about a horizontal axis line perpendicular to the axis line about which the index table 20 is rotated. The pair of rollers 48 are fitted in the cam groove of the cylindrical cam 40, via an elongate hole 56 which is formed in a portion of the cylindrical portion 24 between the pair of guide blocks 50 and extends in a vertical direction. The pair of rollers 48 are attached to the guide rail 46 such that the two rollers 48 are arranged side by side in a vertical direction and are held in engagement with an upper wall surface and a lower wall surface of the cam groove, respectively.

The height position of the cam groove continuously changes in a circumferential direction of the cylindrical cam 40. When the index table 20 is rotated and the EC mounting units 30 are revolved, each pair of rollers 48 are moved in the cam groove, so that the corresponding EC mounting unit 30 is elevated and lowered. In the present embodiment, the cam groove is so formed that each EC mounting unit 30 reaches an upward-movement-end position at the EC-receive position, reaches a downward-movement-end position at the EC-mount position, and moves horizontally around each of the EC-receive position and the EC-mount position.

Figure 3:
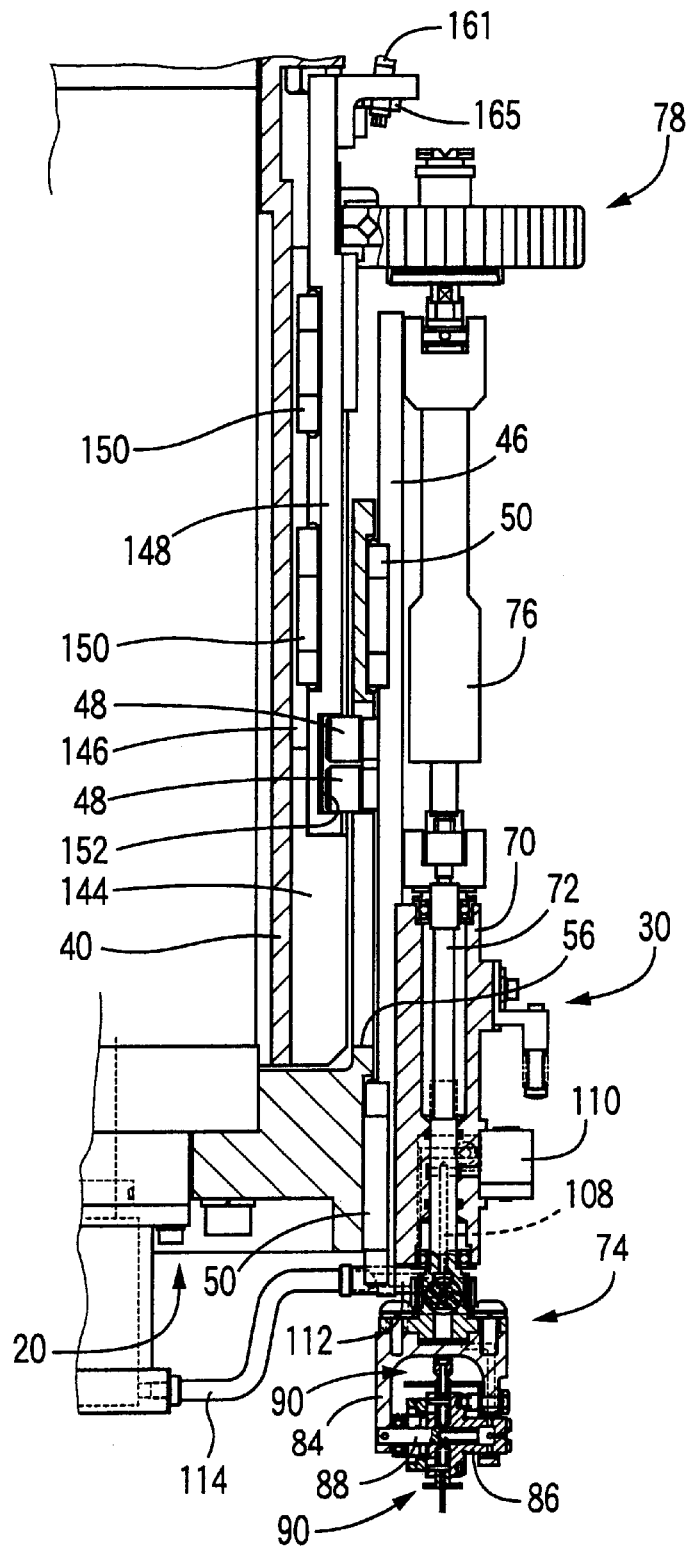
FIG. 3 is a partly cross-sectioned, front elevation view of an EC mounting unit, and a portion of an EC-mounting-unit elevating and lowering device provided at the EC-receive position, of the EC mounting apparatus.

A sleeve 70 as a cylindrical member is fixed to an outer surface of the guide rail 46. As shown in FIG. 3, a rod 72 having a circular transverse cross section is fitted in the sleeve 70, such that the rod 72 takes a vertical posture, i.e., a posture parallel to the axis line about which the nozzle holders 74 are revolved, and such that the rod 72 is rotatable about its own axis line and is not movable relative to the sleeve 70 in an axial direction of the rod 72. The rod 72 provides a shank portion of a nozzle holder 74. In the present embodiment, the nozzle holder 74 of each EC mounting unit 30 is rotated, at the EC-posture-correct position, about its own axis line by the EC-posture correcting device, and the rotation position of the unit 30 about the axis line is returned, at the EC-mounting-unit-posture-correct position, to an original position before correction, by the EC-mounting-unit-posture correcting device. A portion of the rotation of the unit 30 is effected concurrently with a portion of the rotation of the index table 20. To this end, the rod 72 receives a rotating or driving force from the EC-posture correcting device or the EC-mounting-unit-posture correcting device, via a rotation transmitting member 76, while the rod 72 is permitted to be elevated or lowered. A rotating device 78 rotates the rotation transmitting member 76 about an axis line parallel to the axis line about which the index table 20 is rotated, independent of the rotation of the table 20. However, those elements are not relevant to the present invention, no illustration or description thereof is provided here.

As shown in FIG. 3, an attachment member 84 is fixed to a lower end of the rod 72 that projects downward out of the sleeve 70. The attachment member 84 supports a rotary holder 86 via a support shaft 88 such that the rotary holder 86 is rotatable about a horizontal axis line perpendicular to an axis line of the rod 72. The attachment member 84, the rotary holder 86, and the rod 72 cooperate with one another to provide the nozzle holder 74. The rotary holder 86 holds a plurality of suction nozzles 90 such that the suction nozzles 90 are equiangularly spaced from each other about the support shaft 88 and extend in radial directions of the same 88. When the rotary holder 86 is rotated about the support shaft 88, one of the suction nozzles 90 is selectively moved to, and positioned at, an operative position where the one nozzle 90 is oriented downward and an axis line of the one nozzle 90 coincides with that of the rod 72. It can be said that the nozzle holder 74 and the suction nozzles 90 cooperate with each other to provide an EC holding head, which cooperates with the guide rail 46 to provide each EC mounting unit 30. The axis line of the one nozzle 90 being positioned at the operative position extends in a vertical direction, and the one nozzle 90 is moved in a direction intersecting an axial direction thereof when the index table 20 is rotated.

Figure 5:
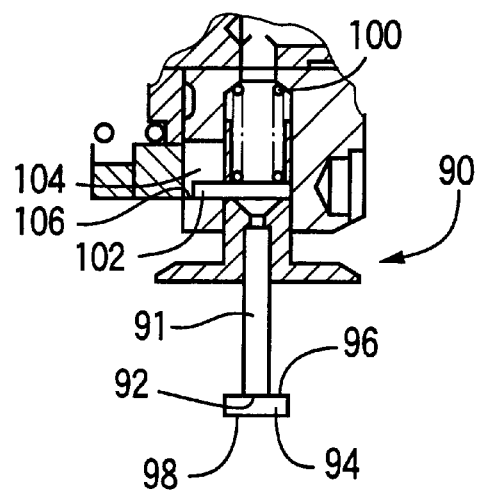
FIG. 5 is a partly cross-sectioned, front elevation view of a suction nozzle of the EC mounting unit.

FIG. 5 shows one of the suction nozzles 90, as a representative thereof. The one suction nozzle 90 includes a suction pipe 91, and a free-end (i.e., lower-end) surface of the suction pipe 91 provides a sucking end surface 92 which is perpendicular to the axis line of the one nozzle 90 and is a plane. In the present embodiment, each suction nozzle 90 applies a suction or negative pressure to an EC 94 and thereby holds the same 94. In the present embodiment, the suction nozzles 90 include at least two nozzles 90 of different sorts, but respective lengths of all the suction pipes 91 are equal to each other. Thus, respective distances of the respective sucking end surfaces 92 of the suction pipes 91 from the axis line about which the rotary holder 86 is rotated, are equal to each other. Hereinafter, an upper surface of the EC 94 that is sucked and held by the suction nozzle 90 will be referred to as a "sucked" surface 96 of the EC 94; and a lower surface of the EC 94 that is mounted on the PWB will be referred to as a "mounted" surface 98 of the EC94.

Each suction nozzle 90 is held by the rotary holder 86 such that the each nozzle 90 is not rotatable, but is movable in an axial direction thereof, relative to the holder 86. Each suction nozzle 90 is biased, by a spring 100 as a biasing device that is provided between the each nozzle 90 and the rotary holder 86, in a direction in which the each nozzle 90 advances out of the holder 86. The limit of advancement of the nozzle 90 caused by the biasing action of the spring 100 is defined by the engagement of a pin 102 fitted in the nozzle 90 and extending perpendicularly to the axis line of the nozzle 90, with a wall surface 106 defining an end of an elongate hole 104 formed in the rotary holder 86. Thus, the pin 102 and the wall surface 106 provide respective engaging portions which engage each other and cooperate with each other to provide an advancement-limit defining device. The pin 102 is fitted in the elongate hole 104, such that the pin 102 is movable relative to the hole 104 in the axial direction of the suction nozzle 90. A position of the suction nozzle 90 where the pin 102 is engaged with the wall surface 106 defining the end of the elongate hole 104 and is prevented from being further moved is an advancement-end position of the nozzle 90. From this position, the nozzle 90 can be retracted into the rotary holder 86 while compressing the spring 100. FIG. 1 shows that each EC mounting unit 30 has two suction nozzles 90, for easier illustration purposes only.

The one suction nozzle 90 being positioned at the operative position is connected to a negative-pressure supplying device or an air suction device, not shown, via respective negative-pressure passages 108 of the support shaft 88, the rotary holder 86, the attachment member 84, and the rod 72 (numeral 108 is assigned, in FIG. 3, to only the negative-pressure passage provided in the rod 72), a switch valve 110 as a control valve that is fixed to the sleeve 70, a coupling member 112, a hose 114, and respective negative-pressure passages (not shown) of the index table 20 and the rotary shaft 12. The negative-pressure passage of the support shaft 88 is so formed as to be connected to only the one suction nozzle 90 being positioned at the operative position. In addition, when the rotary holder 86 is rotated, the respective negative-pressure passages of the attachment member 84, the holder 86, and the support shaft 88 are kept communicated with one another. Moreover, when the rotary shaft 12 is rotated, the respective negative-pressure passages of the index table 20 and the rotary shaft 12 are kept communicated with the negative-pressure supplying device or the air suction device.

The switch valve 110 is mechanically switched like the switch valve disclosed in Japanese Patent Document No. 10-126097. When each EC mounting unit 30 is lowered at the EC-receive position, the switch valve 110 is switched to a negative-pressure-supply position thereof to cause the negative-pressure passage 108 to be communicated with the negative-pressure supplying device or the air suction device so that a negative-pressure air is supplied to the suction nozzle 90, and then the switch valve 110 is kept to the negative-pressure-supply position till the EC 94 is mounted on the PWB. When the EC mounting unit 30 is lowered at the EC-mount position to mount the EC 94 on the PWB, the switch valve 110 is switched to a positive-pressure-supply position thereof to supply an atmospheric-pressure air or a positive-pressure air to the suction nozzle 90 so that the EC 94 is released from the nozzle 90.

As shown in FIGS. 1 and 3, two EC-mounting-unit elevating and lowering devices 118, 120 are provided at respective portions of the frame 10, and respective portions of the cylindrical cam 40 fixed thereto, that correspond to the EC-receive position and the EC-mount position, respectively. Each of the EC-mounting-unit elevating and lowering devices 118, 120 provides an EC-mounting-unit moving device, a nozzle-holder moving device, or a nozzle moving device that elevates and lowers each EC mounting unit 30, moves the nozzle holder 74 thereof, or moves the suction nozzle 90 thereof in the axial direction of the nozzle 90. Each EC-mounting-unit elevating and lowering device 118, 120 also functions as a nozzle-holder or nozzle elevating and lowering device.

Next, there will be described the EC-mounting-unit elevating and lowering device 118 provided at the EC-receive position. At the EC-receive position, there is provided an EC supplying device 122 which supplies ECs 94. In the present embodiment, the EC supplying device 122 includes a plurality of EC-supply feeders (hereinafter, simply referred to as the feeders) 123. The feeders 123 are positioned, on a table 125, by respective positioning devices, not shown, and are detachably attached to the table 125 by respective attaching devices, not shown, such that respective EC-supply portions of the feeders 123 are arranged along a straight line. Each suction nozzle 90 picks up an EC 94 from the EC-supply portion of each feeder 123. The direction in which the respective EC-supply portions of the feeders 123 are arranged will be referred to as an X-axis direction. When the table 125 is moved in the X-axis direction by a table moving device including, as a drive source thereof, a table moving servomotor 128 (FIG. 16), the EC-supply portion of an appropriate one of the feeders 123 is selectively moved to an EC-supply position which is right below the one EC mounting unit 30 being positioned at the EC-receive position, more specifically described, the one suction nozzle 90 thereof being positioned at the operative position. Thus, the feeders 123 are moved relative to the EC-mounting-unit elevating and lowering device 118. The EC-receive position can be said as an EC-suck position.

Figure 20:
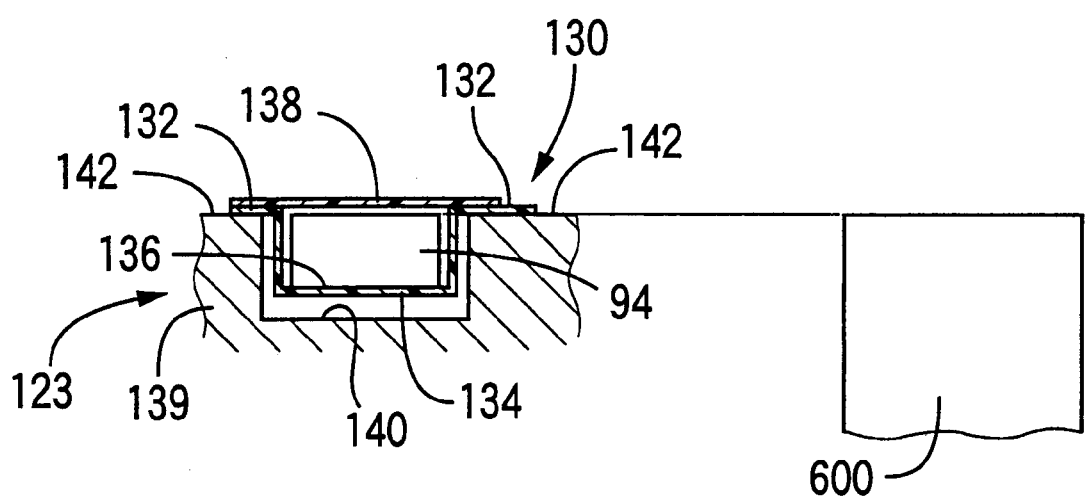
FIG. 20 is a view for showing a state in which an EC to be mounted on a printed wiring board by the EC mounting apparatus is held by an EC carrier tape, and explaining a manner in which a target downward-movement-end position of each suction nozzle is set.

In the present embodiment, each EC 94 may be one which has lead wires, or a chip-like one which has no lead wires. As shown in FIG. 20, each feeder 123 is a tape-type feeder which feeds an EC carrier tape 130 carrying ECs 94. In the present embodiment, the EC carrier tape 130 includes a pair of supported portions 132 which are located at widthwise opposite end portions of the tape 130 and extend parallel to each other; and an EC accommodating portion 134 which projects downward from the two supported portions 132 and has a plurality of EC accommodating pockets 136 at respective regular intervals in a lengthwise direction of the tape 130. Each EC accommodating pocket 136 accommodates one EC 94. Respective openings of the EC accommodating pockets 136 are closed by a cover tape 138. The EC carrier tape is a so-called embossed-type one having a pair of supported portions 132 which are supported on a main frame 139 of the feeder 123. The EC accommodating portion 134 of the EC carrier tape 130 is fitted in a groove 140 which is formed in an upper surface of the main frame 139, such that the pair of supported portions 132 of the tape 130 are supported on a pair of tape-support surfaces 142 provided on both sides of the groove 140 as seen in a widthwise direction thereof. Therefore, even if different sorts of EC carrier tapes 130 carrying different sorts of ECs 94 having different thickness values may be fed, respective height positions of respective upper surfaces of the respective cove tapes 138 of the different sorts of carrier tapes 130 do not differ from one another, and respective height positions of the respective upper surfaces of the different sorts of ECs 94 do not differ from one another.

Each EC mounting unit 30 is lowered and elevated, at the EC-receive position, by the EC-mounting-unit elevating and lowering device 118, so that the one suction nozzle 90 being positioned at the operative position receives an EC 94 from the one feeder 123 being positioned at the EC-supply position. To this end, as shown in FIG. 1, the cylindrical cam 40 has, in a portion thereof corresponding to the EC-receive position, a guide groove 144 which opens in the outer circumferential surface of the cam 40 and extends in a vertical direction. An elongate guide rail 146 as a guide member is fixed to a wall surface defining a bottom of the guide groove 144, such that the guide rail 146 extends in a vertical direction parallel to the axial direction of the one suction nozzle 90 being positioned at the operative position and the axis line about which the index table 20 is rotated. Two guide blocks 150 which are fixed to an elevator member 148 as a nozzle-side member, are fitted on t he guide rail 146 such that the guide blocks 150 are movable on the rail 146. The elevator member 148 has a width which assures that the elevator member 148 is just fitted in the guide groove 144, and has, in a lower end portion thereof, a horizontal engaging groove 152 which opens on the side of the outer circumferential surface of the cylindrical cam 40 a nd has the same width (i.e., dimension as measured in a lengthwise direction of the elevator member 148) as that of the cam groove of the cam 40. In a state in which the elevator member 148 is positioned at an upward-movement-end position thereof, the engaging groove 152 takes the same height position as that of one of the horizontal portions of the cam groove of the cylindrical cam 40, and accordingly is continuous with the cam groove.

Figure 7:
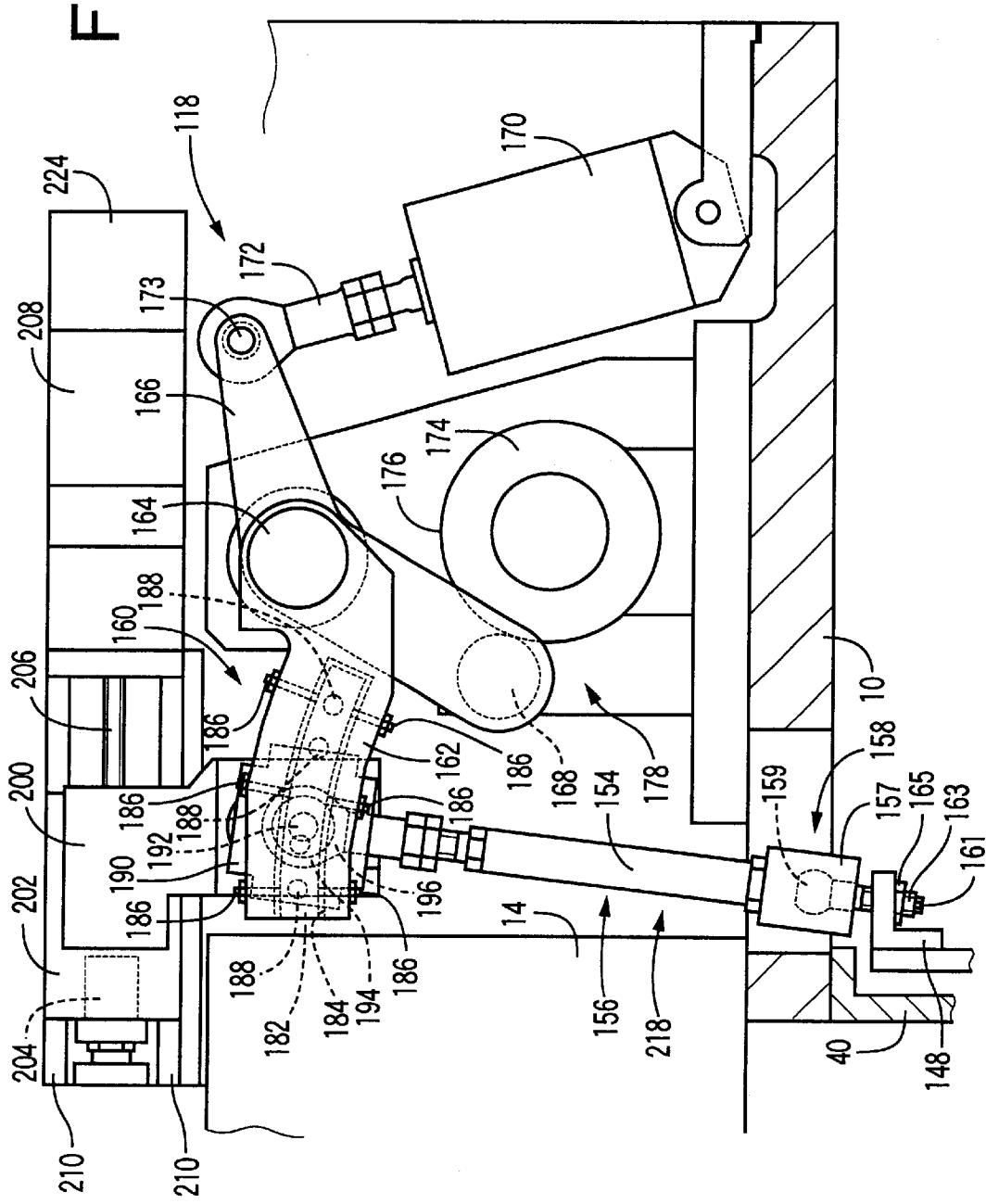
FIG. 7 is a partly cross-sectioned, front elevation view of the EC-mounting-unit elevating and lowering device, and a nozzle-movement control device, provided at the EC-receive position.

As shown in FIG. 7, an upper end portion of the elevator member 148 projects upward out of the guide groove 144, and is connected to a lower end portion of a main member 154 of a connecting rod 156, via a spherical joint 158, such that the elevator member 148 is rollable or pivotable, but is not movable in an axial direction thereof, relative to the rod 156. The spherical joint 158 is integral with the ma in member 154 of the connecting rod 156, and includes a case portion 157 having a concave surface and a shaft 161 having a spherical surface 159 which is fitted in the case portion 157 such that the shaft 161 is rollable or pivotable relative to the case portion 157 but is not removable from the same 157. The shaft 161 has an externally threaded portion 163 which is threadedly engaged with the elevator member 148 and is fixed to the same 148 with a nut 165.

An upper end portion of the main member 154 of the connecting rod 156 is connected to an arm 162 of a lever 160, such that the rod 156 is pivotable relative to the lever 160 and a connection position where the rod 156 is connected to the lever 160 is adjustable. A rotatable shaft 164 is supported by the frame 10 such that the shaft 164 is rotatable about a horizontal axis line, and the lever 160 is supported by the rotatable shaft 164 such that the lever 160 is not rotatable relative to the shaft 164. The rotatable shaft 164 supports another lever 166 such that the lever 166 is not rotatable relative to the shaft 164. A roller 168 as a cam follower is attached to one end portion of the lever 166, such that the roller 168 is rotatable relative to the lever 166; and a piston rod 172 of an air-operated cylinder device 170 is connected via a pin 173 to the other end portion of the lever 166 such that the piston rod 172 is pivotable relative to the lever 166. When the lever 166 is biased by the air cylinder 170, the roller 168 engages a cam surface 176 of a rotary cam 174 as a sort of cam. The rotary cam 174 is rotated by the previously-described index servomotor 16, and cooperates with the roller 168 to provide a cam device 178. Thus, the EC-mounting-unit elevating and lowering devices 118, 120 and the nozzle revolving device 32 share the common drive source 16. The air cylinder 170 is a double-action-type one and, in a state in which a pressurized air is supplied to one of air chambers of the cylinder 170 and accordingly the roller 168 is pressed against the cam surface 176, if the rotary cam 174 is rotated, the lever 166 is pivoted and accordingly the lever 160 is also pivoted.

Figure 9:
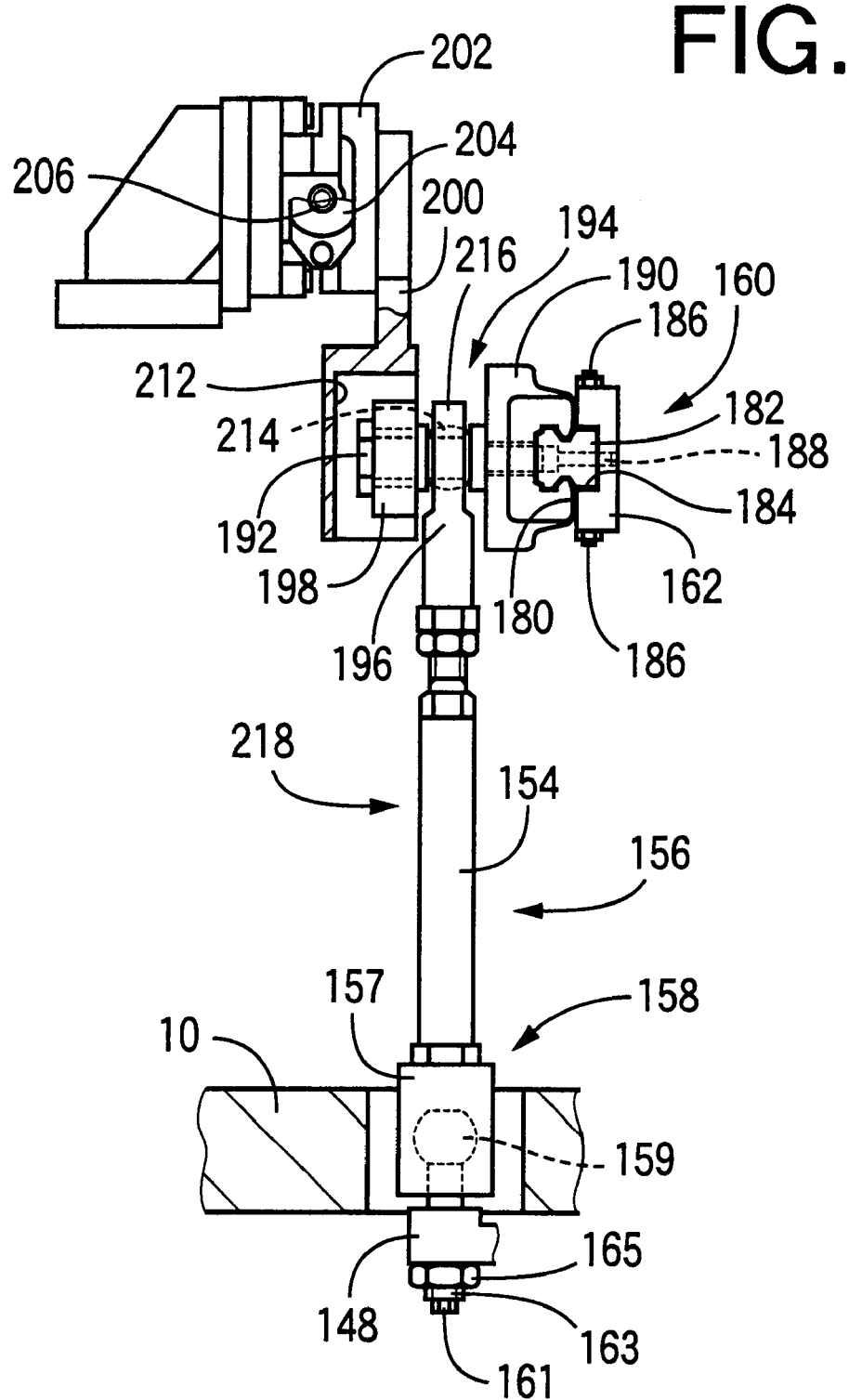
FIG. 9 is a side elevation view of the EC-mounting-unit elevating and lowering device and the nozzle-movement control device.

As shown in FIGS. 7 and 9, the arm 162 is provided with a guide member 182 which is curved along an arc. In the present embodiment, the guide 182 is provided by a member produced separately from the arm 162, and is fitted in an arcuate groove 184 opening in a vertical surface 180 of the arm 162. A width of the arcuate groove 184 (i.e., a dimension as measured in a radial direction of the arc) is greater than that of the guide 182, so that the guide 182 is fitted in the groove 184 and is engaged with, and positioned by, a plurality of pairs of adjuster bolts 188 threadedly engaged with the arm 162, in the radial direction of the arc. The guide 182 is fixed to the arm 162 with a plurality of bolts 188. An amount of threaded engagement of the adjustor bolts 186 with the arm 162 can be adjusted to adjust a position of the guide 182 relative to the arm 162 in the radial direction of the arc. This adjustment will be described later.

The guide 182 projects from the vertical surface 180, and a first slide member 190 as a first movable member is fitted on the projecting portion of the guide 182 such that the first slide 190 is movable relative to the guide 182. Thus, the first slide 190 is supported by the arm 162 such that the first slide 190 is movable relative to the arm 162 in a lengthwise direction of the arm 162. A support shaft 192 projects from the first slide 190, such that the support shaft 192 extends parallel to an axis line about which the lever 160 is pivoted. The upper end portion of the main member 154 of the connecting rod 156 is connected via a spherical joint 194 to the support shaft 192 such that the rod 156 is pivotable, but is not movable in an axial direction thereof, relative to the shaft 192.

The spherical joint 194 includes a spherical member 214 held by the support shaft 192, and an engaging member 216 having a part-spherical concave surface. The engaging member 216 is fitted on the spherical member 214 such that the engaging member 216 is rollable or pivotable relative to the spherical member 214, and one end portion of the engaging member 216 that is opposite to the other end portion fitted on the spherical member 214 is threadedly engaged with the upper end portion of the main member 154 of the connecting rod 156. In the present embodiment, the main member 154, the case portion 157, and the engaging member 216 cooperate with one another to provide the connecting rod 156, which cooperates with the shaft 161, the spherical member 214, and the support shaft 216 to provide a connecting device 218 which connects the elevator member 148 and the first slide 190 to each other. Hereinafter, an upper end portion of the connecting rod 156 that is pivotally connected to the lever 160 will be referred to as a connection portion 196.

When the rotary cam 174 is rotated and accordingly the lever 160 is pivoted, the connecting rod 156 is elevated or lowered and accordingly the elevator member 148 is elevated or lowered, so that the EC mounting unit 30 or the suction nozzle 90 is elevated or lowered. In the present embodiment, the cam surface 176 has such a shape which assures that first the suction nozzle 90 is smoothly accelerated, then is moved downward at a constant speed, and is smoothly decelerated during a terminal portion of the downward movement. When the EC mounting unit 30 is elevated or lowered, the roller 168 is biased by the air cylinder 170 to follow the cam surface 176. On the other hand, when the EC mounting unit 30 is not elevated or lowered, the roller 168 is not biased by the air cylinder 170 being switched to a different state, and does not follow the cam surface 176.

Figure 8:
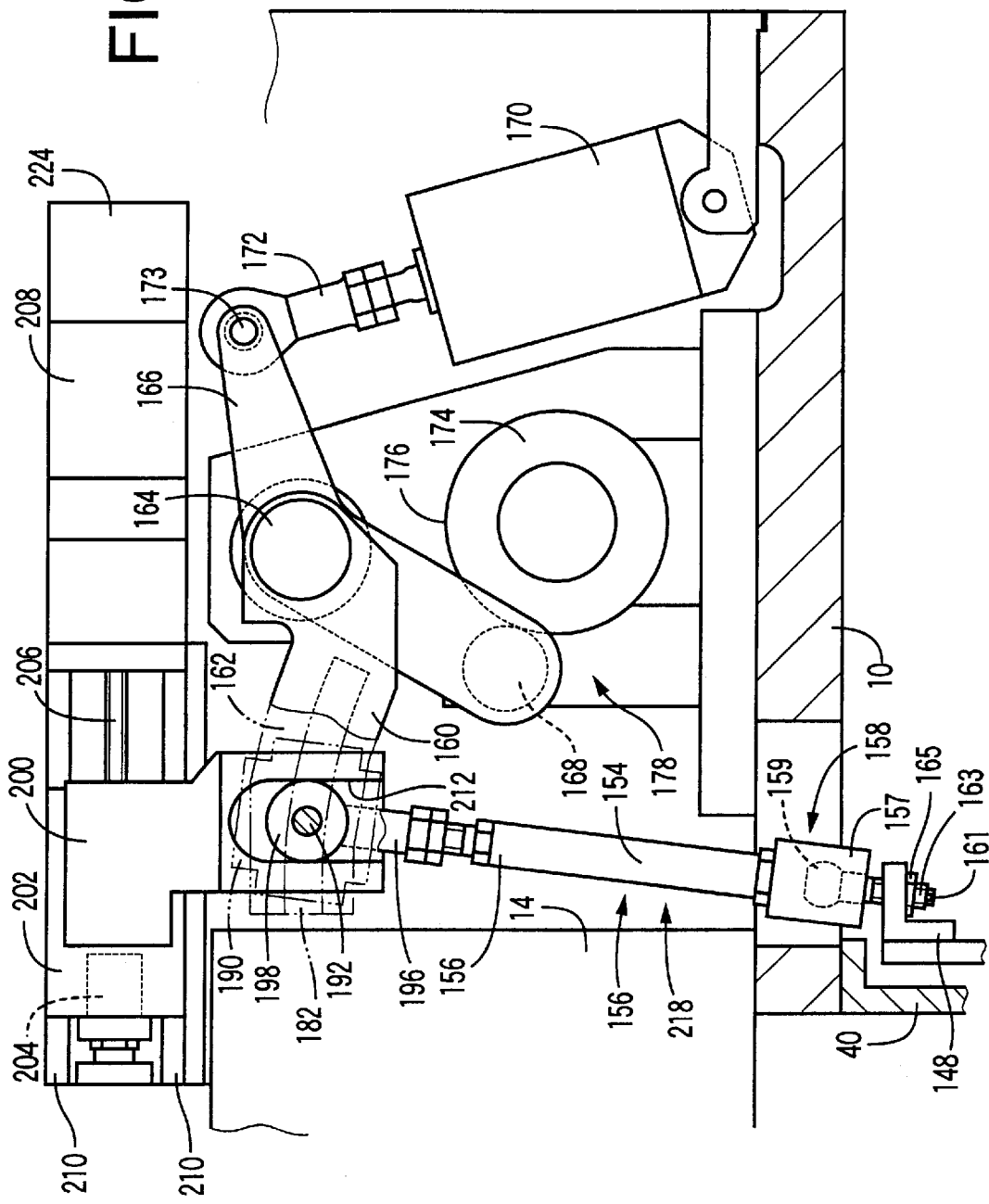
FIG. 8 is a front view of a second slide and a roller of the nozzle-movement control device.

As shown in FIG. 9, the support shaft 192 additionally supports a roller 198 such that the roller 198 is rotatable relative to the shaft 192. The roller 198 provides a first engaging portion. The roller 198 is engaged with an engaging member 200 as a second engaging portion, such that the roller 198 is rotatable relative to the engaging member 200 and is movable upward and downward relative to the same 200. As shown in FIGS. 7 and 9, the engaging member 200 is provided on a second slide member 202 as a second movable member that is supported by the frame 10 such that the second slide 202 is movable relative to the frame 10. As shown in FIG. 8, a nut 204 is fixed to the second slide 202, and is threadedly engaged with a feed screw 206. The feed screw 206 is supported by the frame 10 such that the screw 206 is rotatable, but not movable in an axial direction thereof, relative to the frame 10. When the feed screw 206 is rotated by a second-slide-drive servomotor 208 as a sort of an electric motor as a drive source that is accurately controllable with respect to rotation angle, the second slide 202 is moved, while being guided by a pair of guide members 210, in horizontal directions which are substantially parallel to a lengthwise direction of the arm 162 and is perpendicular to the axis line about which the lever 160 is pivoted. The rotation angle of the servomotor 208 is detected by an encoder 224 as a rotation detecting device.

Figure 10A:
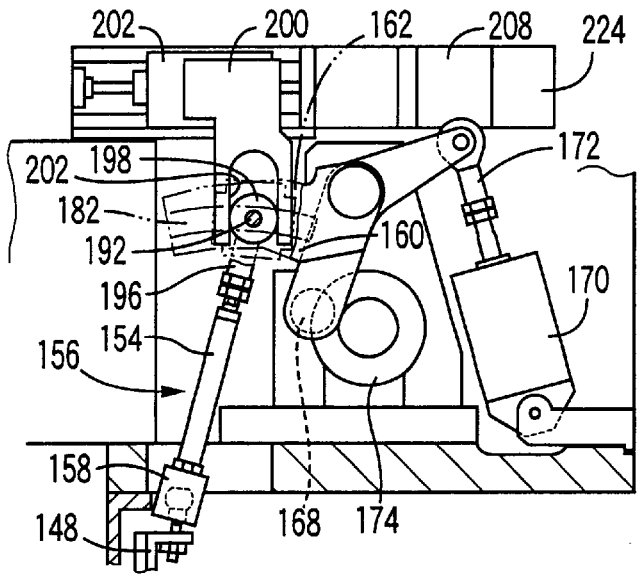
FIGS. 10A, 10B, and 10C are views for explaining a manner in which the nozzle-movement control device changes a target downward-movement-end position of each suction nozzle.
Figure 10B:
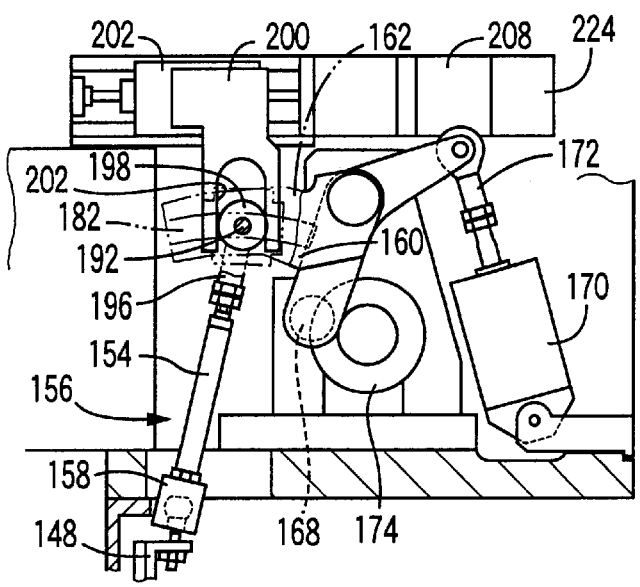
Figure 10C:
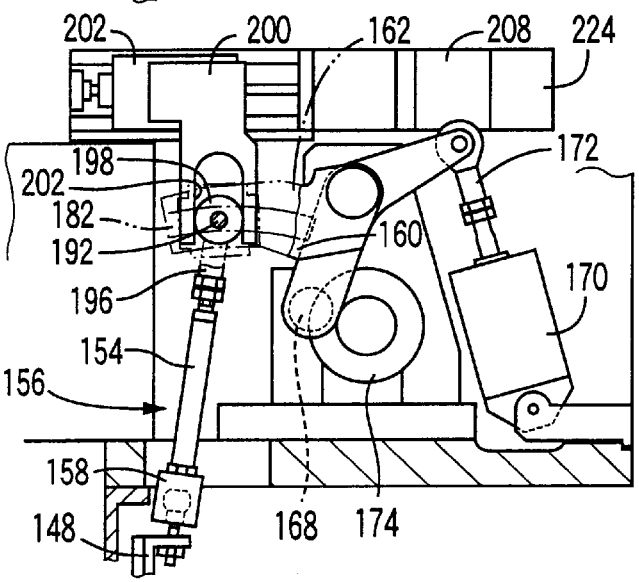

As shown in FIG. 8, the engaging member 200 includes a projecting portion projecting downward from the second slide 202, and the projecting portion has a vertical recess 212 in which the roller 198 is fitted such that the roller 198 is rotatable, and vertically movable, relative to the engaging member 200, but is not movable relative to the same 200 in a direction parallel to the directions in which the second slide 202 is moved. Therefore, when the second slide 202 is moved, the roller 198 is moved with the second slide 202, the first slide 190 is moved in the lengthwise direction of the lever 160, while being guided by the guide 182, and the connection portion 196 of the connecting rod 156 is moved relative to the lever 160. Thus, as shown in FIGS. 10A, 10B, and 10C, a distance between the center of the connection portion 196 (i.e., the center of the spherical member 214 of the spherical joint 194) and the axis line about which the lever 160 is pivoted is changed, so that a stroke of upward and downward movements of the elevator member 148 or the suction nozzle 90 is changed. The above distance can be substantially continuously changed, so that the stroke of upward and downward movements of the suction nozzle 90 can be changed to any one of an infinite number of different strokes. Since the connecting rod 156 is connected to the elevator member 148 via the spherical joint 158, the rod 156 is permitted to be pivoted relative to the elevator member 148, when the stroke is changed or the lever 160 is pivoted. In addition, when the connection portion 196 of the rod 156 is moved relative to the lever 160 to change the above distance, or when the lever 160 is pivoted, the roller 198 is moved vertically, which is permitted by the vertical recess 212. The recess 212 has such a dimension which assures that the roller 198 does not come out of the recess 212 when the roller 198 is moved vertically by the pivotal motion of the lever 160.

In the present embodiment, the guide 182 extends along an arc, and the center of the arc is located on an axis line about which a lower end portion of the connecting rod 156 is pivoted in a state in which the elevator member 148 is positioned at its upper-movement-end position. That is, in a state in which the roller 168 is engaged with a portion of the cam surface 176 of the rotary cam 174 that causes the elevator member 148 to be positioned at its upward-movement-end position, the center where the connecting rod 156 is rollably connected to the elevator member 148 via the spherical joint 158 (i.e., the center of the spherical portion 159) is located on the center of the arcuate guide 182. Therefore, even if the connection portion 196 is moved relative to the lever 160, the upward-movement-end position of the elevator member 148 is not changed, but the downward-movement-end position of the same 148 is changed, so that the downward-movement-end position of the suction nozzle 90 is changed and accordingly the stroke of upward and downward movements of the same 90 is changed.

The respective positions of the guide 182 and the elevator member 148 are so adjusted that in the state in which the center about which the connecting rod 156 is pivoted relative to the elevator member 14 is located on the center of the arcuate guide 182 and the suction nozzle 90 is positioned at its upward-movement-end position, the engaging groove 152 is always aligned with the cam groove of the cylindrical cam 40 and the roller 48 can be moved from the cam groove to the engaging groove 152 and vice versa. More specifically described, first, in a state in which a distance between the center of the spherical joint 158 of the connecting rod 156 and the center of the spherical joint 194 is adjusted to a correct length, the first slide 190 is moved along the guide 182, while the position of the guide 182 is so adjusted, with the adjustor bolts 186, that the first slide 190 can be smoothly moved relative to the guide 182. Then, the bolts 188 are fastened to fix the guide 182 to the arm 162. Subsequently, the nut 165 which fixes the elevator member 148 to the shaft 161 is loosened, and the shaft 161 is rotated, as needed, to adjust the height position of the elevator member 148. After the adjustment, the nut 165 is fastened to fix the elevator member 148 to the shaft 161.

The above-mentioned "downward-movement-end position of the suction nozzle 90" is not limited to an actual downward-movement-end position, but may mean a target downward-movement-end position, when appropriate. The target downward-movement-end position is defined as a position, corresponding to a downward-movement-end position of the nozzle holder 74, where the suction nozzle 90 does not compress the spring 100, i.e., does not move back to the side of the nozzle holder 74. That is, the target downward-movement-end position is a prescribed position to which the suction nozzle 90 should be moved downward unless the nozzle 90 is contacted with the EC 94 and is prevented thereby from being further moved downward. If the suction nozzle 90 is contacted with the EC 94 and is prevented thereby from being further moved downward, the actual downward-movement-end position of the nozzle 90 is higher than the target downward-movement-end position thereof. On the other hand, if the suction nozzle 90 is just contacted with the EC 94, or any space is left between the nozzle 90 and the EC 94, when the nozzle 90 is moved to, and stopped, at an actual downward-movement-end position thereof, the actual downward-movement-end position is equal to the target downward-movement-end position.

In the present embodiment, when the target downward-movement-end position of the suction nozzle 90 is changed, the upward-movement-end position of the nozzle 90 is not changed, and accordingly an amount of change of the stroke of upward and downward movements of the nozzle 90 can be entirely used as an amount of change of the target downward-movement-end position of the same 90. Thus, the amount of change of the stroke can be effectively used and accordingly be minimized. FIGS. 10A, 10B, and 10C show the state in which the elevator member 148 is positioned at its downward-movement-end position.

Figure 11:
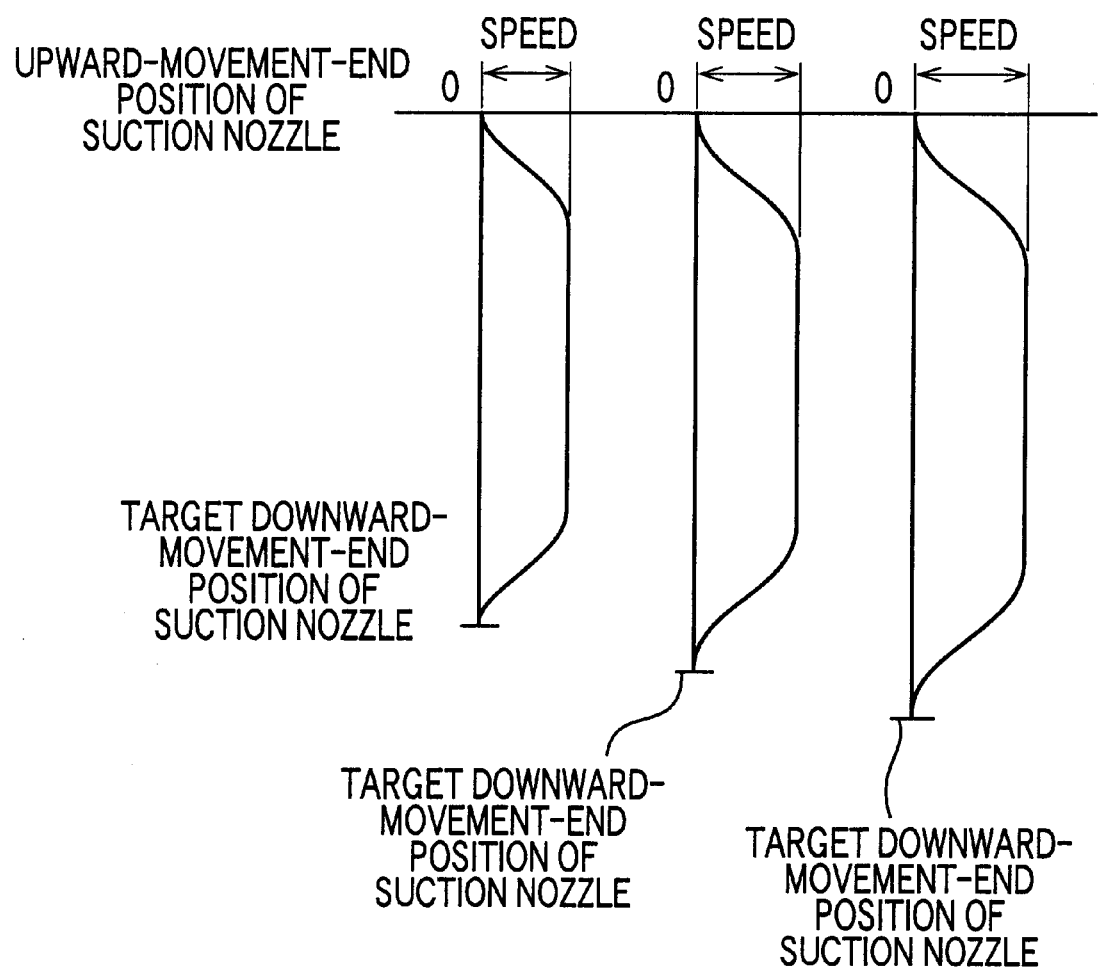
FIG. 11 is a view for explaining a manner in which the nozzle-movement control device changes the target downward-movement-end position, and a deceleration-start position, of each suction nozzle.

Thus, when the downward-movement-end position of the elevator member 148 is changed, the target downward-movement-end position of the suction nozzle 90 is changed, and simultaneously a position where the acceleration of downward movement of the nozzle 90 is ended, a position where the deceleration of downward movement of the nozzle 90 is started, and a speed of downward movement of the nozzle 90 are changed, as illustrated in FIG. 11. That is, a speed decreasing mode is changed. In the present embodiment, since a height position of the feeders 123 and the table 125 of the EC supplying device 122 cannot be adjusted, the target downward-movement-end position of the suction nozzle 90 is changed to assure that each nozzle 90 can reliably receive an EC 94 from each feeder 123.

The EC-mounting-unit elevating and lowering device 120 cannot adjust the target downward-movement-end position of each suction nozzle 90. Thus, the target downward-movement-end position is constant. An upper end portion of a main member 154 is pivotally connected to a lever 160 via a pin 220. Thus, the main member 154 cooperates with a case portion 157 of a spherical joint 158 to provide a connecting rod 156, which cooperates with a shaft 161 and the pin 220 to provide a connecting device 218. Except those differences, the EC-mounting-unit elevating and lowering device 120 has a construction similar to that of the EC-mounting-unit elevating and lowering device 118, and the same reference numerals as used for the device 118 are used to designate the corresponding elements of the device 120, without describing them.

As schematically illustrated in FIG. 2, an image taking device 300 is provided at the EC-posture-detect position. The image taking device 300 includes a CCD (charge-coupled-device) camera 302 that is a surface-image taking device which can take a two-dimensional image of the EC 94 at once. The CCD camera 302 includes a matrix of CCDs each as a sort of solid image sensor, i.e., a number of small light-receving elements arranged on a plane. The CCD camera 302 is provided below each EC mounting unit 30 being positioned at the EC-posture-detect position on the locus of revolution of the each unit 30, such that the camera 302 is oriented upward. A lighting device 304 is provided adjacent to the CCD camera 302, and emits an ultraviolet light toward a lighting plate of each suction nozzle 90, so that the lighting plate emits, from a fluorescent surface thereof, a visible light toward the EC 94 and the CCD camera 302 takes a silhouette image of the EC 94 held by the nozzle 90.

Figure 6:
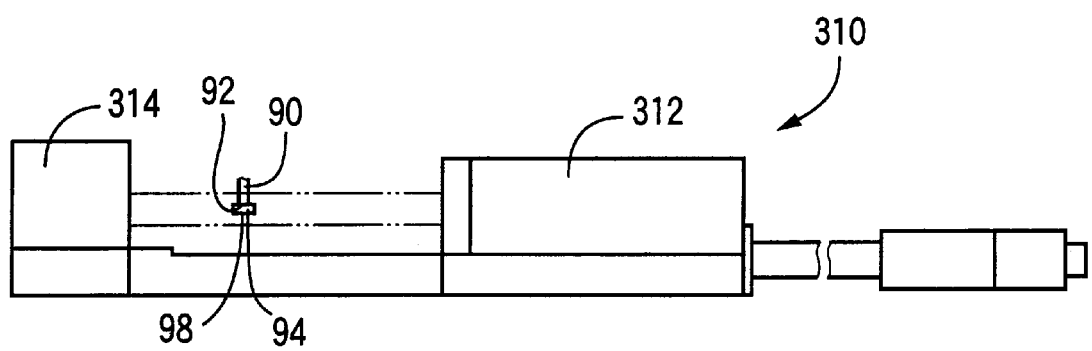
FIG. 6 is a front elevation view of the image taking device provided at the mounted-surface-detect position as one of the stop positions.

As shown in FIG. 2, an image taking device 310 is provided at the mounted-surface-detect position. The image taking device 310 includes a CCD camera 312. The CCD camera 312 is, like the CCD camera 302, a surface-image taking device which can take a two-dimensional image of the EC 94 at once. The image taking device 310 additionally includes a lighting device 314 which is opposed to the CCD camera 312. Respective optical axes of the CCD camera 312 and the lighting device 314 are perpendicular to the vertical suction nozzle 90 being positioned at the operative position and accordingly, in the present embodiment, the optical axes are horizontal. The CCD camera 312 is provided inside the locus of revolution of the suction nozzle 90 being positioned at the operative position that is described when the nozzle holder 74 is revolved by the nozzle revolving device 32, such that the CCD camera 312 is oriented toward outside the locus. The lighting device 314 is provided outside the locus such that the lighting device 314 is oriented toward inside the locus, i.e., is opposed to the CCD camera 312. As shown in FIG. 6, the CCD camera 312 and the lighting device 314 are located, with respect to the vertical direction, i.e., the axial direction of the suction nozzle 90, at a position where the camera 312 and the lighting device 314 can take an image of the lower end portion of the nozzle 90 and the EC 94 held by the nozzle 90, that is, a position where the lower end portion of the nozzle 90 and the EC 94 held by the nozzle 90 are positioned inside an image-take space, indicated at two-dot-chain line, irrespective of which shape or size each nozzle 90 or each EC 94 may have. The CCD camera 312 takes an image of the nozzle 90 and the EC 94, as seen in a direction perpendicular to the axial direction of the nozzle 90.

As shown in FIGS. 12 to 15, at the EC-mount position, there is provided a wiring-board (WB) supporting and moving device 352 as a circuit-substrate supporting and moving device that supports and moves a printed wiring board (PWB) 350 as a sort of circuit substrate. The WB supporting and moving device 352 cooperate with the EC mounting apparatus 8 and the EC supplying device 122 to provide an EC mounting system. In the present embodiment, the WB supporting and moving device 352 has the same construction as that of the WB supporting and moving device disclosed in Japanese Patent Document No. 10-224099 or a corresponding U.S. patent application Ser. No. 09/015,521, and accordingly is briefly described. The WB supporting and moving device 352 essentially includes (1) a WB conveying device 354 which conveys the PWB 350; (2) a WB holding device 356 which positions and holds the PWB 350 conveyed by the WB conveying device 354; (3) a WB-holding-device elevating and lowering device 358 which moves the WB conveying device 354 and the WB holding device 356 in a vertical, Z-axis direction, and elevates and lowers the devices 354, 356 between a WB-transfer height position, indicated at two-dot-chain line, and an EC-mount height position, indicated at solid line; (4) a height-position adjusting device 360 which adjusts, at the EC-mount height position, a height position of the WB holding device 356; and (5) an X-Y table 362 which supports the WB holding device 356 via the height-position adjusting device 360 and moves the device 356 to an arbitrary position on a horizontal plane.

The X-Y table 362 moves the WB conveying device 354 and the WB holding device 356 being positioned at the EC-mount height position, to an arbitrary position on the horizontal plane, and thereby positions each place on a support surface 364 of the PWB 350 held by the device 356, where an EC 94 is to be mounted, to a position right below the suction nozzle 90 of the EC mounting unit 30 being positioned at the EC-mount position. The support surface 364 is an upper surface of the PWB 350 and, in the present embodiment, a horizontal plane. The X-Y table 362 includes an X table 366 and a Y table 368. The X table 366 is moved in the X-axis direction by an X-table moving device 376 including a feed screw 370, a nut 372, and an X-table moving servomotor 374. The Y table 368 is provided on the X table 366 such that the Y table 368 is movable in the Y-axis direction, and is moved in the Y-axis direction perpendicular to the X-axis direction on the horizontal plane, by a Y-table moving device 380 including a feed screw 378, a nut, not shown, and a Y-table moving servomotor, not shown.

Figure 13:
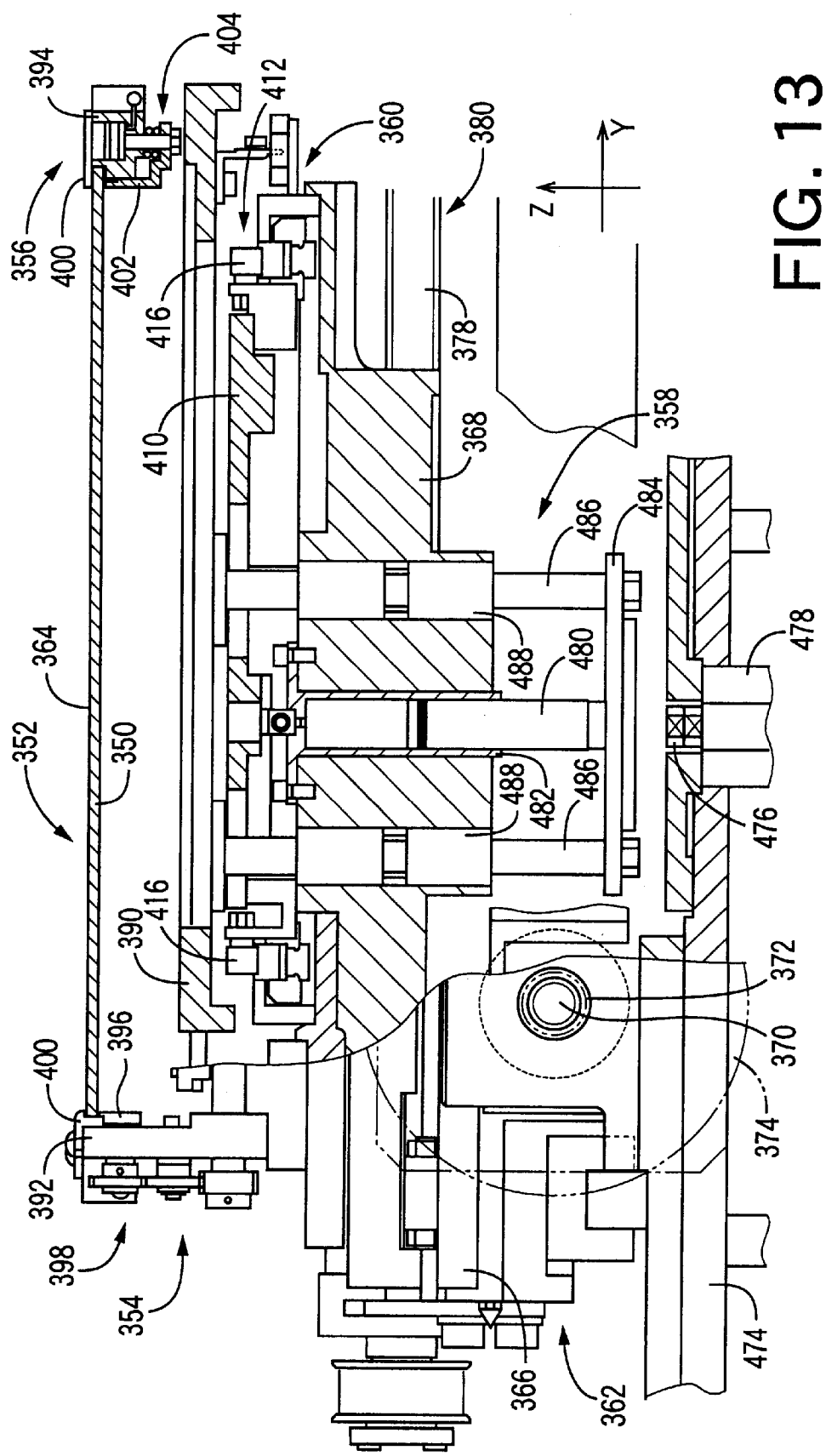
FIG. 13 is a partly cross-sectioned, enlarged front elevation view of the wiring-board supporting and moving device.

As shown in FIG. 13, the WB conveying device 354 includes a horizontal main frame 390 having a central opening, and a pair of side frames 392, 394 supported by the main frame 390. The main frame 390 is elevated and lowered by the WB-holding-device elevating and lowering device 358, and the height position of the frame 390 is adjusted, at the EC-mount height position, by the height-position adjusting device 360. Simultaneously, the side frames 392, 394 are elevated and lowered, and the height position of the frames 392, 394 is adjusted. The WB conveying device 354 additionally includes a pair of conveying belts 396 (only one belt 396 is shown in FIG. 13) which are supported by the side frames 392, 394, respectively, and extend parallel to each other; and a belt moving device 398 which moves the conveying belts 396. Thus, the WB conveying device 354 conveys the PWB 350 in the X-axis direction perpendicular to the sheet of FIG. 13. In a state in which the WB conveying device 354 is positioned at the WB-transfer height position by the WB-holding-device elevating and lowering device 358, the WB conveying device 354 conveys the PWB 350 on which the ECs 94 have been mounted, transfers the PWB 350 to a WB carry-out device, not shown, and receives, from a WB carry-in device, not shown, a PWB 350 on which ECs 94 are to be mounted, and conveys the PWB 350 to each of prescribed positions.

The WB holding device 356 includes two fixed clamp members 400 which are fixed to the two side frames 392, 394, respectively; two movable clamp members 402 (only one member 402 on the side of the side frame 394 is shown in FIG. 13) which cooperate with the fixed clamp members 400 to clamp respective end portions of the PWB 350; and a plurality of WB-hold members, not shown, which cooperate with each other to support a lower surface of the PWB 350. The movable clamp members 402 are moved toward, and away from, the fixed clamp members 400, by a drive device including air-operated cylinder devices each as an actuator. In the present embodiment, the fixed clamp members 400 and the movable clamp members 402 cooperate with each other to provide a WB-support member as a substrate-support member; and the WB holding device 356, the main frame 390, and the side frames 392, 394 cooperate with one another to provide a WB supporting device 404 as a substrate supporting device.

Figure 14:
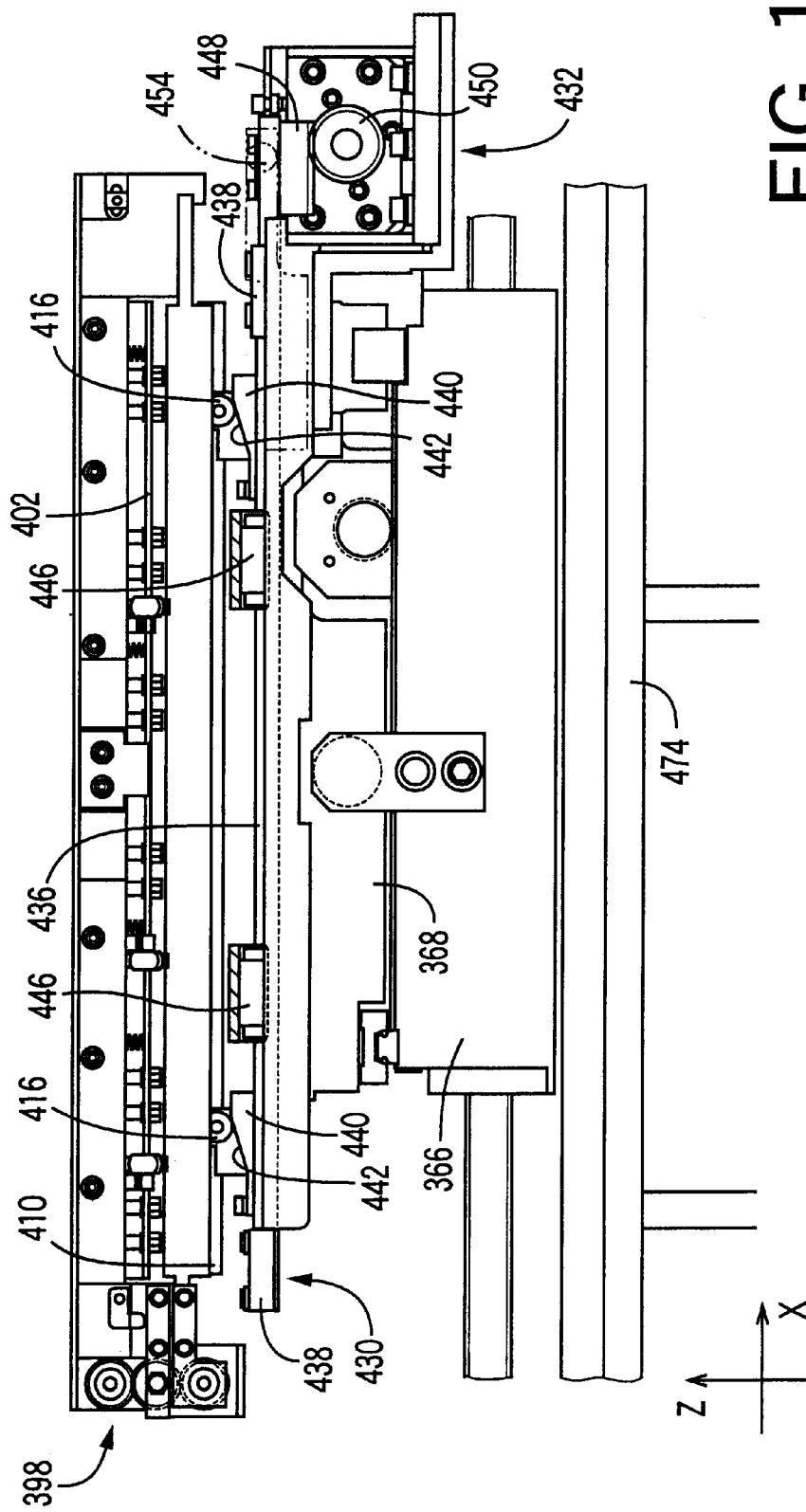
FIG. 14 is a side elevation view of a height-position adjusting device of the wiring-board supporting and moving device.
Figure 15:
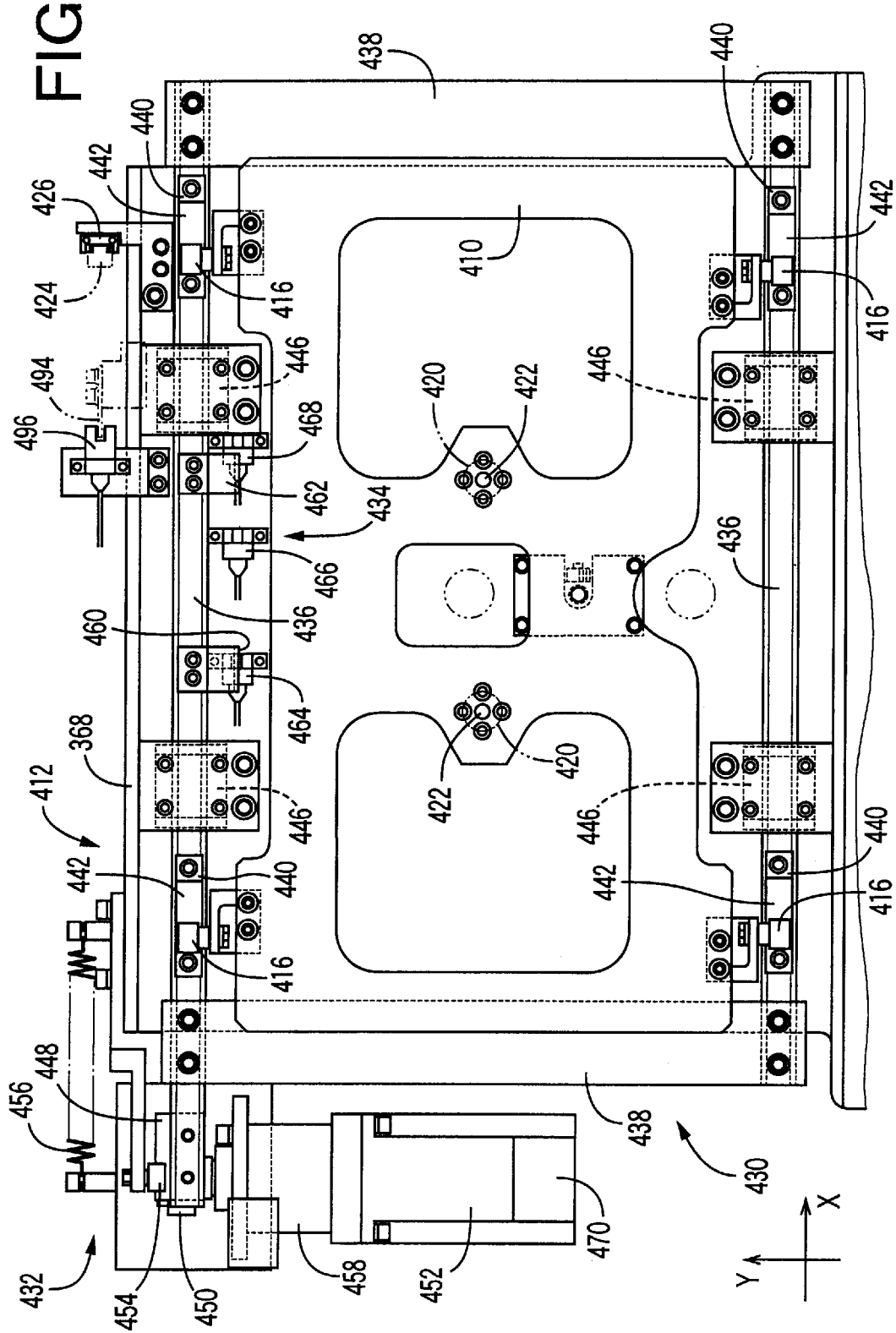
FIG. 15 is a plan view of the height-position adjusting device of the wiring-board supporting and moving device.

As shown in FIGS. 14 and 15, the height-position adjusting device 360 includes a Z table 410 which supports, at the EC-mount height position, a lower surface of the main frame 390; and a Z-table moving device 412 which moves the Z table 410 in the Z-axis direction. As is apparent from FIG. 15, the Z table 410 has, at four places on two side surfaces thereof, four rollers 416 such that each of the rollers 416 is rotatable relative to the table 410. When the four rollers 416 are moved in the Z-axis direction by the Z-table moving device 412, the Z table 410 is moved in the Z-axis direction. The Z table 410 has two positioning bushings 420 which are engaged with two positioning pins 422 fixed to the Y table 368, so that the Z table 410 and the Y table 368 are prevented from being moved relative to each other in each of the X-axis and Y-axis directions. The main frame 390 is provided with a horizontal-plane maintaining mechanism, not shown, and the main frame 390 is supported by the Z table 410 via the horizontal-plane maintaining mechanism, so that an upper surface of the main frame 390 and accordingly the upper surface of the PWB 350 can be maintained accurately horizontal. In addition, the main frame 390 is provided with a rail 424, and the Y table 368 is provided with a linear guide 426 (the rail 424 and the guide 426 are not shown in the other figures), so that the main frame 390 and the Y table 368 are smoothly moved relative to each other in the Z-axis direction while respective relative positions of the frame 390 and the table 368 in the X-axis and Y-axis directions are prevented from being deviated.

The Z-table moving device 412 includes a wedge-block frame 430; a wedge-block-frame moving device 432 which moves, on the Y table 368, the wedge-block frame 430 relative to the Y table 368 in the X-axis direction; and a relative-position detecting device 434 which detects a relative position of the wedge-block frame 430 and the Y table 368 in the X-axis direction.

The wedge-block frame 430 is a rectangular frame which is obtained by connecting two rails 436 to each other with two connecting members 438, such that the two rails 436 extend parallel to each other. Respective lengthwise directions of the two rails 436 are parallel to the X-axis direction. A wedge block 440 is provided at each of two places of each of the two rails 436 (i.e., four places in total). A normal vector which is normal to an inclined surface 442 of each of the four wedge blocks 440 does not have a Y-axis-direction component, but has a Z-axis-direction component and an X-axis-direction component. The four inclined surfaces 442 are engaged with the four rollers 416 of the Z table 410, respectively. The wedge-block frame 430 is moved, by the wedge-block-frame moving device 432 described later, on the Y table 368 in the X-axis direction. Therefore, the wedge blocks 440 are also moved in the X-axis direction. However, since the rollers 416 which are engaged with those wedge blocks 440 are inhibited from being moved in the X-axis or Y-axis direction (that is, the Z table 410 having those rollers 416 is inhibited from being moved in the X-axis or Y-axis direction), the rollers 416 are rolled up on the inclined surfaces 442, while being moved upward in the Z-axis direction only. That is, when the wedge-block frame 430 and the Y table 368 are moved relative to each other in the X-axis direction, the Z table 410 is moved relative to the Y table 368 in the Z-axis direction only.

The wedge-block-frame moving device 432 includes (1) four linear guides 446 which are fixed to the Y table 368 and hold the two rails 436 such that the rails 436 are movable relative to the linear guides 446 in the X-axis direction; (2) a rack 448 which is fixed to an end portion of one of the two rails 436; (3) a pinion 350 which is engaged with the rack 448; (4) a drive motor 452 which rotates the pinion 450; (5) a hold-down roller 454 which prevents the rack 448 and the pinion 450 from being moved away from each other in a direction perpendicular to the lengthwise direction of the rack 448 and the axial direction of the pinion 450; and (6) a spring 456 which eliminates the backlash of the rack 448 and the pinion 450 which are engaged with each other. Each of the two rails 436 is hung by two linear guides 446. Thus, each rail 436 is smoothly moved relative to the Y table 368. When the pinion 450 is rotated by the drive motor 452, the engagement of the rack 448 and the pinion 450 causes the wedge-block frame 430 to be moved relative to the Y table 368 in the X-axis direction. A reduction gear 458 is provided between the drive motor 452 and the pinion 450. One end of the spring 456 is engaged with the rack 448, and the other end of the spring 456 is engaged with the Y table 368, so that the spring 456 biases the rack 448 in a rightward direction as seen in FIG. 15. In the present embodiment, the drive motor 452 is provided by a servomotor, and a rotation angle of the motor 452 is detected by an encoder 470 as a rotation detecting device.

The relative-position detecting device 434 includes two relative-position-detect plates 460, 462 which are provided on the one rail 436 to which the rack 448 is fixed; and three photo interrupters 464, 466, 468 which are provided on the Y table 368. Since the photo interrupters 464, 466, 468 detect the relative-position-detect plates 460, 462, it is possible to define an origin of the position of the wedge-block frame 430 relative to the Y table 368 in the X-axis direction, a range of movement of the frame 430 relative to the Y table 368 in the X-axis direction, and a range of upward and downward movements (i.e., an upward-movement-end position and a downward-movement-end position) of the Z table 410 relative to the Y table 368.

Figure 12:
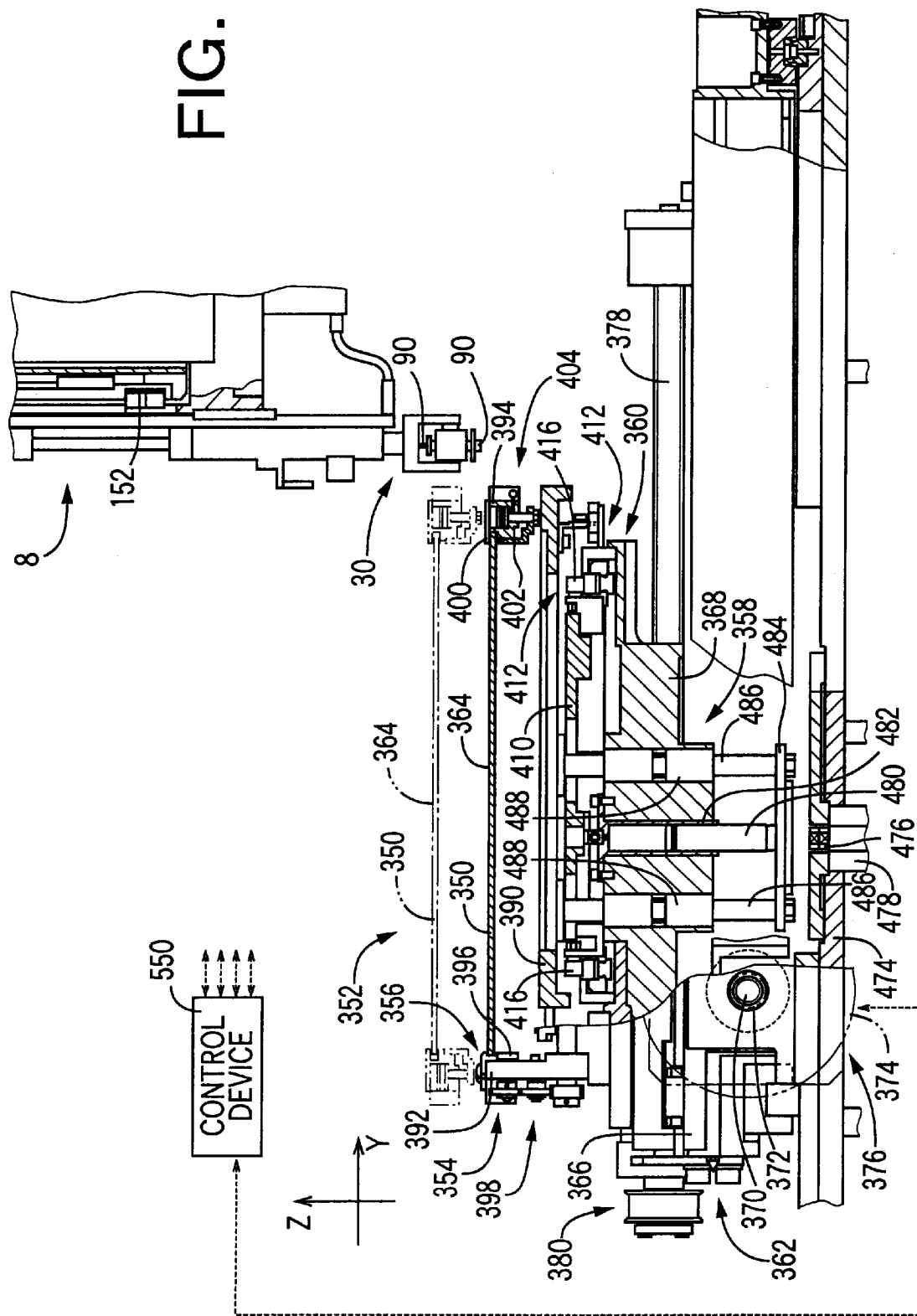
FIG. 12 is a partly cross-sectioned, front elevation view of a wiring-board supporting and moving device provided at an EC-mount position as one of the stop positions where each EC mounting unit is stopped.

As shown in FIG. 12, the WB-holding-device elevating and lowering device 358 includes (1) an air-operated cylinder device 478 which is provided on a base 474 and includes a piston rod 476; (2) an air-operated cylinder device 482 which is fixed to the Y table 368 and includes a plunger 480; (3) two guide shafts 486 whose upper ends are fixed to the main frame 390 and whose lower ends are connected to the plunger 480 via a connection member 484; (4) two guide bushings 488 which are fixed to the Y table and are fitted on the two guide shafts 486, respectively, such that the bushings 488 are movable relative to the shafts 486 in the axial direction thereof. The air cylinders 482, the guide shafts 486, and the guide bushings 488 extend in the Z-axis direction.

In a state in which the inner chamber of the air cylinder 482 is communicated with the atmosphere, the piston rod 476 of the air cylinder 478 is projected upward in the Z-axis direction. The piston rod 476 being projected upward butts on the connection member 484, thereby pushing up the connection member 484, the guide shafts 486, and the main frame 390. Thus, the PWB 350 is moved up to the WB-transfer height position indicated at two-dot-chain line in FIG. 12. On the other hand, when the inner chamber of the air cylinder 482 is supplied with a pressurized air and the inner chamber of the air cylinder 478 is communicated with the atmosphere, the plunger 480, the guide shafts 486, and the main frame 390 are moved downward, so that the main frame 390 is supported on the Z table 410 and the PWB 350 is moved down to the EC-mount height position indicated at solid line in FIG. 12. In this state, the inner chamber of the air cylinder 482 is constantly supplied with the pressurized air, so that the main frame 390 is pressed against the Z table 410 and the four rollers 416 provided on the Z table 410 are pressed against the four inclined surfaces 442, respectively. Whether the PWB 350 has been moved to the EC-mount height position can be judged by judging whether the relative-movement-detect plate 494 provided on the main frame 390 has been detected by the photo interrupter 496 provided on the Y table 368 (FIG. 15).

Figure 16:
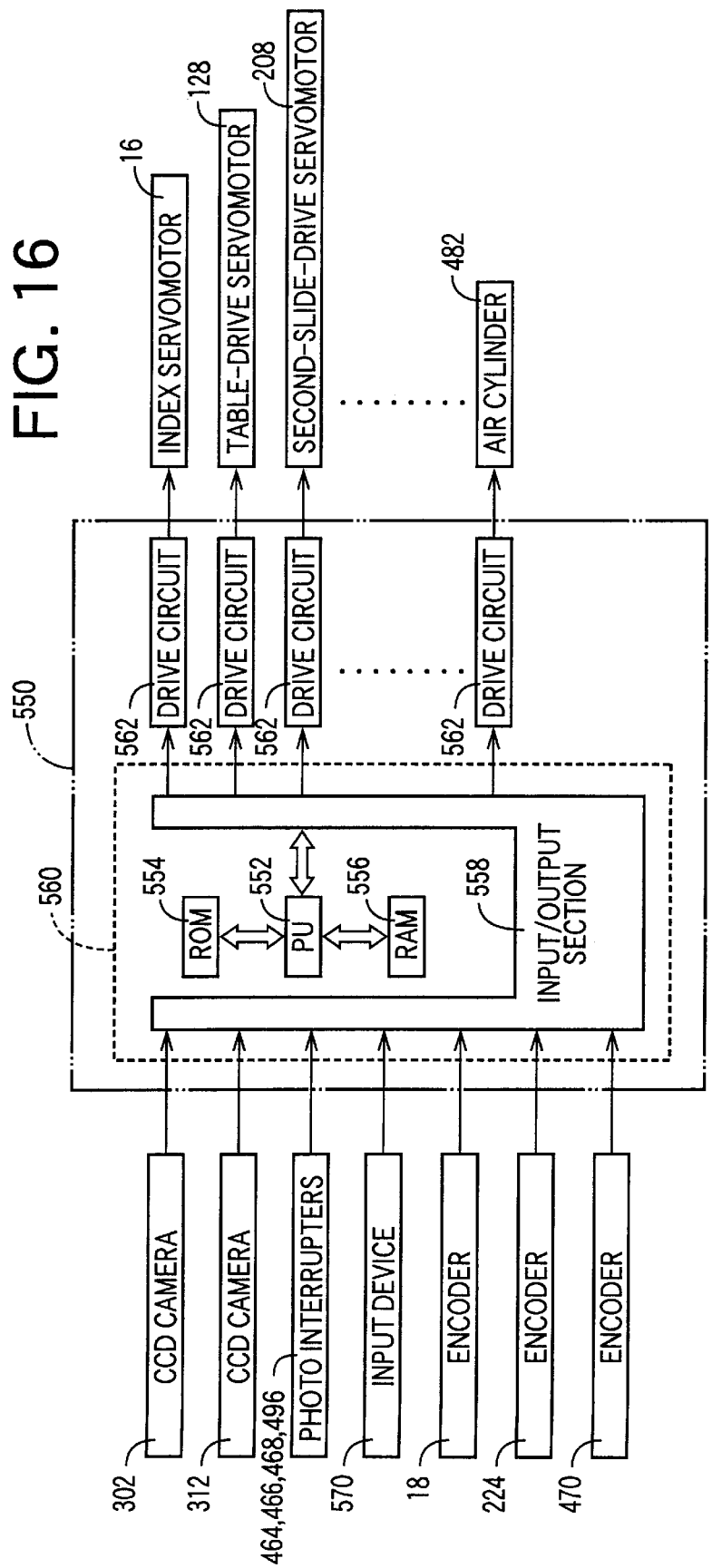
FIG. 16 is a diagrammatic view of a control device which controls an EC mounting system including the EC mounting apparatus.

The present EC mounting system is controlled by a control device 550 shown in FIG. 16. The control device 550 is essentially provided by a computer 560 including a PU (processing unit) 552, a ROM (read only memory) 554, a RAM (random access memory) 556, and an input/output section 558. In addition to the CCD camera 302, etc., an input device 570 is connected to the input/output section 558. The input device 570 includes character keys, numeral keys, and special-operation keys, and is operated by an operator to input, e.g., data, needed to carry out an EC mounting operation. Various actuators such as the index servomotor 16 are also connected to the input/output section 558 via respective drive circuits 562. The drive circuits 562 and the computer 560 cooperate with each other to provide the control device 550. The servomotors employed in the present EC mounting system, such as the index servomotor 16, are electric motors which are accurately controllable with respect to rotation angle and each of which provides a drive source. The rotation angle of each servomotor is detected by an encoder. FIG. 16 particularly shows the encoders 18, 224, 470 which are provided for the index servomotor 16, the second-slide-drive servomotor 208, and the drive motor 452, respectively. The RAM 556 provides a memory which stores the data needed to hold and mount the ECs 94, and the data obtained by detections and calculations.

Next, there will be described the operation of the EC mounting system constructed as described above.

In the EC mounting system, the sixteen EC mounting units 30 are sequentially moved to the sixteen stop positions as the index table 20 is intermittently moved, so that at the EC-receive position, each unit 30 receives an EC 94 and, at the EC-mount position, each unit 30 mounts the EC 94 on the PWB 350. When the EC mounting unit 30 is moved to the EC-receive position, the rollers 48 attached to the guide rail 46 transfer from the cam groove of the cylindrical cam 40 to the engaging groove 152 of the elevator member 148 of the EC-mounting-unit elevating and lowering device 118. Before the rollers 48 has completely transferred to the engaging groove 152, the downward movement of the elevator member 148 is started, so that the EC mounting unit 30 is moved downward.

The elevating and lowering device 118 first smoothly accelerates the downward movement of the EC mounting unit 30, subsequently moves the unit 30 at a prescribed, constant speed, and smoothly decelerates the unit 30 in a terminal period of the downward movement, so that the suction nozzle 90 contacts the EC 94. In the present embodiment, the target downward-movement-end position of each suction nozzle 90 being positioned at the operative position to suck and hold an EC 94, is prescribed at a position where the nozzle 90 just contacts the upper surface of the EC 94 as the sucked surface 96 thereof when the nozzle holder 74 is moved downward to, and stopped at, its downward-movement-end position. That is, the target downward-movement-end position of the suction nozzle 90 is so prescribed that the nozzle 90 may contact the EC 94, without compressing the spring 100 or pressing the EC 94, and with its downward-movement deceleration being equal to zero. In the present embodiment, the target downward-movement-end position of the suction nozzle 90, or the stroke of upward and downward movements of the nozzle 90 is changed based on an error of an axial-direction position of the sucking end surface 92 of the nozzle 90 (e.g., an amount of wearing of the end surface 92 in the present embodiment) and an error of a thickness of the EC 94. This will be described later.

After the suction nozzle 90 contacts the sucked surface 96 of the EC 94, and holds the EC 94 by applying the negative pressure thereto, the nozzle 90 is moved upward, and then is moved to, and stopped at, the next stop position. During this movement, the suction nozzle 90 holds and conveys the EC 94 in a state in which the nozzle 90 is held at its advancement-end position by the spring 100. Meanwhile, at the EC-posture-detect position, the image taking device 300 takes an image of the EC 94 held by the nozzle 90. A batch of image data representing the taken image is compared with a batch of correct image data representing a correct image having no errors, and respective positional errors, $\Delta X_E$, $\Delta Y_E$, of a center of the EC 94 in the X-axis and Y-axis directions on the horizontal plane, and a rotation-position error, $\Delta\theta$, of the EC 94 about its center are determined by the computer 560. In addition, whether the nozzle 90 is holding an EC 94 is judged by the computer 560. If a negative judgment is made, a set of data indicating the fact is produced and stored, so that the set of data may be used to control the EC mounting units 30. Moreover, dimensions of a transverse cross section of the EC 94 held by the nozzle 90, i.e., a cross section taken along a plane perpendicular to the axis line of the EC 94, e.g., respective lengths of two sides of the cross section that intersect each other are determined.

Next, at the mounted-surface-detect position, the image-taking device 310 takes an image of the lower end portion of the suction nozzle 90 and the EC 94 held by the nozzle 90, as viewed in a direction perpendicular to the axial direction of the nozzle 90. Based on a batch of image data representing the taken image, a position of the mounted surface 98 of the EC 94 in the axial direction of the nozzle 90 and a position of the sucking end surface 92 of the nozzle 90 in the same direction are determined by the computer 560; and based on the thus determined positions, a thickness of the EC 94 is determined by the same 560.

Based on the thickness of the EC 94, and the dimensions of the transverse cross section of the EC 94 determined based on the image taken at the EC-posture-detect position, whether the EC 94 actually held by the suction nozzle 90 is a correct sort of EC 94 that should be held by the nozzle 90 is judged by the computer 560. In addition, based on the batch of image data, whether the EC 94 held by the nozzle 90 is taking a posture which allows the EC 94 to be mounted on the PWB 350, for example, whether the EC 94 held by the nozzle 90 is taking a lying-on-its-side posture is judged by the computer 560; and whether the EC 94 held by the nozzle 90 is taking respective positions in the X-axis and Y-axis directions perpendicular to the axial direction of the nozzle 90 that allow the EC 94 to be mounted on the PWB 350, that is, whether the EC 94 held by the nozzle 94 is so largely deviated out of position that the EC 94 cannot be mounted on the PWB 350 is judged by the computer 360. If the nozzle 90 is not holding the correct sort of EC 94, if the nozzle 90 is holding the EC 94 taking the lying-on-its-side posture, or if at least one of the respective errors of the respective positions of the EC 94 in the directions perpendicular to the axial direction of the nozzle 90 is greater than a reference amount, then a set of data indicating the fact is produced and stored, so that the mounting unit 30 or the nozzle 90 may not carry out an EC mounting action at the EC-mount position and may discard the EC 94 taking the incorrect posture, at the EC-discard position.

On the other hand, if the suction nozzle 90 is holding the correct sort of EC 94 taking the correct posture that can be mounted on the PWB 350, then the axial-direction position of the mounted surface 98 of the EC 94 is compared with a correct position, and an error of the axial-direction position of the mounted surface 98 is determined by the computer 560. Since an image of the suction nozzle 90 being positioned at the operative position and the EC 94 held by the nozzle 90 is taken in the state in which the EC mounting unit 30 is stopped at the mounted-surface-detect position and the nozzle 90 is held at its advancement-end position by the biasing force of the spring 100, the axial-direction position of the nozzle 90 is known in advance. The axial-direction position of the nozzle 90 is defined by a position of a portion thereof whose position relative to the nozzle holder 74 in the axial direction is not changed by the manufacturing errors of the nozzle 90 and/or the wearing of the sucking end surface 92, for example, a portion of the nozzle 90 that is held by the nozzle holder 74. Although the nozzle 90 is held by the rotary holder 86 as part of the nozzle holder 74 such that the nozzle 90 is movable relative to the rotary holder 86 in the axial direction of the nozzle 90, the axial-direction position of the nozzle 90 is discussed here with respect to the state in which the nozzle 90 is taking a prescribed position relative to the rotary holder 86 and, in the present embodiment, with respect to the state in which the nozzle 90 is held at its advancement-end position. Thus, the axial-direction position of the nozzle 90 is known, and the correct position of the sucking end surface 92 (on the assumption that the nozzle 90 has no manufacturing errors and the sucking end surface 92 has no wearing) and the correct position of the mounted surface 98 (on the assumption that the EC 94 has no dimensional errors) are known. That is, respective positions where respective images of the sucking end surface 92 and the mounted surface 98 taking the respective correct positions are formed on the image-take surface of the CCD camera 312 are known, and there is a set of correct position data which is compared with a set of actual position data representing respective actual positions of the sucking end surface 92 and the mounted surface 98 that are determined based on the actually taken image of the sucking end surface 92 and the mounted surface 98. In the present embodiment, all the sorts of suction nozzles 90 have the same length, and accordingly the respective correct positions of the sucking end surfaces 92 of the different sorts of nozzles 90 are equal to each other and are stored in the RAM 556 of the computer 560. The correct position of the mounted surface 98 is determined in advance based on the correct position of the sucking end surface 92 and the correct thickness of the EC 94, and is stored in association with the particular sort of EC 94 in the RAM 556. Therefore, based on the actual axial-direction position of the mounted surface 98 determined based on the image data, and the correct axial-direction position of the same 98, an error of the axial-direction position of the mounted surface 98 of the EC 94 is determined, and is stored, in the RAM 556, with a set of data identifying the nozzle 90 holding the EC 94, so that the thus determined positional error of the mounted surface 98 of the EC 94 can be associated with the nozzle 90 holding the EC 94. This positional error consists of a magnitude and a direction.

In addition, based on the axial-direction position of the sucking end surface 92 of the suction nozzle 90, an amount of wearing or bending of the nozzle 90 is detected. More specifically described, the actual position of the sucking end surface 92 is compared with the correct position of the same 92, and the thus determined difference of the tow positions is compared with a prescribed value. If the difference is not smaller than the prescribed value, it is judged that the nozzle 90 is so worn that the nozzle 90 should be replaced with a new one. Even if the difference, i.e., the amount of wearing is smaller than the prescribed value, the difference is stored, in the RAM 556, in association with a set of data identifying the nozzle 90. In addition, whether the lower end of the nozzle 90 is deviated not less than a prescribed amount from its axis line, in a direction perpendicular to the axis line, is judged and, if a positive judgment is made, it is judged that the nozzle 90 is so bent that the nozzle 90 should be replaced with a new one. If the nozzle 90 is so worn or bent and needs to be replaced with a new one, a set of data indicating that the nozzle 90 be replaced with a new one is prepared and stored by the computer 560.

In the present embodiment, the detection of wearing or bending of each suction nozzle 90 is carried out, not each time the each nozzle 90 is moved to the mounted-surface-detect position to take an image, but each time the total number of ECs 94 mounted on the PWB or PWBs 350 by the each nozzle 90 reaches a prescribed number. In the present embodiment, each of the EC mounting units 30 employed in the EC mounting apparatus 8 holds the plurality of suction nozzles 90 including at least two different sorts of nozzles 90, and selectively positions an appropriate one of the nozzles 90 at the operative position. Those different sorts of nozzles 90 may be used at different frequencies, or may have different degrees of durability. Therefore, the above-indicated number is so prescribed for each sort of nozzles 90 that wearing or bending of the each nozzle 90 can be detected without delay. For example, since a suction pipe 91 having a small diameter is more easily worn than a suction pipe 91 having a large diameter, a smaller number is prescribed for a suction nozzle 90 having a small diameter, than a number prescribed for a suction nozzle 90 having a large diameter. The computer 560 counts, for each of the nozzles 90 of each of the units 30, the total number of ECs 94 which have been mounted by the each nozzle 90 and, if the counted number reaches the prescribed number associated with the each nozzle 90, judges whether the each nozzle 90 has an excessive wearing or bending. Since the number of ECs 94 mounted on the PWB 350 by each nozzle 90 is equal to the number of ECs 94 held by the each nozzle 90, in fact, the computer 560 counts the number of ECs 94 held by each nozzle 90, as the number of ECs 94 mounted by the each nozzle 90. When the computer 560 judges that the number of ECs 94 held by each nozzle 90 has reaches the prescribed number, the each nozzle 90 is being positioned at the operative position, so that based on an image of the each nozzle 90 taken at the mounted-surface-detect position, it is judged whether the each nozzle 90 has an excessive wearing or bending. A set of data representing the result of judgment is stored, in the RAM 556 of the computer 560, in association with the set of data identifying the each nozzle 90. In the present embodiment, each time each suction nozzle 90 holds an EC 94, an axial-direction position of the sucking end surface 92 of the each nozzle 90 is determined to determine a thickness of the EC 94. However, an axial-direction position of the sucking end surface 92 of each nozzle 90 is determined to judge whether the sucking end surface 92 of the each nozzle 90 has an excessive wearing or bending, each time the each nozzle 90 has mounted the prescribed number of ECs 94. The image of the sucking end surface 92 and the mounted surface 98 is automatically taken, at one of the plurality of stop positions where each EC mounting unit 30 is stopped, at a timing when the image taking operation does not adversely influences the production of the printed circuit board.

After the image taking operation, each EC mounting unit 30 is moved to the EC-posture-correct position, where the nozzle holder 74 is rotated about its own axis line by the EC-posture correct device to correct the rotation-position error $\Delta\theta$ of the EC 94, to zero.

After the above-described correction, the EC mounting unit 30 is moved to the EC-mount position, where the unit 30 is lowered, by the EC-mounting-unit elevating and lowering device 120, to mount the EC 94 on the PWB 350. Before the transferring of the rollers 48 attached to the guide rail 46 from the cam groove of the cylindrical cam 40 to the engaging groove 152 of the elevator member 148 of the elevating and lowering device 120 is completed, the downward movement of the elevator member 148 is started, so that the downward movement of the unit 30 is started. The stroke of upward and downward movements of the suction nozzle 90, i.e., the target downward-movement-end position of the nozzle 90 is determined in advance. The nozzle 90 first is smoothly accelerated, subsequently is moved at a constant speed, and then is smoothly decelerated. The deceleration is started at a position corresponding to the predetermined stroke.

When the EC 94 is mounted on the PWB 350, the PWB 350 is moved along the horizontal plane by the X-Y table 362, so that each EC-mount place on the PWB 350 is positioned at a position right below the suction nozzle 90 which belongs to the EC mounting unit 30 being positioned at the EC-mount position and which is being positioned at the operative position. To this end, respective movement amounts of the X table 366 and the Y table 368 are modified to correct the above-explained center-position errors $\Delta X_E$, $\Delta Y_E$ of the EC 94, respective errors of the X-axis-direction and Y-axis-direction positions of the center of the EC 94 caused by the above-explained correction of the rotation-position error $\Delta\theta$ of the EC 94, and respective errors, $\Delta X_p$, $\Delta Y_p$, of X-axis-direction and Y-axis-direction positions of each EC-mount place on the PWB 350.

Figure 17:
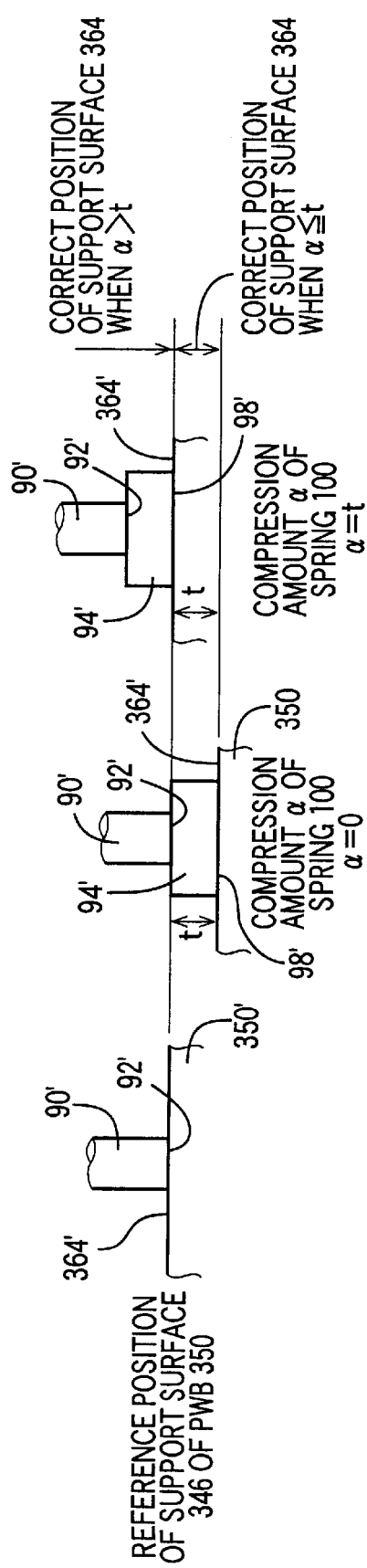
FIG. 17 is a view for explaining a manner in which a height position of a support surface of a printed wiring board is adjusted when an EC is mounted on the wiring board which is supported by a wiring-board supporting device of the wiring-board supporting and moving device.

In addition, the PWB 350 is elevated or lowered by the height-position adjusting device 360, according to the determined position of the mounted surface 98 of the EC 94, so that a height position of the support surface 364 of the PWB 350, i.e., a position of the surface 364 in the directions in which the surface 364 is moved toward, and away from, the suction nozzle 90, is adjusted. In the present embodiment, the adjustment of the height position of the support surface 364 is done by determining a reference position of the surface 364 and determining a target position of the surface 364 relative to the determined reference position. The target position of the support surface 364 is so determined that the EC 94 held by the nozzle 90 may be mounted on the support surface 364 without any axial-direction-positional error. Thus, the target position is a correct position. As illustrated in FIG. 17, in the present embodiment, a standard suction nozzle 90' having no manufacturing errors or no sucking end surface wearing is correctly held by the nozzle holder 74 and is moved downward to a downward-movement-end position and, in this state, a standard PWB 350' is caused to contact a sucking end surface 92' of the nozzle 90'. The standard PWB 350' has no manufacturing errors, and is correctly held by the holding device 356. The standard PWB 350' being positioned at the EC-mount height position is elevated by the height-position adjusting device 360, to a position where a support surface 364' of the PWB 350' contacts the sucking end surface 92' of the standard nozzle 90', without moving the nozzle 90' into the rotary holder 86 against the biasing force of the spring 100', and this position is determined as the reference position of the support surface 364. The downward-movement-end position of the standard suction nozzle 90' is a prescribed position to which the nozzle 90' should be moved downward unless the EC contacts the PWB and accordingly the downward movement is interrupted. Whether the standard PWB 350' has contacted the sucking end surface 92' is judged by an operator who uses an inspecting jig such as a clearance gauge. Alternatively, this may be done by operator's eyes which can narrowly see a light passing through a very small clearance left between the support surface 364' and the sucking surface 92'. A current driving amount of the drive motor 452 of the height-position adjusting device 360 (i.e., a current rotation angle of the motor 452 from an origin) in the state in which the support surface 364' is positioned at the reference position, is detected by the encoder 470, and is stored as a reference driving amount. The reference position of the support surface 364 may be determined using the standard suction nozzle 90' in place of a representative one of the plurality of suction nozzles 90 of the plurality of EC mounting units 30, alternatively may be determined as an average of respective reference positions which are determined, for each of the plurality of units 30, using the standard nozzle 90' in place of a representative one of the plurality of nozzles 90 of the each unit 30, or otherwise may be determined as an average of respective reference positions which are determined using the standard suction nozzle 90' in place of each of all the nozzles 90 employed in the EC mounting apparatus 8.

Then, the reference position of the support surface 364, the thickness, t, of the EC 94, and a compression amount, α, of the spring 100 are used to determine a driving amount of the drive motor 452 that is needed to position the support surface 364 of the PWB 350 at the correct position. The thus determined driving amount is stored in the RAM 556 of the computer 560. More specifically described, in a state in which the standard suction nozzle 90' holding a standard EC 94' is moved downward to, and positioned at, its downward-movement-end position, the position of the mounted surface 98' of the standard EC 94' is lower than its reference position by the thickness t of the standard EC 94', and similarly the position of the support surface 364' of the standard PWB 350' is also lower than its reference position by the thickness t of the standard EC 94'. The standard EC 94' is a correct EC having no manufacturing errors. In this state, the compression amount a of the spring 100 biasing the standard suction nozzle 90' is zero. Here, the compression amount a of the spring 100 is defined as being zero in a state in which the limit of advancement of the suction nozzle 90 caused by the biasing action of the spring 100 is defined by the previously-described advancement-limit defining device, and is measured as an amount of retraction of the nozzle 90 from the above-indicated state into the rotary holder 86. The compression amount a increases as the position of the support surface 364' changes upward from a position of the surface 364' when the amount a is zero. If the amount a is not greater than the thickness t of the EC 94, then the position of the surface 364' is not higher than the reference position; and if the amount a is greater than the thickness t of the EC 94, then the position of the surface 364' is higher than the reference position.

Therefore, the position of the support surface 364 is determined according to a pressing force with which the suction nozzle 90 needs to press the EC 94 against the surface 364. This pressing force which increases as the compression amount a of the spring 100 increases, is determined according to the sort of EC 94 or the sort of creamed solder with which the EC 94 is adhered to the surface 364. The pressing force is increased as the area through which the EC 94 and the creamed solder contact each other increases, or as the softness of the creamed solder decreases. Therefore, if the compression amount a of the spring 100 needed to produce the pressing force needed to mount the EC 94 is not greater than the thickness t of the EC 94, the correct position of the support surface 364 is lower than the reference position by (t−α); and if the same compression amount a is greater than the thickness t of the EC 94, the correct position of the surface 364 is higher than the reference position by (α−t). The correct position of the support surface 364 is the position where the EC 94 the mounted surface 88 of which is taking its correct position is mounted, and which is defined by the driving amount of the drive motor 452. The driving amount of the drive motor 452 that causes the support surface 364 to be positioned at its correct position is determined, for each sort of EC 94, based on a reference driving amount of the drive motor 452, the thickness t of the EC 94, and the compression amount a of the spring 100, and is stored in the RAM 556 of the computer 560.

Figure 18A:
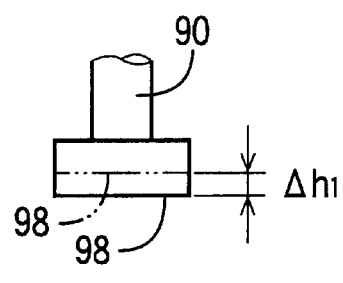
FIGS. 18A, 18B, 18C, and 18D are views for explaining a relationship between an axial-direction-positional error of the mounted surface of the EC held by each suction nozzle, and the adjustment of the height position of the support surface of the printed wiring board.
Figure 18C:
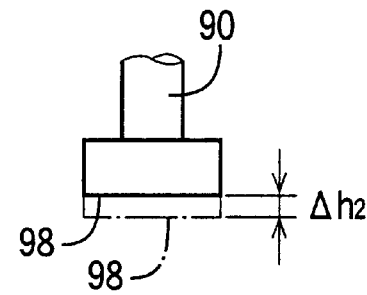
Figure 18B:
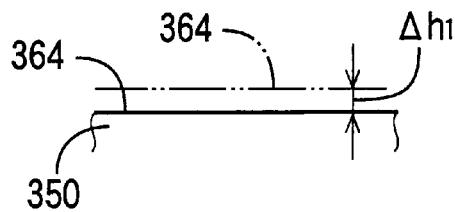
Figure 18D:
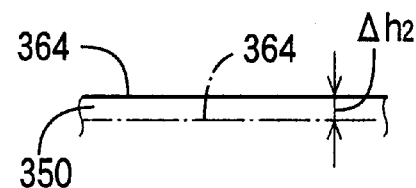

Then, if the axial-direction positional error of the mounted surface 98 determined based on the taken image indicates, as shown at two-dot-chain line in FIG. 18A, that the actual mounted surface 98 of the EC 94 is deviated upward from its correct position by an amount, Δh1, the position of the support surface 364 is modified, as shown in FIG. 18B, by being moved upward from its correct position by the amount Δh1. On the other hand, if the axial-direction positional error of the mounted surface indicates, as shown at one-dot-chain line in FIG. 18C, that the actual mounted surface 98 of the EC 94 is deviated downward from its correct position by an amount, Δh2, the position of the support surface 364 is modified, as shown in FIG. 18D, by being moved downward from its correct position by the amount Δh2. Thus, the driving amount of the drive motor 452 that causes the support surface 364 to be moved to its correct position is modified based on the magnitude and direction of the axial-direction positional error Δh1, Δh2, so that the support surface 364 is moved by the height-position adjusting device 360 to a position where the EC 94 is pressed against the surface 364 with the prescribed pressing force.

In the present embodiment, the support surface 364 is moved to the correct position as modified as described above, before the suction nozzle 90 is moved downward by a distance which causes the EC 94 to contact the surface 364 without compressing the spring 100. After the EC 94 contacts the support surface 364, the nozzle holder 74 is further moved downward, so that the suction nozzle 90 is moved back into the rotary holder 86 while compressing the spring 100. The axial-direction positional error of the mounted surface 98 includes all possible errors that cause the position of the surface 98 to be deviated from its correct position; such as the manufacturing errors of the nozzle 90, the positional errors of the EC 94 held by the nozzle 90, the wearing of the sucking end surface 92, and the dimensional errors of the EC 94. Since the position of the mounted surface 98 is obtained and the height position of the support surface 364 is modified, the EC 94 is contacted, in spite of the manufacturing errors of the nozzle 90, etc., with the support surface 364 at a position having only a small error from a correct position. That is, the EC 94 is contacted with the support surface 364, with a small impact only, after having been sufficiently decelerated. In addition, in the state in which the nozzle holder 74 has reached its downward-movement-end position, the EC 94 is pressed against the support surface 364 with a pressing force substantially equal to the prescribed pressing force. Moreover, the variation of respective amounts of pushing of ECs 94 into the creamed-solder spots applied to the support surface 364 is sufficiently small, and accordingly the ECs 94 are accurately mounted at the respective EC-mount places on the PWB 350.

When the EC mounting unit 30 mounts the EC 94 on the PWB 350, the switch valve 110 is switched to its positive-pressure-supply position during the downward movement of the unit 30, so that the suction nozzle 90 releases the EC 94. After the EC 94 is mounted, the unit 30 is moved to the next stop position by the rotation of the index table 20.

If the suction nozzle 90 is holding an EC 94 taking the lying-on-its-side posture, or an incorrect sort of EC 94, then the EC 94 is not mounted on the PWB 350. To this end, when the suction nozzle 90 holding the EC 94 is moved to the EC-mount position, the EC-mounting-unit elevating and lowering device 120 does not lower or elevate the EC mounting unit 30, by causing the roller 168 not to follow the cam 174. Thus, the unit 30 does not carry out an EC mounting action, and the switch valve 110 is kept at the negative-pressure-supply position, so that the nozzle 90 continues holding the EC 94. When the nozzle 90 is not holding an EC 94, too, the unit 30 does not carry out an EC mounting action.

When the EC mounting unit 30 which is holding the EC 94 that should be discarded, or which has failed to hold an EC 94, is moved to the EC-discard position, the switch valve 110 is switched to its positive-pressure-supply position by a switching device, not shown, so that the EC 94 is released and discarded into a collecting box, not shown.

Based on the taken image, the axial-direction position of the sucking end surface 92 of the suction nozzle 90 is determined, and accordingly the amount of wearing of the end surface 92 is determined. When the nozzle 90 sucks and holds another EC 94 at the EC-receive position after the determination of the wearing amount, the computer 560 increases the stroke of upward and downward movements of the nozzle 90 by an amount corresponding to the wearing amount, and thereby changes the current target downward-movement-end position of the nozzle 90 to a new one lower than the current one. More specifically described, the second slide 202 is moved, and accordingly the distance between the position where the connecting rod 156 is connected to the lever 160, and the axis line about which the lever 160 is pivoted is increased. This also applies to the case where the actual thickness of the EC 94 determined based on the respective axial-direction positions of the sucking end surface 92 and the mounted surface 98 is smaller than a nominal thickness of the same 94. In the case where the actual thickness of the EC 94 is greater than the nominal thickness, the stroke of the nozzle 90 may be decreased and accordingly the current target downward-movement-end position of the nozzle 90 may be changed to a new one higher than the current one.

When the current target downward-movement-end position of the suction nozzle 90 is changed, the current driving amount of the second-slide-drive servomotor 208 to move the second slide 202 is changed. In the present embodiment, this driving amount is determined based on the wearing amount of the sucking end surface 92, the thickness of the EC 94, and the reference driving amount of the servomotor 204. The reference driving amount is determined by causing the standard suction nozzle 90' held by the nozzle holder 74 to contact a reference surface which is defined by the EC supplying device 122. As shown in FIG. 20, a standard feeder 600 is, like the feeders 123, positioned relative, and attached, to the table 125. The standard feeder 600 is so accurately manufactured that when the feeder 600 is attached to the upper surface of the table 125, a height position of the upper surface of the feeder 600 is equal to a reference height position and accordingly the upper surface defines the reference surface. The reference height position is defined as a height position of an upper surface of each of ECs 94 which have no dimensional errors and are correctly carried by a carrier tape 130 which has no dimensional errors and is correctly held by a feeder 123 which has no dimensional errors and is correctly attached to the table 125. In the present embodiment, the target downward-movement-end position of the suction nozzle 90 is defined, as described previously, as a position to and at which the nozzle 90 is lowered and stopped and where the nozzle 90 just contacts the EC 94 without applying a pressing force thereto and sucks and holds the same 94.

Then, in the state in which the respective positions of the elevator member 148, and the guide 182 guiding the movement of the first slide 190, have been adjusted as previously described, the second slide 202 is moved to a position corresponding to the minimum stroke of the suction nozzle 90 (i.e., a position corresponding to the highest target downward-movement-end position of the nozzle 90), and the rotary cam 174 is rotated to a position corresponding to the downward-movement-end position of the nozzle holder 74. Then, an operator accurately attaches a standard suction nozzle 90' to the nozzle holder 74. In the state in which the stroke of the standard nozzle 90' takes the minimum value, the sucking end surface 92' of the standard nozzle 90' does not contact the upper surface of the standard feeder 600, even if the nozzle holder 74 is lowered to its downward-movement-end position and accordingly the standard nozzle 90' is lowered to its target downward-movement-end position. Hence, from this state, the second slide 202 is moved in a direction to increase the stroke of the standard nozzle 90', till the standard nozzle 90' contacts the upper surface of the standard feeder 600 in the state in which the standard nozzle 90' is held at its advancement-end position. Whether the standard nozzle 90' has contacted the upper surface of the standard feeder 600 may be judged by an operator who uses an inspecting jig such as a clearance gauge. Alternatively, this may be done by operator's eyes which can narrowly see the light, emitted by the lighting device, that passes through a very small clearance left between the sucking end surface 92' and the upper surface of the standard feeder 600.

The driving amount of the second-slide-drive servomotor 208 needed to cause the sucking end surface 92' to contact the upper surface of the standard feeder 600 (i.e., the rotation angle of the motor 208 measured by the encoder 224 from the origin), is stored as the standard driving amount in the RAM 556 of the computer 560. The position of the standard nozzle 90' in the state in which the sucking end surface 92' thereof just contacts the upper surface of the standard feeder 600 will be referred to as a reference target downward-movement-end position; and the position of the second slide 202 in the same state will be referred to as a reference slide position. All the ECs 94 are fed in the form of the emboss-type carrier tapes 130, and accordingly the respective upper surfaces of the different sorts of ECs 94 take the same height position. Therefore, the reference target downwardmovement-end position of each suction nozzle 90 is common to all the sorts of ECs 94.

When each suction nozzle 90 sucks and holds an EC 94, the target downward-movement-end position of the nozzle 90 is changed based on the wearing amount of the sucking end surface 92 and the error of the thickness of the EC 94 of the same sort. The wearing amount of the sucking end surface 92 is read out, for each suction nozzle 90, from the RAM 556, and the error of the thickness of the EC 94 is determined by comparing the thickness of the EC 94 stored in the RAM 556 for the feeder 123 being positioned at the EC-supply position, with the nominal thickness of the EC 94 of the same sort. A relationship between the target downward-movement-end position of each nozzle 90 and the driving amount of the servomotor 208 is, in the present embodiment, approximated by a quadratic function, and the diving amount of the servomotor 208 is calculated based on the wearing amount of the sucking end surface 92, the error of the thickness of the EC 94, and the reference driving amount of the servomotor 208. In other words, the diving amount of the servomotor 208 is so calculated that the reference target downward-movement-end position is changed to a new target position which is deviated from the reference target position by an amount corresponding to the wearing amount of the sucking end surface 92 and the error of the thickness of the EC 94.

For example, in the case where there is only a certain amount of wearing of the sucking end surface 92 of each suction nozzle 90, the stroke of the nozzle 90 is increased by the wearing amount, and the driving amount of the servomotor 208 is so calculated that the reference target downward-movement-end position is changed to a new target position which is lower than the reference target position. The second slide 202 is moved by a distance corresponding to the thus determined driving amount of the servomotor 208. This also applied to the case where there is only an error of the actual thickness of the EC 94 and the actual thickness of the EC 94 is smaller than the nominal thickness of the EC 94 of the same sort. On the other hand, in the case where the actual thickness of the EC 94 is greater than the nominal thickness, the stroke of the nozzle 90 is decreased by the error of the thickness of the EC 94, and the second slide 202 is so moved that the reference target downward-movement-end position is changed to a new target position which is higher than the reference target position. In the case where the target downward-movement-end position is changed based on both the wearing amount of the sucking end surface 92 and the thickness error of the EC 94, the magnitude, and direction, of changing of the target position are determined based on the respective magnitudes, and respective directions, of the wearing amount and the thickness error, and the second slide 202 is moved to a position corresponding to the changed target position. As described previously, a wearing amount of the sucking end surface 92 of each suction nozzle 90 is detected each time the nozzle 90 has sucked and held a prescribed number of ECs 94. Therefore, the detected wearing amount is used to determine a target downward-movement-end position of the nozzle 90 for sucking and holding each of the prescribed number of ECs 94.

In many cases, if one of the ECs 94 of one EC carrier tape 130 has a thickness error, all the other ECs 94 also have the thickness error. Therefore, an average of respective thickness values of ECs 94 of each EC carrier tape 130 held by each feeder 123 can be regarded as an actual thickness value of each of the ECs 94, and accordingly an error of the average thickness value from a nominal thickness value can be regarded as a thickness error of the each EC 94. As described previously, the thickness of every EC 94 is determined based on the image taken at the mounted-surface-detect position. An average of the respective thickness values of the ECs 94 belonging to each EC carrier tape 130 is calculated each time each one of those ECs 94 is sucked and held by a suction nozzle 90, and is stored, in the RAM 556 of the computer 560, in association with a set of data identifying the feeder 123 which feeds the each carrier tape 130.

The above average may be obtained as an average of respective thickness values of a plurality of successive ECs 94 of each EC carrier tape 130 that are successively determined and stored in the RAM 556. Alternatively, the above average may be obtained using a digital filter. The digital filter outputs the average as a value obtained as the sum of the first product of a last obtained thickness and a first coefficient and the second product of a past thickness and a second coefficient. The thus obtained value will be used as a past thickness when another thickness is determined. The first and second coefficients are positive values the sum of which is equal to one. One of the two coefficients that is taken more important is made greater than the other coefficient. For each of a plurality of EC carrier tapes 130, an average of respective thickness values of ECs 94 of the each tape 130 is calculated and stored each time one of the ECs 94 is taken out from the each tape 130, so that when the next EC 94 is taken out from the each tape 130, the thus stored average thickness of the ECs 94 of the each tape 130 is compared with the nominal thickness to determine an error of the average thickness and change, based on the thus determined thickness error, the target downward-movement-end position of the suction nozzle 90 which is to take the next EC 94 from the each tape 130.

Figure 19:
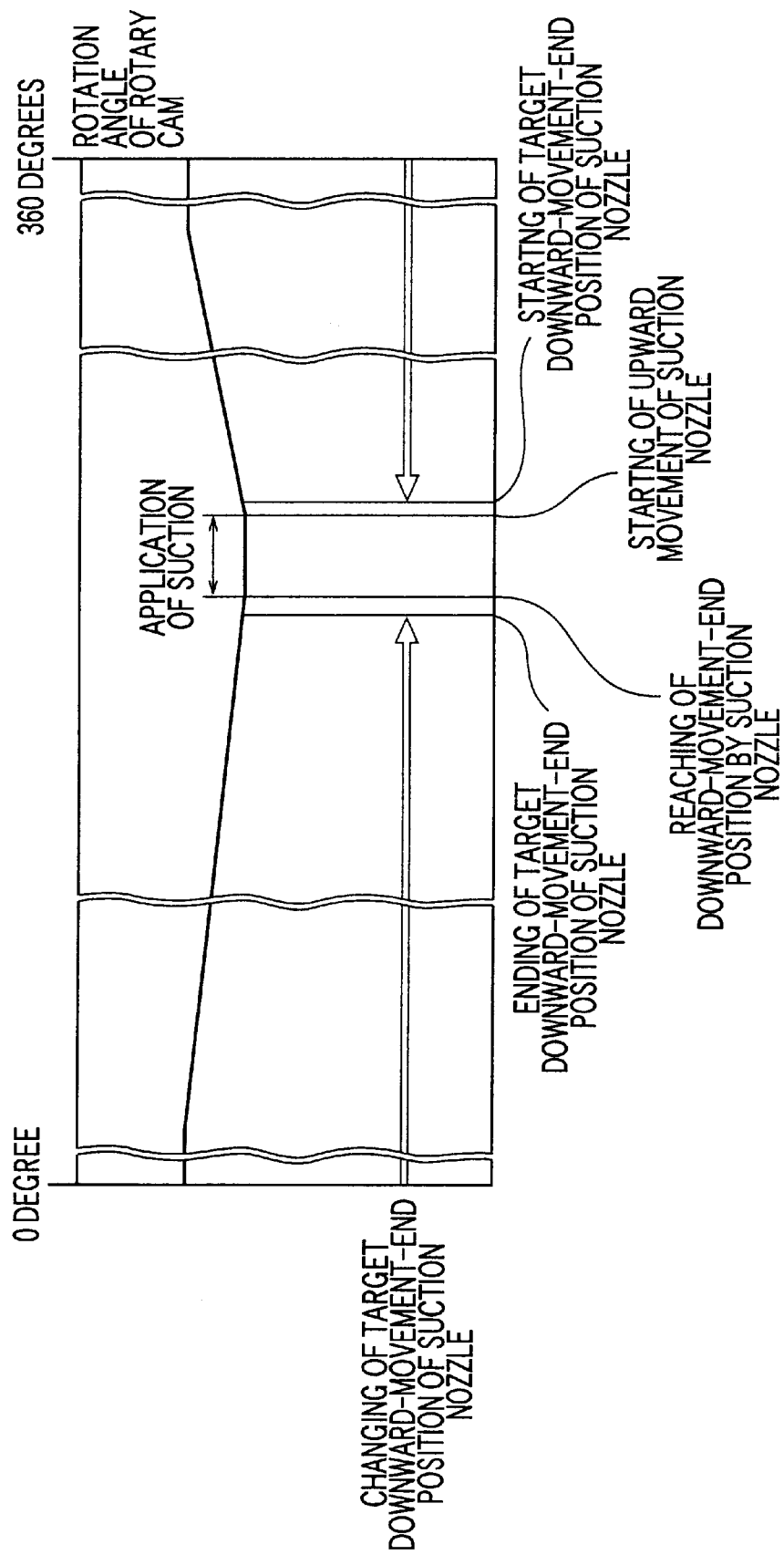
FIG. 19 is a view for explaining a relationship between the upward and downward movements of a nozzle holder, and the changing of the target downward-movement-end position of each suction nozzle, both of which occur while a rotary cam of the EC-mounting-unit elevating and lowering device is rotated by 360 degrees.

The changing of the target downward-movement-end position of the suction nozzle 90 may be effected during the upward and downward movements of the nozzle 90, or in the state in which the nozzle 90 is positioned at its upward-movement-end position. In either case, the changing is effected during one full rotation of the rotary cam 174 of the EC-mounting-unit elevating and lowering device 118. However, as illustrated in FIG. 19, it is preferred that the changing of the stroke of each suction nozzle 90 be ended before the nozzle 90 contacts the EC 94, and it is more preferred in view of possible errors that the changing be ended more or less earlier than the time when the nozzle 90 contacts the EC 94. If the changing, e.g., decreasing, of the stroke has not been ended at a time when the nozzle 90 will contact the EC 94, then the nozzle 90 moving downward would collide with the EC 94. More specifically described, if the changing has not been finished, then the current downward-movement-end position has not been changed to a new target position higher than the current target position (i.e., the stroke has not been decreased yet), so that the nozzle 90 would contact the EC 94 at a speed higher than zero, i.e., with some impact. In the case where the stroke is increased, when the rotary cam 174 has been rotated to a rotation position corresponding to the downward-movement-end position of the nozzle holder 74, the suction nozzle 90 may not have reached a new target downward-movement-end position lower than an old target position, so that the nozzle 90 would not collide with the EC 94. However, the nozzle 90 may apply suction to the EC 94, at a position away from the EC 94. When the first slide 190 is further moved relative to the lever 160 to complete the changing of the stroke, the nozzle 90 reaches the new target position where the nozzle 90 contacts the EC 94 and sucks and holds the same 94.

In addition, as illustrated in FIG. 19, it is preferred that the changing of the target downward-movement-end position of each suction nozzle 90 be started after the suction nozzle 90 preceding the each nozzle 90 has started moving upward and the EC 94 held by the preceding nozzle 90 has taken off the bottom surface of the EC accommodating pocket 136. For example, in the case where the current target downward-movement-end position of the each nozzle 90 is changed to a new target position lower than the current target position, i.e., the stroke is increased, if the changing of the current target position is started before the EC 94 held by the preceding nozzle 90 has taken off the bottom surface of the pocket 136, then the preceding nozzle 90 is moved relative to the rotary holder 86 while compressing the spring 100 and thereby applying a pressing force to the EC 94.

However, it is not essentially required that the changing of the target downward-movement-end position be effected in the state in which there is no possibilities that the EC 94 may be subjected to any impact or pressing force. That is, the changing may be finished after the suction nozzle 90 contacts the EC 94, and may be started before the nozzle 90 starts moving upward, because the impact or pressing force applied to the EC 94 is small, if any, and because the impact or pressing force is a force applied to the EC 94 in a vertical direction and the vertical-direction force less adversely influences the holding of the EC 94 by the nozzle 90 than a force applied to the EC 94 in a direction perpendicular to the axial direction of the nozzle 90. In the present embodiment, each feeder 123 feeds the emboss-type EC carrier tape 130, and a space is left under the EC accommodating portion 134 of the tape 130. Therefore, even if any impact or pressing force is applied to an EC 94, it will be sufficiently absorbed by the elastic deformation of the tape 130, so that no excessive force is applied to the EC 94.

The rotary cam 174 is rotated just one time in one cycle time of each EC mounting unit 30, i.e., a time duration from a time when the unit 30 is stopped at one of the sixteen stop positions to a time when the unit 30 is moved to, and stopped, at the next stop position adjacent to the one stop position. During the one-time rotation of the cam 174, the target downward-movement-end position of the suction nozzle 90 is changed. Therefore, even if the target position is changed, the cycle time of the unit 30 is not increased, and accordingly the efficiency of mounting of ECs 94 is not lowered.

In the case where the current target downward-movement-end position of each suction nozzle 90 is changed to a new target position lower than the reference target position, based on at least one of the wearing amount of the nozzle 90 and the thickness error of the EC 94, the stroke of the nozzle 90 is so increased that the nozzle 90 reaches, and stops at, the new target position, and contacts the EC 94, when the nozzle holder 74 reaches its downward-movement-end position, even if the nozzle 90 may be shortened because of wearing, or even if the actual thickness of the EC 94 may be smaller than the nominal thickness. That is, the nozzle 90 contacts the EC 94 at a downward-movement speed substantially equal to zero, i.e., without applying any impact thereto, and sucks and holds the EC 94 without applying any pressing force thereto. On the other hand, in the case where the current target position of each suction nozzle 90 is changed to a new target position higher than the reference target position, the stroke of the nozzle 90 is so decreased that the nozzle 90 contacts the EC 94, when the nozzle holder 74 reaches its downward-movement-end position, even if the actual thickness of the EC 94 may be greater than the nominal thickness. Likewise, the nozzle 90 contacts the EC 94 at a downward-movement speed substantially equal to zero, i.e., without applying any impact thereto, and sucks and holds the EC 94 without applying any pressing force thereto. In either case, if the nozzle 90 contacts the EC 94 before reaching the new target downward-movement-end position, then the nozzle 90 is retracted into the rotary holder 86, while compressing the spring 100. The compression of the spring 100 absorbs the excessive distance of downward movement of the nozzle 90, thereby preventing the EC 94 from being broken by the nozzle 90. That is, the spring 100 functions as a cushion device. The amount of compression of the spring 100 caused by the nozzle 90 is very small, and accordingly the pressing force produced by the compressed spring 100 is applied to the EC 94 with no problem. On the other hand, if the nozzle 90 reaches, and stops at, the new target downward-movement-end position, before contacting the EC 94, then a space is left between the sucking end surface 92 of the nozzle 90 and the sucked surface 96 of the EC 94. However, the space is very small. Therefore, the nozzle 90 can apply suction to the EC 94 and hold the same 94. Thus, even if the sucking end surface 92 may be more or less worn, or even if the thickness of the EC 94 may have some error, the nozzle 90 can contact the EC 94 at a downward-movement speed substantially equal to zero, without applying excessive impact to the EC 94 or braking the same 94. In addition, the distance of downward movement of the nozzle 94 is effectively preventing from being short, so that the nozzle 90 is freed from the problems that the nozzle 90 fails to reach or hold an EC 94, or holds an EC 94 having a great positional error or taking a lying-on-its-side posture. Since each suction nozzle 90 can reliably hold an EC 94, the EC mounting apparatus 8 is prevented from being interrupted by the occurrence of a failure to hold an EC 94, and accordingly the production efficiency of the apparatus 8 is prevented from being lowered.

It emerges from the foregoing description that in the present embodiment the EC-mounting-unit elevating and lowering device 118 provides a reception control device; the height-position adjusting device 360 provides a substrate elevating and lowering device; the EC-mounting-unit elevating and lowering device 120 provides a nozzle-holder elevating and lowering device, which cooperates with a portion of the computer 560 that controls the height-position adjusting device 360, to provide a mounting control device; a portion of the computer 560 that determines, based on the image data representing the image taken by the image-taking device 310, the respective axial-direction positions of the mounted surface 98 and the sucking end surface 92, provides an image processor; a portion of the computer 560 that controls, based on the axial-direction positional error of the mounted surface 98, the height-position adjusting device 360 to adjust the height position of the support surface 364 of the PWB 350, and a portion of the computer 560 that controls the second-slide-drive servomotor 208 to change the target downward-movement-end position of each suction nozzle 90 cooperate with each other to provide a control modifying device.

In addition, the levers 160, 166, the connecting device 218, the elevator member 148, the guide rail 46, the sleeve 70, and the nozzle holder 74 cooperate with one another to provide a connecting device which connects the roller 168 and each suction nozzle 90 to each other. The connecting device also functions as a motion converting device which converts the motion of the roller 168 into the upward and downward movements of the nozzle 90. Moreover, a portion of the computer 560 that determines, based on the target downward-movement-end position of the nozzle 90, the driving amount of the second-slide-drive servomotor 208 provides a movable-member-position determining means, which cooperates with the servomotor 208, the feed screw 206, and the nut 204 to provide a driving device which drives the second slide 202; the roller 198 and the engaging member 200 cooperate with each other to provide an engaging device; the moving device and the engaging device cooperate with the second slide 202 to provide a moving device which moves the first slide 190; and the moving device, the lever 160, the first slide 190, and a portion of the computer 560 that controls the servomotor 208 cooperate with one another to provide a nozzle-movement control device which changes, during an EC mounting operation of the EC mounting apparatus 8, at least one of the target downward-movement-end position, and the downward-movement-deceleration-start position, of each suction nozzle 90. The nozzle-movement control device also functions as a stroke-changing device. In the present embodiment, the nozzle revolving device 32 provides a transferring control device, also functions as a positioning device which positions each suction nozzle 90 at each of the EC-receive position and the EC-mount position, and also functions as a selecting device which selects one of the suction nozzles 90 that is to receive an EC 94 at the EC-receive position and mount the EC 94 at the EC-mount position.

In the present embodiment, the standard feeder 600 is used to determine the reference driving amount of the second-slide-drive servomotor 208. However, it is possible to employ a detecting device, such as a laser displacement sensor, to detect the height position of the tape-support surface 142 of the frame 139 of each feeder 123, or the height position of the bottom surface of the EC accommodating pocket 236 of the EC carrier tape 130, then determine the reference height position based on the thus determined height position, and finally determine the reference driving amount of the servomotor 208. For example, an average of the respective height positions of the respective tape-support surfaces 142 of the respective frames 139 of the plurality of feeders 123 may be obtained as the reference height position.

In the above-described embodiment, the surface-image taking device 310 is used to take the image of each suction nozzle 90 and the EC 94 held thereby, as seen in the direction perpendicular to the axial direction of the nozzle 90. However, the surface-image taking device 310 may be replaced with a line-image sensor 790, as shown in FIGS. 21 to 24. The same reference numerals as used in the first embodiment shown in FIGS. 1 to 20 are used to designate the corresponding elements of the second embodiment shown in FIGS. 21 to 24, and the description thereof is omitted.

The second embodiment relates to an EC mounting apparatus 698 including a suction nozzle 700 and a nozzle moving device 702 as a transferring control device that moves the suction nozzle 700 in each of an X-axis direction and a Y-axis direction that are perpendicular to each other on a plane parallel to a support surface 706 of a PWB 704, e.g., a horizontal plane in the present embodiment, so that the nozzle 700 receives an EC 714 from one of two EC supplying devices 710, 712 and mounts the EC 714 on the PWB 704. The PWB 704 is conveyed in the X-axis direction by a wiring-board conveying device 718 which is provided on a base 716, and is stopped and positioned at a prescribed position where one or more ECs 714 are mounted on the PWB 704. The two EC supplying devices 710, 712 are provided on both sides of the wiring-board conveying device 718 as seen in the Y-axis direction. That is, the two EC supplying devices 710, 712 and the wiring-board conveying device 718 are arranged in the Y-axis direction. Each of the two EC supplying devices 710, 712 includes a plurality of EC-supply feeders 720 each of which feeds an EC carrier tape 130 carrying a plurality of ECs 714.

The nozzle moving device 702 includes an X-axis-direction moving device 726 and a Y-axis-direction moving device 728. The X-axis-direction moving device 726 includes an X-axis slide 730 as a movable member, and an X-axis-slide drive device 732 which is provided on the base 716. The X-axis-slide drive device 732 includes two servomotors 734 each as a sort of electric motor as a drive source, and two motion converting devices each of which includes a nut 736 and a feed screw 738 and converts the rotation of a corresponding one of the two motors 734 into a linear movement of the X-axis slide 730 in the X-axis direction. Thus, the X-axis slide 730 is moved in the X-axis direction while being guided by a pair of guide rails 740 (FIG. 23) each as a guide member.

The Y-axis-direction moving device 728 includes a Y-axis slide 744 as a movable member, and a Y-axis-slide drive device 746 which is provided on the X-axis slide 730. The Y-axis-slide drive device 746 includes a servomotor 748 as a drive source, and a motion converting device which includes a nut 750 and a feed screw 752 (FIG. 23) and converts the rotation of the motor 748 into a linear movement of the Y-axis slide 744 in the Y-axis direction. Thus, the Y-axis slide 744 is moved, on the X-axis slide 730, in the Y-axis direction while being guided by a guide rail 754 as a guide member.

Figure 22:
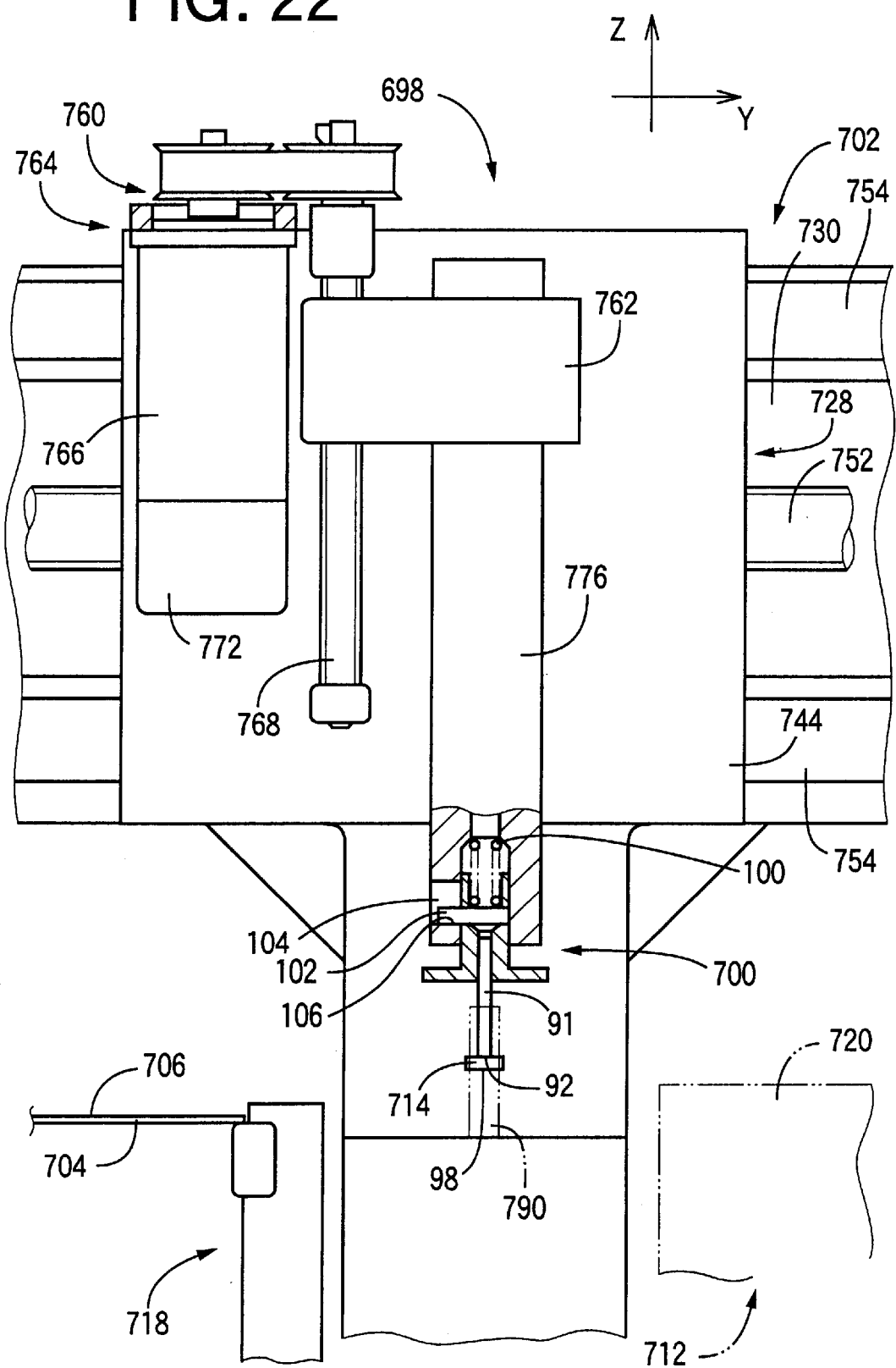
FIG. 22 is a side elevation view of a suction nozzle and an elevating and lowering device of the EC mounting apparatus of FIG. 21.
Figure 23:
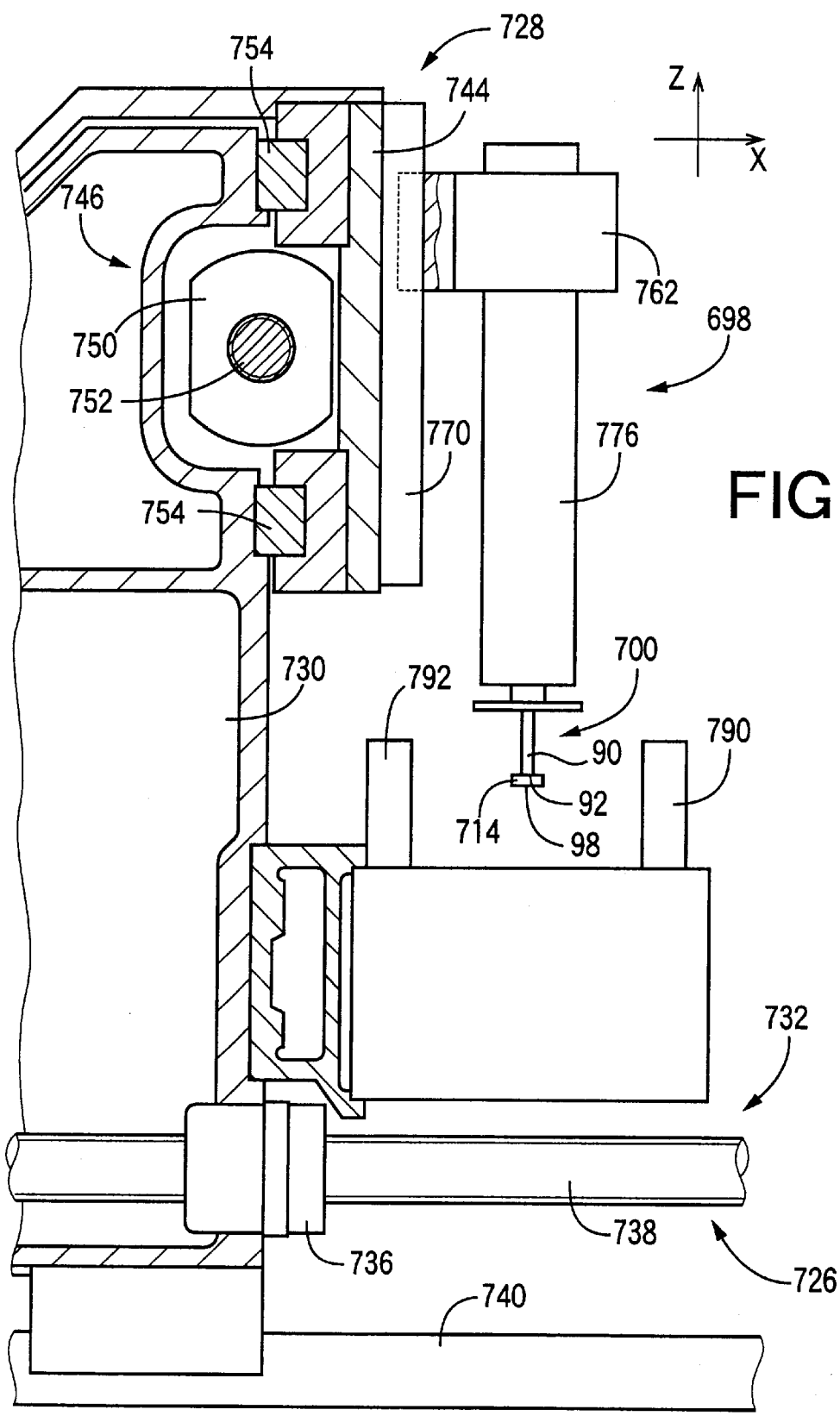
FIG. 23 is a partly cross-sectioned, front elevation view of the suction nozzle and the elevating and lowering device of the EC mounting apparatus of FIG. 21.

The suction nozzle 700 is provided on the Y-axis slide 744 such that the nozzle 700 is movable in a direction perpendicular to the support surface 706 of the PWB 704, e.g., in a vertical direction in the present embodiment. As shown in FIG. 22, the nozzle 700 is elevated and lowered by an elevating and lowering device 760 which is provided on the Y-axis slide 744. The elevating and lowering device 760 includes an elevator member 762 and an elevator-member drive device 764. The elevator-member drive device 764 includes a servomotor 766 as a drive source; a feed screw 768 which is rotatable about a vertical axis line and is not movable in an axial direction thereof; and a nut (not shown) which is fixed to the elevator member 762 and is threadedly engaged with the feed screw 768. When the feed screw 768 is rotated by the motor 766, the elevator member 762 is elevated and lowered while being guided by a guide rail 770 (FIG. 23). A rotation angle of the servomotor 776 is detected by an encoder 772. In FIG. 23, the elevating and lowering device 760 is not illustrated.

The elevator member 762 supports a nozzle holder 776 such that the nozzle holder 776 is rotatable about a vertical axis line and is not movable in an axial direction thereof, and the suction nozzle 700 is held by a lower end portion of the nozzle holder 776 that projects downward from the elevator member 762, such that the nozzle 700 is concentric with the holder 776. The suction nozzle 700 has the same construction as that of the previously-described suction nozzle 90, and is held by the nozzle holder 776 such that the nozzle 700 is movable relative to the holder 776 in the axial direction thereof and is not rotatable relative to the same 776. A suction or negative pressure is supplied to the nozzle 700 via a negative-pressure passage, not shown, which is formed in the nozzle holder 776. The nozzle holder 776 is rotated, by a rotating device, not shown, about an axis line of the holder 776, so that the suction nozzle 700 is rotated about an axis line thereof.

As previously described, the two EC supplying devices 710, 712 and the wiring-board conveying device 718 are arranged in the Y-axis direction and, when the suction nozzle 700 receives an EC 714 from each one of the two EC supplying devices 710, 712 and then moves toward the PWB 704, the nozzle 700 must move in the Y-axis direction on the X-axis slide 730, while passing by a corresponding one of two portions of the X-axis slide 730 that is located between the each one EC supplying device 710, 712 and the wiring-board conveying device 718. At the one portion, a line-image sensor 790 and a lighting device 791 are provided, as shown in FIG. 22 and 23.

The line-image sensor 790 includes a plurality of charge-coupled devices (CCDs) which are arranged in an array in a vertical direction. The lighting device 792 also extends in a vertical direction. As shown in FIG. 23, the line-image sensor 790 and the lighting device 792 are provided at a position where the speed of Y-axis-direction movement of the suction nozzle 700 holding the EC 714 becomes constant. The line-image sensor 790 and the lighting device 792 are located on both sides of the route of movement of the nozzle 700, and are opposed to, and distant from, each other in the X-axis direction. Respective optical axes of the line-image sensor 790 and the lighting device 792 are perpendicular to both the axial direction of the suction nozzle 700 and the direction of movement of the nozzle 700, e.g., are horizontal in the present embodiment. Thus, the line-image sensor 790 takes an image of the nozzle 700 and the EC 714 as seen in a direction perpendicular to the axial direction of the nozzle 700.

Figure 21:
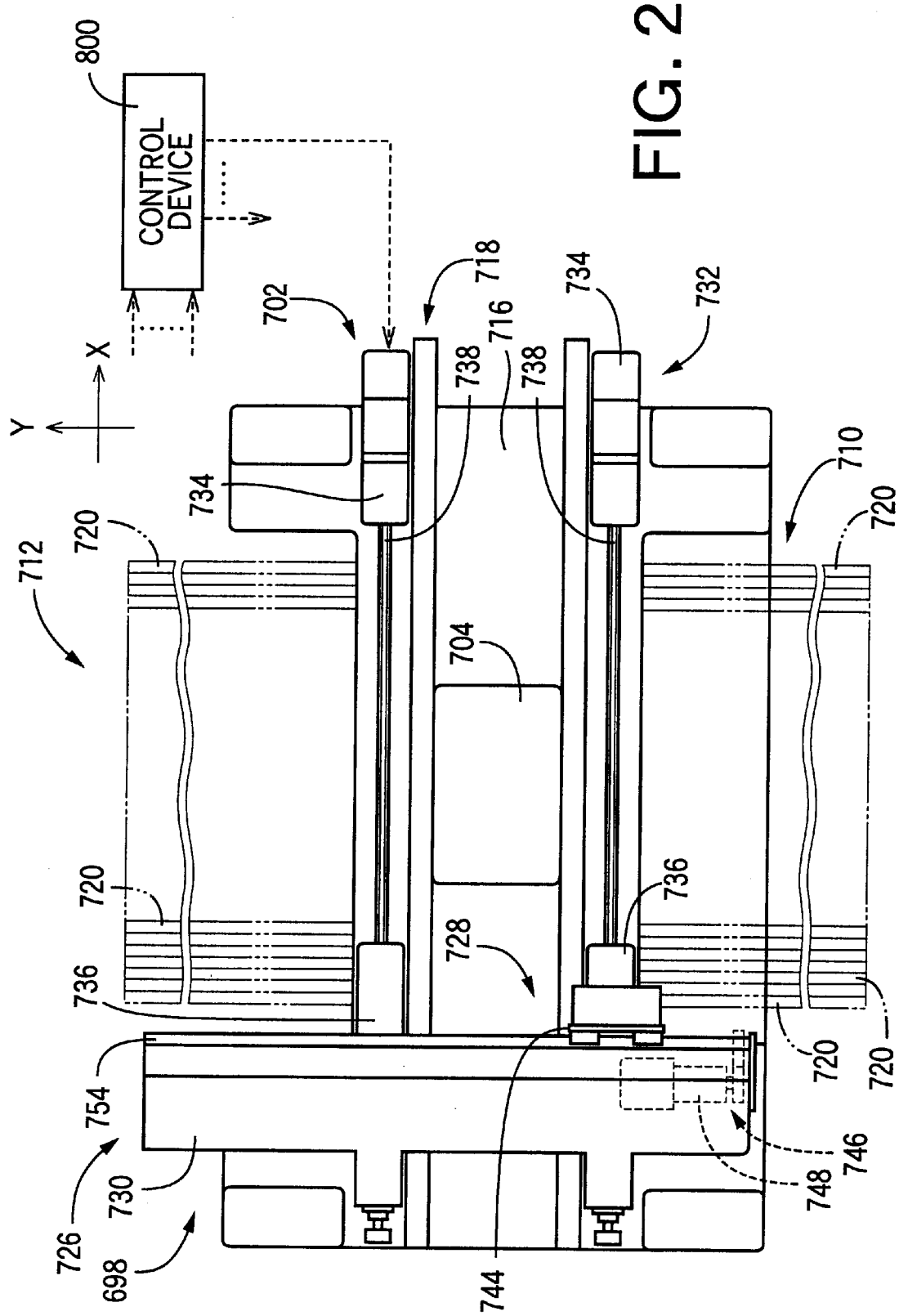
FIG. 21 is a schematic plan view of another EC mounting system including another EC mounting apparatus as another embodiment of the present invention.

In the present embodiment, the suction nozzle 700 is moved, after mounting one EC 714 on the PWB 704, to the EC supplying device 710, 712, or is moved, after sucking and holding one EC 714, to the PWB 704, in a state in which the nozzle 700 is positioned at its upward-movement-end position. The nozzle 700 is kept at the upward-movement-end position till the nozzle 700 reaches a position near an EC-mount place on the PWB 704. The upward-movement-end position is a known position. The current suction nozzle 700 is selected from a plurality of sorts of suction nozzles 700 which include respective suction pipes 91 whose lengths may differ from each other. However, the respective lengths of the suction pipes 91 are known. Respective thickness values of a plurality of ECs 714 may not be equal to each other. In view of those facts, the line-image sensor 790 is located, with respect to the vertical direction, such that the line-image sensor 790 can take an image of the sucked surface 96 and the mounted surface 98 of the EC 714, whichever length the suction pipe 91 may have or whichever thickness the EC 714 may have. The above-explained nozzle moving device 702 and the other devices are controlled by a control device 800 (FIG. 21). Like the previously-described control device 550, the control device 800 is essentially provided by a computer.

When the suction nozzle 700 mounts an EC 714 on the PWB 704, the nozzle 700 is moved by the nozzle moving device 702 to the EC supplying device 710 or 712, to suck and hold the EC 714. The nozzle 700 is stopped at a position right above the EC 714, and is lowered and elevated by the elevating and lowering device 760 to apply the negative pressure to the EC 714, thereby hold the EC 714, and take out the EC 714 from one feeder 720. To this end, the nozzle 700 is lowered toward the target downward-movement-end position thereof which has been changed based on a wearing amount of the sucking end surface 92 thereof and a thickness error of the EC 714. Since the elevating and lowering device 760 that elevates and lowers the nozzle 700 includes, as the drive source thereof the servomotor 766 which can accurately be controlled with respect to rotation angle, each of the downward-movement-end position of the nozzle 700, a position where the deceleration of downward movement of the nozzle 700 is started, and a speed of downward movement of the nozzle 700 can be changed to any desired position or speed.

In the present embodiment, the respective lengths of the respective suction nozzles 91 of the different sorts of suction nozzles 700 may differ from each other. Therefore, for each of the different lengths of the suction nozzles 91, a reference driving amount of the servomotor 765 (i.e., a reference target downward-movement-end position of the suction nozzle 700) is determined. A driving amount of the servomotor 766 that is needed to cause a standard suction nozzle being positioned at an advancement-end position thereof to contact an upper surface of a standard feeder is determined as a reference driving amount. The reference driving amount is changed based on the wearing amount of the sucking end surface 92 and the thickness error of the EC 714, so that the target downward-movement-end position of the nozzle 700 is changed and accordingly a position where the acceleration of downward movement of the nozzle 700 is ended, the position where the deceleration of downward movement of the nozzle 700 is started, and the speed of downward movement of the nozzle 700 are changed. Thus, when the nozzle 700 just contacts the EC 714, the nozzle 700 is stopped. Therefore, the nozzle 700 contacts the EC 714 with the downward-movement speed thereof being equal to zero and with the pressing force thereof being equal to zero. However, it is possible to change only the target downward-movement-end position of the nozzle 700, or change the target downward-movement-end position, the acceleration-end position, and the deceleration-start position, of the nozzle 700. Alternatively, if a reference driving amount of the servomotor 766 is determined for one of the different lengths of the suction pipes 91, e.g., the shortest one, then the determined reference driving amount may be used to determine, by calculation, a reference driving amount for each of the other lengths of the suction pipes 91, based on the difference between the shortest length and the each length.

Figure 24:
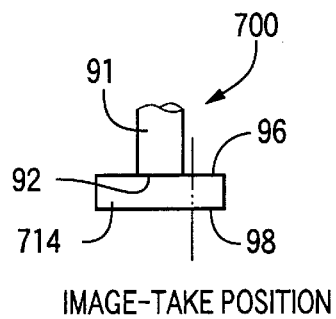
FIG. 24 is a view for explaining a manner in which respective images of a sucking end surface of the suction nozzle of the EC mounting apparatus of FIG. 21 and a mounted surface of an EC held by the suction nozzle are taken.

When the suction nozzle 700 is moved toward the PWB. 704 while holding the EC 714, the nozzle 700 must be moved through the space present between the line-image sensor 790 and the lighting device 792, and a linear image of the EC 714 is taken by the sensor 790. The sensor 790 takes a single linear image only. As shown in FIG. 24, the sensor 790 takes a linear image of a portion of the EC 714 that is offset from the suction pipe 91 of the nozzle 700 and is near to the pipe 91. Therefore, different image-take positions in the Y-axis direction are predetermined and stored, in the computer 560, in association with different sorts of suction nozzles 700 whose suction pipes 91 have different diameters, so that the sensor 700 takes a linear image of an EC 714 at one of the different image-take positions that corresponds to the diameter of the current pipe 91.

Thus, one linear image of the sucked surface 96 and the mounted surface 98 of the EC 714 is taken. Since the sucked surface 96 corresponds to the sucking end surface 92, the computer 560 can determine, based on the taken image, a thickness of the EC 714 and respective axial-direction positions of the sucking end surface 92 and the mounted surface 98 and, change, based on the thus determined thickness and positions, the target downward-movement-end position of the suction nozzle 700 to mount the EC 714.

In the present embodiment, the PWB 704 cannot be elevated or lowered, but the target downward-movement-end position of the suction nozzle 700 holding the EC 714 can be changed so that even if the mounted surface 98 may have an axial-direction-positional error, the EC 714 can be mounted on the PWB 704 with an appropriate pressing force. For example, first, a driving amount of the servomotor 766 that is needed to cause a standard suction nozzle which is not holding an EC 714 and is being positioned at its advancement-end position, to contact a standard PWB, is determined as a reference driving amount. Next, based on the thus determined reference driving amount, the thickness of the EC 714, and the pressing force applied to the EC 714 (i.e., the compression amount of the spring 100), a driving amount (i.e., a correct driving amount) of the servomotor 766 that is needed to move the nozzle 700 to a correct target downward-movement-end position is determined. Since the respective lengths of the respective suction pipes 91 of the different sorts of suction nozzles 700 may differ from each other and the respective thickness values of the different sorts of ECs 714 may differ from each other, different reference driving amounts are determined for the different sorts of nozzles 700, and different correct driving amounts of the servomotor 766 are determined for the different sorts of nozzles 700 and the different sorts of ECs 714. If a reference driving amount of the servomotor 766 is determined for one of the different lengths of the suction pipes 91, e.g., the shortest one, then the determined reference driving amount may be used to determine, by calculation, a reference driving amount for each of the other lengths of the suction pipes 91, based on the difference between the shortest length and the each length. When a suction nozzle 700 mounts an EC 714, a correct driving amount of the servomotor 766 is changed based on the axial-direction-positional error of the mounted surface 98, so that the EC 714 is pressed against the support surface 706 at a decreased speed and with an appropriate pressing force.

The line-image sensor 790 may be used to take a two-dimensional image of the sucking end surface 92 and the mounted surface 98.

In each of the illustrated embodiments, the target downward-movement-end position, the deceleration-start position, and the downward-movement speed of the suction nozzle 90, 700 are changed based on the axial-direction-positional errors of the sucking end surface 92 of the nozzle 90, 700. However, it is possible to employ a manner in which the target downward-movement-end position and the deceleration-start position of the nozzle 90, 700 are changed but the downward-movement speed of the same 90, 700 is not changed. This manner will be briefly described below by reference to FIG. 25.

Figure 25:
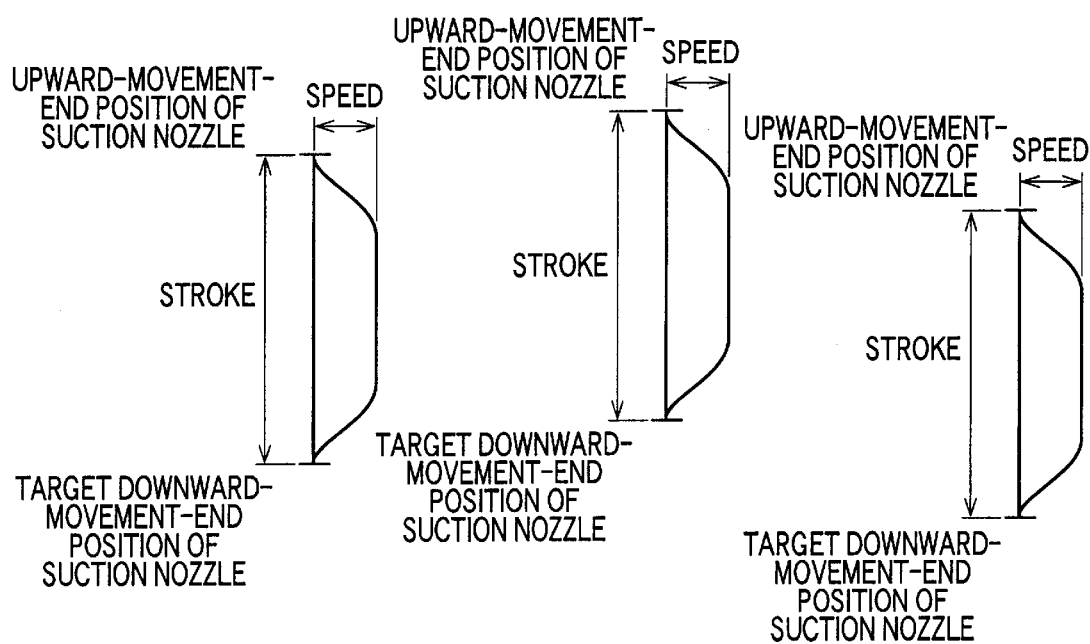
FIG. 25 is a view for explaining, in the case of another EC mounting apparatus as another embodiment of the present invention, a manner in which a target downward-movement-end position and a downward-movement-deceleration-start position of a suction nozzle are changed.

For example, the motion converting device which converts the motion of the cam 174, and the roller 168 as the cam follower, of the EC-mounting-unit elevating and lowering device 118, into the upward and downward movements of each suction nozzle 90, is modified. For example, it is possible to employ a nozzle holder 74 including a rod 72 whose length is adjustable, and an adjusting device which adjusts the length of the rod 72 and thereby changes the position of the each nozzle 90 corresponding to the upward-movement-end position of the elevator member 148. Alternatively, it is possible to employ a sleeve 70 whose position relative to the guide rail 46 is adjustable, and an adjusting device which adjusts the position of the sleeve 70 and thereby changes the position of the each nozzle 90 corresponding to the upward-movement-end position of the elevator member 148. Otherwise, if it is allowed to change the upward-movement-end position of the elevator member 148, it is possible to employ a changing device which does not change the connection position where the connecting rod 156 is connected to the lever 160 which is pivoted by the cam device 178, and which automatically changes, based on the axial-direction-positional error of the sucking end surface 92, the distance between the above connection position and the position where the connecting rod 156 is connected to the elevator member 148. In this manner, the nozzle 90 is lowered or elevated, as illustrated in FIG. 25, such that the target downward-movement-end position and the deceleration-start position of the nozzle 90 are changed but the downward-movement speed of the same 90 is not changed.

Figure 26:
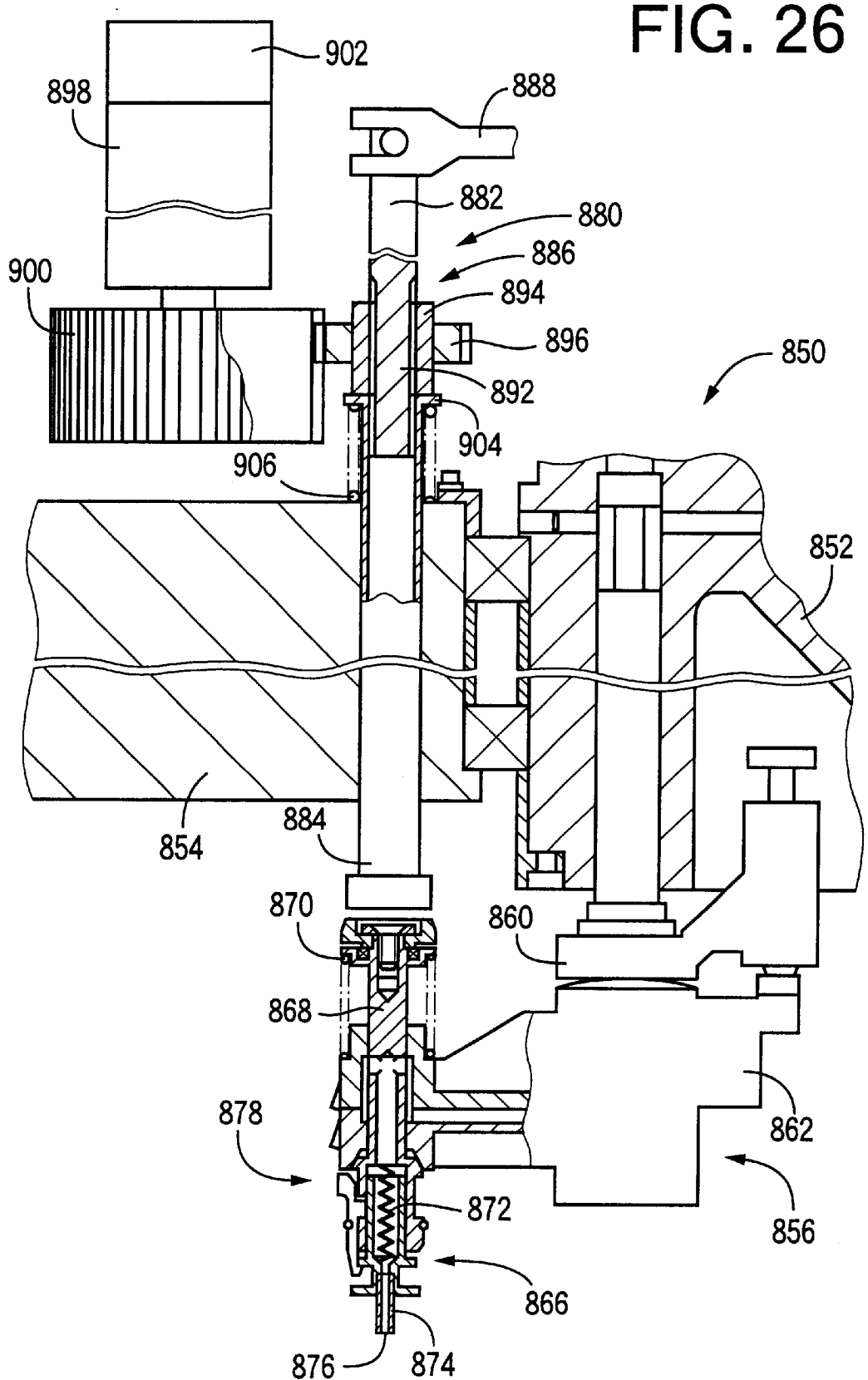
FIG. 26 is a partly cross-sectioned, front elevation view of an EC mounting unit and an EC-mounting-unit elevating and lowering device of another EC mounting apparatus as another embodiment of the present invention.

Another embodiment of the present invention will be described by reference to FIG. 26. The present embodiment relates to an EC mounting apparatus 850 which includes, like an EC mounting apparatus disclosed in Japanese Patent Document No. 4-345097, a plurality of EC mounting units each of which holds and mounts an EC. The EC mounting apparatus 850 includes an index table 852 which is intermittently rotatable about a vertical axis line and which is supported by a base plate 854 such that the table 852 is rotatable about the vertical axis line. The index table 852 supports a plurality of EC mounting units 856, and is intermittently rotated by an intermittently rotating device including a cam, a cam follower, a rotary shaft, and an index servomotor for rotating the cam, all not shown, so that the EC mounting units 856 are sequentially moved to, and stopped at, a plurality of stop positions including an EC-receive position, an EC-posture-detect position, a mounted-surface-detect position, an EC-posture- correct position, an EC-mount position, and an EC-discard position.

Each of the EC mounting units 856 includes a main member 860 which is fixed to respective lower ends of two guide rods, not shown, which are supported by the index table 852 such that the main member 860 can be elevated and lowered. A roller which is provided on a connecting plate, which connects between respective upper ends of the two guide rods, is engaged with a cam groove of a stationary cylindrical cam. When the index table 852 is rotated, the roller is moved in the cam groove, so that the each unit 856 is elevated and lowered.

A rotary member 862 is attached to the main member 860 such that the rotary member 862 is rotatable about a vertical axis line. The rotary member 862 holds a plurality of suction nozzles 866 (one nozzle 866 is shown in the figure). The rotary member 862 holds a plurality of nozzle holders 868 such that each of the nozzle holders 868 is movable relative to the rotary member 862 in an axial direction of the each holder 868, e.g., in a vertical direction in the present embodiment, and is rotatable about an axis line of the each holder 868. A spring 870 which is provided between the rotary member 862 and the each holder 868 biases the each holder 868 in an upward direction from the rotary member 862. The nozzle holders 868 hold the suction nozzles 866, respectively, such that each of the nozzles 866 takes a vertical posture, and is movable in an axial direction thereof, but is not rotatable about an axis line thereof, relative to the corresponding holder 868. A spring 872 biases the each nozzle 866 in a downward direction from the corresponding holder 868. A suction pipe 874 is fixed to a lower end of the each nozzle 866, and a suction or negative pressure is supplied to the pipe 874 via negative-pressure passages formed in the holder 868 and the other members, so that a sucking end surface 876 applies the negative pressure to an EC and thereby holds the EC. Thus, each of the suction nozzles 866 and a corresponding one of the nozzle holders 868 cooperate with each other to provide a corresponding one of a plurality of EC mounting heads 878 which are provided on the rotary member 862. When the rotary member 862 is rotated, an appropriate one of the EC mounting heads 878 is selectively positioned at an operative position.

An EC-mounting-head elevating and lowering device 880 is provided at the EC-receive position. The elevating and lowering device 880 has the same construction as that of an EC-mounting-head elevating and lowering device disclosed in Japanese Patent Document No. 7-9381. The elevating and lowering device 880 includes an elevator member 886 including (a) an elevator shaft 882 and (b) a sleeve 884 which is fitted on the shaft 882 such that the sleeve 884 is slideable relative to the shaft 882. The elevator shaft 882 is supported by a frame, not shown, such that the shaft 882 can be elevated and lowered. A lever 888 is pivotally connected to an upper end portion of the elevator shaft 882.

The lever 888 is supported by the above-described frame such that the lever 888 is pivotable, and the rotation of the index servomotor is converted into the pivotal motion of the lever 888 by a cam device including a cam and a cam follower, and a motion converting device. When the lever 888 is pivoted, the elevator member 886 is elevated and lowered. Thus, the lever 888 provides a motion converting device which converts the motion of the cam follower into the upward and downward movements of the elevator member 886.

A ball screw 892 is provided by a lower end portion of the elevator shaft 882, and a nut 894 is threadedly engaged with the ball screw 892. A gear 896 is fixed to the nut 894, and is engaged with a drive gear 900 which is rotated by an adjusting servomotor 898 as a sort of electric motor as a drive source. A width of teeth of the drive gear 900 is so prescribed that when the nut 894 is elevated and lowered to suck and hold an EC, the drive gear 900 is kept in engagement with the gear 896. A current rotation angle of the adjusting servomotor 898 is detected by an encoder 902.

The sleeve 884 is fitted in a hole formed through the base plate 854, such that the sleeve 884 can be elevated and lowered, and is prevented from being rotated by a rotation preventing device, not shown. An upper end portion of the sleeve 884 that projects from the base plate 854 is fitted on the lower end portion of the elevator shaft 882, such that the sleeve 884 is slideable relative to the shaft 882 in an axial direction of the sleeve 884. A spring 906 is provided between the base plate 854 and an outer flange portion 904 formed at the upper end of the sleeve 884, and biases the sleeve 884 in an upward direction so that the sleeve 884 contacts a lower surface of the nut 894. A lower end portion of the sleeve 884 projects downward from the base plate 854.

The elevator shaft 882 engaged with the lever 888 cannot be rotated. Therefore, when the nut 894 is rotated by the adjusting servomotor 898, the nut 894 is moved relative to the ball screw 892 in an axial direction thereof while being rotated relative thereto. The sleeve 884 follows the nut 894 owing to the biasing action of the spring 906, so that the sleeve 884 moves relative to the elevator shaft 882. Thus, a length of the elevator member 886 is adjusted.

Also at the EC-mount position, there is provided an EC-mounting-head elevating and lowering device, not shown, which has the same construction as that of the elevating and lowering device 880 and which lowers and elevates each suction nozzle 866 so that the each nozzle 866 mounts an EC on a PWB.

In the present EC mounting apparatus 850, each suction nozzle 866 is lowered and elevated, at the EC-receive position, by the EC-mounting-head elevating and lowering device 880, so that the each nozzle 866 sucks and holds an EC held by an EC supplying device. In the present embodiment, it is assumed that the EC supplying device has the same construction as that of the EC supplying device employed in the embodiment shown in FIGS. 1 to 20. When each suction nozzle 866 sucks and holds an EC, the target downward-movement-end position of the each nozzle 866 is changed based on a wearing amount of the sucking end surface 876 and a thickness error of the EC that have been determined based on an image taken at the mounted-surface-detect position, so that the each nozzle 866 contacts the EC at a downward-movement speed equal to zero and with a pressing force equal to zero.

The target downward-movement-end position of each suction nozzle 866 is changed by operating the adjusting servomotor 898 and thereby adjusting the length of the elevator member 886. The nozzle holder 868 and the elevator member 886 are not connected to each other, and the respective upward-movement-end positions of the nozzle holder 868 and the each nozzle 866 are not changeable. In addition, since the length of the elevator member 886 is adjusted by moving the sleeve 884 relative to the elevator shaft 882, the upward-movement-end positions of the elevator member 886 is not changeable, either. Thus, the changing of the length of the elevator member 886 changes the downward-movement-end position thereof, but does not change the stroke of upward and downward movements thereof.

In the case where the length of the elevator member 886 is increased, when the elevator member 886 is lowered and elevated by the pivotal motion of the lever 888, the elevator member 886 contacts the nozzle holder 868 over an increased portion of the stroke of upward and downward movements of the member 886, so that the nozzle holder 868 is lowered by an increased distance from its upward-movement-end position. Thus, the target downward-movement-end position of the each nozzle 866 is changed to a lower target position. Simultaneously, a position where the deceleration of downward movement of the each nozzle 866 is started, is also changed.

The length of the elevator member 886 or the driving amount of the adjusting servomotor 898 is adjusted to a value which assures that the each nozzle 866 being positioned at the target downward-movement-end position can suck and hold the EC notwithstanding the wearing amount of the sucking end surface 876 and the thickness error of the EC. The driving amount is calculated, like in the embodiment shown in FIGS. 1 to 20, by first determining a reference driving amount of the adjusting servomotor 898 and changing the thus determined reference driving amount based on the wearing amount of the sucking end surface 876 of the each nozzle 866 and the thickness error of the EC.

The changing of the target downward-movement-end position of each suction nozzle 866 is effected during, e.g., a time duration after the elevator member 886 is elevated to its upward-movement-end position at the EC-receive position and before the next nozzle 866 reaches the EC-receive position. Alternatively, the changing may be effected during a time duration after an EC held by the each nozzle 866 leaves an EC-supply feeder and before the next nozzle 866 reaches the EC-receive position. Otherwise, the changing may be effected during a time duration between a time before the each nozzle 866 starts moving upward and a time after the next nozzle 866 contacts an EC.

After the suction nozzle 866 sucks and holds the EC, an image of the nozzle 866 and the EC held thereby is taken at each of the EC-posture-detect position and the mounted-surface-detect position and, based on the thus taken images, respective axial-direction positions of the sucking end surface 876 and the mounted surface of the EC are determined. At the EC-mount position, the suction nozzle 866 is lowered and elevated by the EC-mounting-unit elevating and lowering device, so that the nozzle 866 mounts the EC on the PWB. When the nozzle 866 mounts the EC, the target downward-movement-end position of the nozzle 866 is changed based on the axial-direction-positional error of the mounted surface of the EC held by the nozzle 866. This changing may be effected by changing the length of the elevator member 886. More specifically described, first, a reference driving amount of the adjusting servomotor 896 is determined using a standard suction nozzle and a standard PWB and, based on the thus determined reference driving amount, the thickness of the EC, and the compression amount of the spring 872, a driving amount (i.e., a correct driving amount) of the adjusting servomotor 896 needed to mount the EC on the PWB is determined. The correct driving amount is changed based on the axial-direction-positional error of the mounted surface of the EC, and thus the length of the elevator member 886 is adjusted, i.e., the target downward-movement-end position of the nozzle 866 is changed. However, it is possible to elevate and lower the PWB and thereby adjust the height position of the support surface of the PWB, like in the embodiment shown in FIGS. 1 to 20.

In the embodiment shown in FIGS. 1 to 20, when an EC 94 is mounted on a PWB 350, the PWB 350 can be elevated or lowered and the height position of the support surface 364 thereof can be adjusted, so that the EC 94 can be mounted on the PWB 350 with an appropriate pressing force even if a prescribed pressing force to be applied to the EC 94 may be changed or the axial-direction position of the mounted surface 98 thereof may have an error. However, to this end, the target downward-movement-end position of each suction nozzle 90 may be changed in the same manner as that employed for sucking and holding each EC 94. In the latter case, for example, the EC-mounting-unit elevating and lowering device 120 may be so modified as to have the same construction as that of the EC-mounting-unit elevating and lowering device 118, a reference driving amount of the second-slide-drive servomotor 208 is determined using a standard suction nozzle and a standard PWB, and a correct driving amount of the servomotor 208 is determined based on the thus determined reference driving amount, the thickness of the EC 94, and the pressing force to be applied to the EC 94 (i.e., the compression amount of the spring 100). The thus determined correcting driving amount is changed based on the axial-direction-positional error of the mounted surface 98, so that the target downward-movement-end position of the each nozzle 90 is automatically changed.

In the embodiment shown in FIGS. 1 to 20, the respective lengths of the different sorts of suction nozzles 90 are equal to each other. However, those lengths may differ from each other. If each of the EC-mounting-unit elevating and lowering devices 118, 120, i.e., each nozzle elevating and lowering device has the function of changing the target downward-movement-end position of each nozzle 90, then it can change the target position of the each nozzle 90, depending upon the length thereof, so that the each nozzle 90 may contact an EC 94 at a downward-movement speed equal to zero and with a pressing force equal to zero, or that the each nozzle 90 may mount the EC 94 on a PWB with an appropriate pressing force. Alternatively, the EC supplying device 122 or the wiring-board supporting device 404 may be elevated or lowered depending upon the length of the each nozzle 90.

In the embodiment shown in FIGS. 1 to 20, the nozzle elevating and lowering device 118 includes the cam device 178, and changes the same motion of the cam follower 168 into an arbitrary one of different strokes of upward and downward movements. The nozzle elevating and lowering device 118 may be so modified as to have the function of changing the upward-movement-end position of each suction nozzle 90 to an arbitrary one of different positions.

However, it is not essentially required to change the downward-movement-end position of each suction nozzle 90, 700, 866. That is, it is possible to change only the position where the deceleration of downward movement of the each nozzle is started. In the latter case, even if an EC 94, 714 may have an excessive thickness and accordingly an actual distance between the each nozzle and the sucked surface 96 of the EC may be shorter than a correct distance, the downward-movement-deceleration-start position can be changed to a higher position, so that the each nozzle may contact the EC at a downward-movement speed substantially equal to zero, like when the each nozzle contacts an EC having a correct thickness.

The EC supplying device 122, 710, 712 may be elevated and lowered by an elevating and lowering device so that even if there may be an error with the axial-direction position of the sucking end surface 92, 876 or the thickness of the EC 94, 714, a suction nozzle 90, 700 may contact the EC 94 at a downward-movement speed equal to zero and with a pressing force equal to zero, and suck and hold it. For example, the table 125 to which the feeders 123 are attached may be elevated and lowered by an elevating and lowering device so that the position of the upper surface of an EC 94 may be changed according to the axial-direction-positional error of the sucking end surface 92 or the like.

In each of the illustrated embodiments, the wearing and bending of the sucking end surface 92, 876 of each suction nozzle 90, 700, 866 are detected each time the each nozzle has mounted a prescribed number of ECs 94, 714. However, they may be detected each time a prescribed time has elapsed. Respective times may be prescribed for respective suction nozzles, or alternatively a single prescribed time may be used for a plurality of suction nozzles. In the second case, a single time may be used for the plurality of suction nozzles 90 of each EC mounting unit 30, or for all the suction nozzles 90 of the EC mounting apparatus 8.

In each of the illustrated embodiments, it is assumed for easier understanding purposes only that each suction nozzle 90, 700, 866 is accurately produced and the manufacturing errors of the each nozzle are negligible. On this assumption, the wearing amount of the sucking end surface of the each nozzle is determined based on a determined axial-direction position of the sucking end surface, and the target downward-movement-end position of the each nozzle is changed based on the thus determined wearing amount. However, the manufacturing errors of the each nozzle may be determined based on the axial-direction position of the sucking end surface, and the target downward-movement-end position of the each nozzle may be changed based on the thus determined manufacturing errors.

In each of the illustrated embodiments, each feeder 123, 720 feeds the emboss-type EC carrier tape 130. However, each feeder may feed an EC carrier tape which includes (a) an EC accommodating tape having a constant thickness in its widthwise direction, having a plurality of EC accommodating pockets at regular intervals of distance, and carrying a plurality of ECs respectively accommodated in the pockets, and (b) a cover tape closing respective openings of the EC accommodating pockets. In this case, in a state in which a main frame of the feeder supports a widthwise entirety of a lower surface of the EC accommodating tape, the feeder feeds the EC carrier tape.

Alternatively, the EC supplying device 122, 710, 712 may employ an EC-supply feeder which does not feed an EC carrier tape but stores ECs in bulk in, e.g., a casing and includes an EC conveying device which conveys, owing to air flow, inclination of an EC-support surface, a conveying belt, or the like, or any appropriate combination thereof, each EC to an EC-supply portion of the feeder. In either case, in the state in which each EC is supported on an EC-support surface of the feeder, either indirectly via the EC accommodating tape, or directly, the each EC is conveyed by the movement of the tape, or by the EC conveying device. Thus, respective sucked surfaces 86 of different sorts of ECs 94, 714 having different thickness values may differ from each other. However, since the respective thickness values of the different sorts of ECs to be supplied are known in advance, the input device 570 may be operated to input data representing respective thickness values of those different sorts of ECs (i.e., respective nominal thickness values of the same), so that the target downward-movement-end position of each suction nozzle 90, 700, 866 may be changed according to the thickness value of each sort of EC 94, 714. Thus, each nozzle can hold and mount each sort of EC, without damaging it or failing to hold it, whichever thickness the EC may have. More specifically described, a reference height position of a tape-support surface of a frame of each feeder is determined, a height position of each EC is determined based on the thus determined reference height position and a nominal thickness value of the each EC, and the upward and downward movements of the each nozzle are controlled based on the thus determined height position of the each EC. Alternatively, the target downward-movement-end position of each suction nozzle may be changed based on a thickness of each EC that is determined based on a taken image. Otherwise, the upward and downward movements of each suction nozzle for sucking and holding an EC may be controlled based on an error from a reference height position of an actual height position of the EC that is detected by a height-position detecting device at at least one of a time before, and a time after, an EC mounting operation is started.

In the embodiment shown in FIGS. 1 to 20, the height-position adjusting device 360 adjusts the height position of the PWB 350 by moving the rollers 416 relative to the inclined surfaces 442 of the wedge blocks 440 in the X-axis direction and thereby elevating or lowering the wiring-board supporting device 404. However, the height-position adjusting device 360 may be replaced with a substrate elevating and lowering device including at least one feed screw, at least one nut, and at least one drive motor which is provided by, e.g., a servomotor. In this case, on a Y table of an X-Y table that is movable in a Y-axis direction on an X table of the X-Y table, three or four feed screws are provided such that the feed screws are parallel to one another in a vertical direction (i.e., a Z-axis direction), each of the feed screws is rotatable relative to the Y table, and is not movable in an axial direction of the each screw. Three or four nuts which are fixed to a substrate-support member are threadedly engaged with the three or four feed screws, respectively. When the feed screws are rotated by the drive motor, the substrate-support member is elevated and lowered. Two or more, or all, of the feed screws may be driven by a common drive motor, or the feed screws may be driven by respective exclusive drive motors. In the case where a plurality of drive motors are employed, those motors are operated in synchronism with each other. The substrate elevating and lowering device elevates and lowers a substrate supporting device including the substrate-support member, thereby not only moving a circuit substrate to a substrate-transfer height position and an EC-mount height position, but also adjusting a height position of a support surface of the circuit substrate when an EC is mounted on the support surface. A height-position adjusting device may be employed to only adjust a height position of a support surface of a circuit substrate when an EC is mounted on the support surface.

In each of the illustrated embodiments, the EC supplying device 122, 710, 712 may be replaced with one which stores ECs on palettes and supplies the ECs from the palettes. Each of the palettes has a plurality of EC accommodating pockets which open upward, and stores a single EC in each of the pockets. In this case, the target downward-movement-end position of each suction nozzle 90, 700, 866 may be changed by first defining an upper surface of an appropriate one of the palettes as a reference surface, or preparing a reference palette, then determining a reference target downward-movement-end position of the each nozzle using the reference surface or palette, and changing the thus determined reference target downward-movement-end position based on a wearing amount of a sucking end surface 92, 876 of the each nozzle, a thickness error of an EC 94, 714, and so on.

In each of the illustrated embodiments, the target downward-movement-end position of each suction nozzle 90, 700, 866 for sucking and holding an EC 94, 714 is so determined that when the nozzle holder 74, 776, 868 reaches, and stops at, its downward-movement-end position, the each nozzle just contacts the EC at a downward-movement speed equal to zero and with a pressing force equal to zero, and thereby sucks and holds the EC. However, the each nozzle may be so controlled as to suck and hold an EC while applying a substantial pressing force thereto, or may suck and hold an EC by applying suction to the EC from a position away from the EC. In the first case, the target downward-movement-end position of the each nozzle is so determined as to be lower than a position where the each nozzle will contact the EC, so that after the nozzle contacts the EC, the nozzle holder is further lowered while the nozzle is retracted into the holder and a spring associated with the nozzle is compressed, and accordingly a pressing force is applied to the EC. A constant pressing force may be applied to each of different sorts of ECs, or different pressing forces may be applied to different sorts of ECs, respectively. The compression amount of the spring is determined based on a pressing force to be applied to the EC, and the target downward-movement-end position of the each nozzle is determined based on the thus determined compression amount.

In the second case, the target downward-movement-end position of the each nozzle is so determined as to be a position where the each nozzle will not contact the EC but the distance between the nozzle and the EC allows the nozzle to apply suction to the EC and thereby holds the same. In view of a need to reliably suck and hold an EC, it is preferred that each suction nozzle suck and hold the EC while applying a pressing force thereto. Even in the case where it is intended that when the nozzle holder reaches, and stops at, its downward-movement-end position, each suction nozzle just contacts an EC and thereby holds the same, the target downward-movement-end position of the each nozzle may be so biased, in view of various errors, toward a side on which the each nozzle sucks and holds the EC while applying some pressing force thereto.

In the embodiment shown in FIGS. 1 to 20, the EC mounting apparatus 8 may be moved, by an X-Y robot, to an arbitrary position on a horizontal plane, whereas the EC supplying device 122 and the wiring-board supporting device 404 may be stationary on the horizontal plane. In this case, it can be said that the X-Y robot and the nozzle revolving device 32 cooperate with each other to provide a transferring control device, or that the X-Y robot provides a transferring control device and the nozzle revolving device 32 provides a selecting device which selects one of the EC mounting units 30 that is to be used to suck or mount an EC, or provides both the transferring device and the selecting device.

In the embodiment shown in FIGS. 21 to 24, a stationary nozzle elevating and lowering device may be provided on the Y-axis slide 744, and a movable member may also be provided on the Y-axis slide 744 such that the movable member is movable relative to the stationary nozzle elevating and lowering device in the Y-axis direction. In this case, a plurality of suction nozzles are arranged, on the movable member, in the Y axis direction. When the movable member is moved on the Y-axis slide 744 by a moving device, each one of the suction nozzles is selectively positioned at an operative position where the nozzle elevating and lowering device is provided, so that the each one nozzle is lowered and elevated by the nozzle elevating and lowering device to suck and mount an EC.

The present invention is applicable to an apparatus and a method for mounting, or treating, heterogeneous ECs including transistors and resistors.

It is to be understood that the present invention may be embodied with various other changes, modifications, and improvements, such as those described in SUMMARY OF THE INVENTION, which may occur to a person skilled in the art without departing from the spirit and scope of the invention defined in the appended claims.

What is claimed is:

1. A method of mounting an electric component on a circuit substrate, the method comprising the steps of:

moving at least one of a suction nozzle and an electric-component supplying device toward the other of the suction nozzle and the electric-component supplying device, so that the nozzle applies a suction to the electric component supplied by the supplying device and thereby receives the component, moving at least one of the suction nozzle and the circuit substrate toward the other of the nozzle and the substrate, so that the nozzle mounts the electric component on the substrate, taking an image of at least a portion of the electric component sucked and held by the suction nozzle, as seen in a direction perpendicular to an axial direction of the nozzle, in a state in which the nozzle takes a known position in the axial direction, determining, based on image data representing the taken image, a position of at least a mounted surface of the electric component that is opposite to a sucked surface of the component sucked by the suction nozzle, and controlling, based on the determined position, a movement of at least one of (A) the suction nozzle and (B) at least one of (b1) the electric-component supplying device and (b2) the circuit substrate, toward the other of the nozzle and said at least one of the supplying device and the substrate.

2. A method according to claim 1, wherein the controlling step comprises controlling at least one of (a) a position of an end of a downward movement of the suction nozzle toward said at least one of the electric-component supplying device and the circuit substrate, an end surface of the nozzle that applies the suction facing downward during said downward movement, and (b) a position where a deceleration of the downward movement of the suction nozzle is started.

3. A method according to claim 1, further comprising holding, with a nozzle holder, the suction nozzle such that the nozzle is retractable relative to the nozzle holder, and biasing, with a biasing device, the suction nozzle toward a position of an end of an advancement thereof relative to the nozzle holder.

4. A method according to claim 1, wherein the determining step comprises determining, each time the suction nozzle sucks and holds one electric component, a position of at least a mounted surface of said one electric component held by the nozzle.

5. A method according to claim 1, wherein the taking step comprises taking, each time a prescribed condition is satisfied, an image of an end portion of the suction nozzle that applies the suction, and wherein the determining step comprises determining, based on the taken image, a position of an end surface of the suction nozzle that applies the suction.

6. A method according to claim 5, wherein the prescribed condition comprises a condition that a prescribed time has elapsed.

7. A method according to claim 6, wherein the taking step comprises taking, when the suction nozzle first reaches an image-take position after the prescribed time has elapsed, the image of the end portion of the suction nozzle.

8. A method according to claim 6, wherein the prescribed condition comprises a condition that the suction nozzle is not performing an electric-component mounting action, and wherein the taking step comprises moving the suction nozzle to an image-take position when the prescribed time has elapsed and the suction nozzle is not performing the electric-component mounting action.

9. A method according to claim 6, wherein the taking step further comprises measuring the prescribed time only while the suction nozzle is performing each electric-component mounting action.

10. A method according to claim 1, wherein the taking step comprises taking, with a surface-image taking device which can take a two-dimensional image at once, a two-dimensional image of at least one of an end portion of the suction nozzle that applies the suction and the electric component sucked and held by the nozzle, as seen in said direction perpendicular to the axial direction of the nozzle.

11. A method according to claim 1, wherein the taking step comprises taking, with a linear-image taking device, at least one linear image of at least one of an end portion of the suction nozzle that applies the suction and the electric component sucked and held by the nozzle, and wherein the determining step comprises determining, based on image data representing the taken linear image, a position of at least one of the mounted surface of the component and an end surface of the nozzle that applies the suction.

12. A method of mounting an electric component on a circuit substrate, the method comprising the steps of:

moving at least one of a suction nozzle and an electric-component supplying device toward the other of the suction nozzle and the electric-component supplying device, so that the nozzle applies a suction to the electric component supplied by the supplying device and thereby receives the component, moving at least one of the suction nozzle and the circuit substrate toward the other of the nozzle and the substrate, so that the nozzle mounts the electric component on the substrate, taking, after the suction nozzle receives the electric component and before the nozzle mounts the component, an image of the component sucked and held by the nozzle, as seen in a direction perpendicular to an axial direction of the nozzle, determining, based on image data representing the taken image, a thickness of the electric component, and controlling, based on the determined thickness, a movement of at least one of (A) the suction nozzle and (B) at least one of (b1) the electric-component supplying device and (b2) the circuit substrate, toward the other of the nozzle and said at least one of the supplying device and the substrate.

13. A method of mounting an electric component on a circuit substrate, the method comprising the steps of:

moving at least one of a suction nozzle and an electric-component supplying device toward the other of the suction nozzle and the electric-component supplying device, so that the nozzle applies a suction to the electric component supplied by the supplying device and thereby receives the component, moving at least one of the suction nozzle and the circuit substrate toward the other of the nozzle and the substrate, so that the nozzle mounts the electric component on the substrate, taking an image of at least an end portion of the nozzle that applies the suction, as seen in a direction perpendicular to an axial direction of the nozzle, in a state in which the nozzle takes a known position in the axial direction, determining, based on image data representing the taken image, a position, in the axial direction, of at least an end surface of the suction nozzle that applies the suction, and controlling, based on the determined position, a movement of at least one of (A) the suction nozzle and (B) at least one of (b1) the electric-component supplying device and (b2) the circuit substrate, toward the other of the nozzle and said at least one of the supplying device and the substrate.

14. A method of treating an electric component, the method comprising the steps of:

causing a suction nozzle to apply a suction to the electric component supplied by an electric-component supplying device and thereby receive the component, taking an image of at least an end portion of the suction nozzle that applies the suction, as seen in a direction perpendicular to an axial direction of the nozzle, in a state in which the nozzle takes a known position in the axial direction, determining, based on image data representing the taken image, a position, in the axial direction, of at least an end surface of the suction nozzle that applies the suction, and controlling, based on the determined position, a movement of at least one of the suction nozzle and the electric-component supplying device, toward the other of the nozzle and the supplying device.

15. An apparatus for mounting an electric component on a circuit substrate, the apparatus comprising:

an electric-component supplying device which supplies the electric component;

a circuit-substrate supporting device which supports the circuit substrate;

a nozzle holder which holds a suction nozzle having an end surface which applies a suction to the electric component supplied by the electric-component supplying device and thereby holds the component;

a reception controller which controls at least one of the nozzle holder and the electric-component supplying device to be moved toward the other of the nozzle holder and the supplying device, so that the suction nozzle receives the electric component from the supplying device;

a mounting controller which controls at least one of the nozzle holder and the circuit-substrate supporting device to be moved toward the other of the nozzle holder and the supporting device, so that the suction nozzle mounts the electric component on the circuit substrate supported by the supporting device;

an image taking device which takes, during a time duration after the suction nozzle receives the electric component and before the nozzle mounts the component, an image of at least the component sucked and held by the nozzle, as seen in a direction perpendicular to an axial direction of the nozzle, in a state in which the nozzle holder takes a known position in the axial direction;

an image processor which determines, based on image data representing the image taken by the image taking device, a position, in the axial direction, of at least a mounted surface of the electric component that is opposite to a sucked surface of the component sucked by the suction nozzle; and a control modifying device which modifies, based on the position determined by the image processor, at least one of the control of the reception controller to move said at least one of the nozzle holder and the electric-component supplying device, and the control of the mounting controller to move said at least one of the nozzle holder and the circuit-substrate supporting device.

16. An apparatus according to claim 15, wherein the circuit-substrate supporting device comprises a support member which supports the circuit substrate, and wherein the mounting controller comprises:

a holder elevating and lowering device which elevates and lowers the nozzle holder in the axial direction of the suction nozzle in a prescribed range, and smoothly decelerates a downward movement of the holder in a terminal portion of the range; and a substrate elevating and lowering device which elevates and lowers, based on the position determined by the image processor, the support member supporting the circuit substrate.

17. An apparatus according to claim 15, further comprising a transferring controller which controls the nozzle holder to be moved between the electric-component supplying device and the circuit-substrate supporting device, so that the suction nozzle transfers the electric component from the electric-component supplying device to the circuit-substrate supporting device.

18. An apparatus according to claim 17, wherein the transferring controller comprises a revolving device which revolves a plurality of said nozzle holders about an axis line and stops each of the nozzle holders at each of an electric-component-receive position and an electric-component-mount position which are provided on a locus of revolution of said each nozzle holder.

19. An apparatus according to claim 18, wherein the image taking device is provided inside the locus of revolution of said each nozzle holder, such that the image taking device faces toward outside the locus of revolution.

20. An apparatus according to claim 19, further comprising a lighting device which is provided outside the locus of revolution of said each nozzle holder and faces toward the image taking device.

21. An apparatus for mounting an electric component on a circuit substrate, the apparatus comprising:

an electric-component supplying device which supplies the electric component;

a circuit-substrate supporting device which supports the circuit substrate;

a nozzle holder which holds a suction nozzle having an end surface which applies a suction to the electric component supplied by the electric-component supplying device and thereby holds the component;

a reception controller which controls at least one of the nozzle holder and the electric-component supplying device to be moved toward the other of the nozzle holder and the supplying device, so that the suction nozzle receives the electric component from the supplying device;

a mounting controller which controls at least one of the nozzle holder and the circuit-substrate supporting device to be moved toward the other of the nozzle holder and the supporting device, so that the suction nozzle mounts the electric component on the circuit substrate supported by the supporting device;

an image taking device which takes, during a time duration after the suction nozzle receives the electric component and before the nozzle mounts the component, an image of the component sucked and held by the nozzle, as seen in a direction perpendicular to an axial direction of the nozzle;

an image processor which determines, based on image data representing the image taken by the image taking device, a thickness of the electric component held by the suction nozzle; and a control modifying device which modifies, based on the thickness determined by the image processor, at least one of the control of the reception controller to move said at least one of the nozzle holder and the electric-component supplying device, and the control of the mounting controller to move said at least one of the nozzle holder and the circuit-substrate supporting device.

22. An apparatus for mounting an electric component on a circuit substrate, the apparatus comprising:

an electric-component supplying device which supplies the electric component;

a circuit-substrate supporting device which supports the circuit substrate;

a nozzle holder which holds a suction nozzle having an end surface which applies a suction to the electric component supplied by the electric-component supplying device and thereby holds the component;

a reception controller which controls at least one of the nozzle holder and the electric-component supplying device to be moved toward the other of the nozzle holder and the supplying device, so that the suction nozzle receives the electric component from the supplying device;

a mounting controller which controls at least one of the nozzle holder and the circuit-substrate supporting device to be moved toward the other of the nozzle holder and the supporting device, so that the suction nozzle mounts the electric component on the circuit substrate supported by the supporting device;

an image taking device which takes an image of at least an end portion of the suction nozzle that applies the suction, as seen in a direction perpendicular to an axial direction of the nozzle, in a state in which the nozzle holder takes a known position in the axial direction;

an image processor which determines, based on image data representing the image taken by the image taking device, a position, in the axial direction, of at least an end surface of the suction nozzle that applies the suction; and a control modifying device which modifies, based on the position determined by the image processor, at least one of the control of the reception controller to move said at least one of the nozzle holder and the electric-component supplying device, and the control of the mounting controller to move said at least one of the nozzle holder and the circuit-substrate supporting device.

23. An apparatus for treating an electric component, the apparatus comprising:

an electric-component supplying device which supplies the electric component;

a nozzle holder which holds a suction nozzle having an end surface which applies a suction to the electric component supplied by the electric-component supplying device and thereby holds the component;

a reception controller which controls at least one of the nozzle holder and the electric-component supplying device to be moved toward the other of the nozzle holder and the supplying device, so that the suction nozzle receives the electric component from the supplying device;

an image taking device which takes an image of at least an end portion of the suction nozzle that applies the suction, as seen in a direction perpendicular to an axial direction of the nozzle, in a state in which the nozzle holder takes a known position in the axial direction and the suction nozzle does not hold an electric component;

an image processor which determines, based on image data representing the image taken by the image taking device, a position, in the axial direction, of at least an end surface of the suction nozzle that applies the suction; and a control modifying device which modifies, based on the position determined by the image processor, the control of the reception controller to move said at least one of the nozzle holder and the electric-component supplying device.

24. A method of mounting an electric component on a circuit substrate, the method comprising the steps of:

moving at least one of a suction nozzle and an electric-component supplying device toward the other of the suction nozzle and the electric-component supplying device, so that the nozzle applies a suction to the electric component supplied by the supplying device and thereby receives the component, moving at least one of the suction nozzle and the circuit substrate toward the other of the nozzle and the substrate, so that the nozzle mounts the electric component on the substrate, taking an image of at least one of (a) an end portion of the suction nozzle that applies the suction and (b) at least a portion of the electric component sucked and held by the nozzle, as seen in a direction perpendicular to an axial direction of the nozzle, in a state in which the nozzle takes a known position in the axial direction, determining, based on image data representing the taken image, at least one of (c) a position of a mounted surface of the electric component that is opposite to a sucked surface of the component sucked by the suction nozzle, (d) a thickness of the component, and (e) a position, in the axial direction, of an end surface of the nozzle that applies the suction, and controlling, based on the determined one of the position of the mounted surface, the thickness of the electric component, and the position of the end surface, a movement of at least one of (A) the suction nozzle and (B) at least one of (b1) the electric-component supplying device and (b2) the circuit substrate, toward the other of the nozzle and said at least one of the supplying device and the substrate.

25. An apparatus for mounting an electric component on a circuit substrate, the apparatus comprising:

an electric-component supplying device which supplies the electric component;

a circuit-substrate supporting device which supports the circuit substrate;

a nozzle holder which holds a suction nozzle having an end surface which applies a suction to the electric component supplied by the electric-component supplying device and thereby holds the component;

a reception controller which controls at least one of the nozzle holder and the electric-component supplying device to be moved toward the other of the nozzle holder and the supplying device, so that the suction nozzle receives the electric component from the supplying device;

a mounting controller which controls at least one of the nozzle holder and the circuit-substrate supporting device to be moved toward the other of the nozzle holder and the supporting device, so that the suction nozzle mounts the electric component on the circuit substrate supported by the supporting device;

an image taking device which takes an image of at least one of (a) an end portion of the suction nozzle that applies the suction and (b) at least a portion of the electric component sucked and held by the nozzle, as seen in a direction perpendicular to an axial direction of the nozzle, in a state in which the nozzle holder takes a known position in the axial direction;

an image processor which determines, based on image data representing the image taken by the image taking device, at least one of (c) a position, in the axial direction, of a mounted surface of the electric component that is opposite to a sucked surface of the component sucked by the suction nozzle, (d) a thickness of the component, and (e) a position, in the axial direction, of the end surface of the nozzle; and a control modifying device which modifies, based on the determined one of the position of the mounted surface, the thickness of the electric component, and the position of the end surface, at least one of the control of the reception controller to move said at least one of the nozzle holder and the electric-component supplying device, and the control of the mounting controller to move said at least one of the nozzle holder and the circuit-substrate supporting device.

* * * * *